(12) United States Patent
Lu

(10) Patent No.: US 10,704,927 B2
(45) Date of Patent: *Jul. 7, 2020

(54) DISPLACEMENT DEVICES AND METHODS AND APPARATUS FOR DETECTING AND ESTIMATING MOTION ASSOCIATED WITH SAME

(71) Applicant: The University of British Columbia, Vancouver (CA)

(72) Inventor: Xiaodong Lu, Vancouver (CA)

(73) Assignee: The University of British Columbia, Vancouver (CA)

( * ) Notice: Subject to any disclaimer, the term of this patent is extended or adjusted under 35 U.S.C. 154(b) by 368 days.

This patent is subject to a terminal disclaimer.

(21) Appl. No.: 15/791,345

(22) Filed: Oct. 23, 2017

(65) Prior Publication Data
US 2018/0094949 A1   Apr. 5, 2018

Related U.S. Application Data

(63) Continuation of application No. 15/016,027, filed on Feb. 4, 2016, now Pat. No. 10,222,237, which is a
(Continued)

(51) Int. Cl.
*G01D 5/14* (2006.01)
*H01L 21/67* (2006.01)
*H01L 21/68* (2006.01)

(52) U.S. Cl.
CPC ....... *G01D 5/145* (2013.01); *H01L 21/67259* (2013.01); *H01L 21/68* (2013.01)

(58) Field of Classification Search
CPC .... G01D 5/145; H01L 21/67259; H01L 21/68
See application file for complete search history.

(56) References Cited

U.S. PATENT DOCUMENTS

| 3,376,578 A | 4/1968 | Sawyer |
| 3,894,276 A | 7/1975 | Janssen |
(Continued)

FOREIGN PATENT DOCUMENTS

| CN | 201956875 | 8/2011 |
| EP | 1357434 | 10/2003 |
(Continued)

OTHER PUBLICATIONS

Xiaodong Lu et al.: 6D direct-drive technology for planar motion stages, CIRP Annals, vol. 61, No. 1, pp. 359-362, XP028511153, ISSN: 0007-8506, DOI: 10.1016/J.CIRP.2012.03.145.
(Continued)

*Primary Examiner* — Bickey Dhakal
(74) *Attorney, Agent, or Firm* — Todd A. Rattray, Oyen Wiggs Green & Mutala LLP

(57) ABSTRACT

Apparatus and method estimate a position of a movable stage. The apparatus comprises: a stator comprising 2D array of sensors arranged relative to one another to provide a plurality of stator-Y oriented sensor columns and a plurality of stator-X oriented sensor rows; a movable stage comprising a first Y-magnet array comprising a plurality of first magnetization segments generally linearly elongated in a stage-Y direction, each first magnetization segment having a stage-Y direction length, $L_{yy}$, and a magnetization direction generally orthogonal to the stage-Y direction, the magnetization directions of the plurality of first magnetization segments exhibiting a first magnetic spatial period $\lambda_x$ over a stage-X direction width, $W_{yx}$, of the first magnet array; and a controller connected to receive information based on an output from each of the sensors and configured to use the information to determine a stator-X direction position of the movable stage.

21 Claims, 27 Drawing Sheets

Related U.S. Application Data continuation of application No. PCT/CA2014/050739, filed on Aug. 6, 2014.

(60) Provisional application No. 61/862,520, filed on Aug. 6, 2013, provisional application No. 62/008,519, filed on Jun. 6, 2014.

(56) References Cited

U.S. PATENT DOCUMENTS

| | | | |
|---|---|---|---|
| 4,535,278 A | 8/1985 | Asakawa | |
| 4,654,571 A | 3/1987 | Hinds | |
| 4,835,424 A | 5/1989 | Hoffman et al. | |
| 5,196,745 A | 3/1993 | Trumper | |
| 5,334,892 A | 8/1994 | Chitayat | |
| 5,925,956 A | 7/1999 | Ohzeki | |
| 6,003,230 A | 12/1999 | Trumper et al. | |
| 6,005,309 A | 12/1999 | Chitayat | |
| 6,069,418 A | 5/2000 | Tanaka | |
| 6,072,251 A | 6/2000 | Markle | |
| 6,097,114 A | 8/2000 | Hazelton | |
| 6,144,119 A | 11/2000 | Hazelton | |
| 6,208,045 B1 | 3/2001 | Hazelton et al. | |
| 6,252,234 B1 | 6/2001 | Hazelton et al. | |
| 6,304,320 B1 | 10/2001 | Tanaka et al. | |
| 6,339,266 B1 | 1/2002 | Tanaka | |
| 6,437,463 B1 | 8/2002 | Hazelton et al. | |
| 6,441,514 B1 | 8/2002 | Markle | |
| 6,445,093 B1 | 9/2002 | Binnard | |
| 6,452,292 B1 | 9/2002 | Binnard | |
| 6,495,934 B1 | 12/2002 | Hayashi et al. | |
| 6,531,793 B1 | 3/2003 | Frissen et al. | |
| 6,590,355 B1 | 7/2003 | Kikuchi et al. | |
| 6,650,079 B2 | 11/2003 | Binnard | |
| 6,710,495 B2 | 3/2004 | Lipo et al. | |
| 6,720,680 B1 | 4/2004 | Tanaka | |
| 6,777,896 B2 | 8/2004 | Teng | |
| 6,835,941 B1 | 12/2004 | Tanaka | |
| 6,847,134 B2 | 1/2005 | Frissen et al. | |
| 6,879,063 B2 | 4/2005 | Frissen et al. | |
| 6,885,430 B2 | 4/2005 | Tanaka et al. | |
| 6,949,844 B2 | 9/2005 | Cahill et al. | |
| 6,987,335 B2 | 1/2006 | Korenaga | |
| 7,025,005 B2 * | 4/2006 | Shinozaki | H01L 21/68 108/20 |
| 7,057,370 B2 | 6/2006 | Touzov | |
| 7,075,198 B2 | 7/2006 | Korenaga | |
| 7,084,534 B2 | 8/2006 | Ohishi | |
| 7,199,493 B2 | 4/2007 | Ohishi | |
| 7,224,252 B2 | 5/2007 | Meadow, Jr. et al. | |
| 7,227,284 B2 | 6/2007 | Korenaga | |
| 7,436,135 B2 | 10/2008 | Miyakawa | |
| 7,550,890 B2 | 6/2009 | Kloeppel et al. | |
| 7,696,653 B2 | 4/2010 | Tanaka | |
| 7,808,133 B1 | 10/2010 | Widdowson et al. | |
| 7,948,122 B2 | 5/2011 | Compter et al. | |
| 8,031,328 B2 | 10/2011 | Asano et al. | |
| 8,046,904 B2 | 11/2011 | Kloeppel et al. | |
| 8,129,984 B2 | 3/2012 | Hosek et al. | |
| 8,134,688 B2 * | 3/2012 | Shibazaki | G03F 7/70725 355/68 |
| 8,384,317 B2 | 2/2013 | Shikayama et al. | |
| 8,593,016 B2 | 11/2013 | Pelrine et al. | |
| 8,686,602 B2 | 4/2014 | Pelrine et al. | |
| 8,736,133 B1 | 5/2014 | Smith et al. | |
| 9,202,719 B2 | 12/2015 | Lu et al. | |
| 9,685,849 B2 | 6/2017 | Lu et al. | |
| 2002/0149270 A1 | 10/2002 | Hazelton | |
| 2002/0149271 A1 | 10/2002 | Bartolotti | |
| 2002/0180395 A1 | 12/2002 | Binnard | |
| 2003/0085627 A1 | 5/2003 | Lipo et al. | |
| 2004/0007920 A1 | 1/2004 | Teng | |
| 2004/0140780 A1 | 7/2004 | Cahill et al. | |
| 2005/0001579 A1 | 1/2005 | Touzov | |
| 2005/0090902 A1 | 4/2005 | Masini | |
| 2005/0093378 A1 | 5/2005 | Ohishi | |
| 2005/0194843 A1 | 9/2005 | Korenaga | |
| 2005/0194918 A1 | 9/2005 | Takeuchi | |
| 2006/0175993 A1 | 8/2006 | Shibata et al. | |
| 2006/0214518 A1 | 9/2006 | Ohishi | |
| 2007/0035267 A1 | 2/2007 | Gao et al. | |
| 2007/0046127 A1 | 3/2007 | Kloeppel et al. | |
| 2007/0046221 A1 | 3/2007 | Miyakawa | |
| 2007/0145831 A1 | 6/2007 | Antonius Theodorus Dams | |
| 2008/0203828 A1 | 8/2008 | Cornelis et al. | |
| 2008/0285005 A1 | 11/2008 | Gery et al. | |
| 2008/0290741 A1 | 11/2008 | Cardon et al. | |
| 2009/0058199 A1 | 3/2009 | Ito | |
| 2009/0195195 A1 | 8/2009 | Huang | |
| 2009/0251678 A1 | 10/2009 | Ohishi | |
| 2009/0315413 A1 | 12/2009 | Iwatani et al. | |
| 2010/0090545 A1 | 4/2010 | Binnard et al. | |
| 2010/0167556 A1 | 7/2010 | Totsu et al. | |
| 2010/0238425 A1 | 9/2010 | Binnard | |
| 2011/0050007 A1 | 3/2011 | Kubo | |
| 2011/0062901 A1 | 3/2011 | Busch | |
| 2011/0101896 A1 | 5/2011 | Shikayama et al. | |
| 2012/0113405 A1 | 5/2012 | Yang et al. | |
| 2012/0127447 A1 | 5/2012 | Yang et al. | |
| 2012/0139455 A1 | 6/2012 | Tojo et al. | |
| 2012/0300186 A1 | 11/2012 | Butler et al. | |
| 2013/0140372 A1 | 6/2013 | Mahadeswaraswamy et al. | |
| 2013/0164687 A1 | 6/2013 | Binnard et al. | |
| 2013/0241575 A1 | 9/2013 | Finkler | |
| 2014/0285122 A1 | 9/2014 | Lu et al. | |
| 2015/0097498 A1 | 4/2015 | Hemati et al. | |
| 2015/0137624 A1 | 5/2015 | Wu et al. | |
| 2015/0338750 A1 | 11/2015 | Yang et al. | |
| 2016/0065043 A1 | 3/2016 | Lu et al. | |

FOREIGN PATENT DOCUMENTS

| | | |
|---|---|---|
| JP | 4008006642 | 1/1996 |
| JP | 2002112526 | 4/2002 |
| JP | 2003209963 | 7/2003 |
| JP | 2004047981 | 2/2004 |
| JP | 2004254489 | 9/2004 |
| TW | 201330485 | 7/2013 |
| WO | 2001018944 | 3/2001 |
| WO | 20050909202 | 9/2005 |
| WO | 2013059934 | 5/2013 |
| WO | 2015017933 | 2/2015 |
| WO | 2015179962 | 12/2015 |
| WO | 2015184553 | 12/2015 |
| WO | 2015188281 | 12/2015 |
| WO | 2016012157 | 1/2016 |
| WO | 2016012158 | 1/2016 |
| WO | 2016012159 | 1/2016 |
| WO | 2016012160 | 1/2016 |
| WO | 2016012171 | 1/2016 |
| WO | 2016091441 | 6/2016 |

OTHER PUBLICATIONS

Cho et al., "Magnetic Field Analysis of 2-D Permanent Magnet Array for Planar Motor", IEEE Tran. on Magnetics, 2001, vol. 37 No. 5, pp. 3762-3766.

Filho, A.F.F., "Investigation of the Forces Produced by a New Electromagnetic Planar Actuator", Electric Machines and Drives Conference, IEMDC 2001. IEEE International, pp. 8-13.

Filho, A.F., "Analysis of a DC XY-Actuator", XIX International Conference on Electrical Machines—ICEM 2010, Rome.

Filho, A.F., "Development of a novel planar actuator", Ninth International Conference on Electrical Machines and Drives, Conference Publication No. 468, 1999.

Fujii et al., "X-Y Linear Synchronous Motors Without Force Ripple and Core Loss for Precision Two-Dimensional Drives", IEEE Transactions on Magnetics, vol. 38, No. 5, Sep. 2002.

Buckley et al., "Step-and-scan lithography using reduction optics", J. Vac. Sci. Technol. B 7 (6), Nov./Dec. 1989.

(56) References Cited

OTHER PUBLICATIONS

Hesse et al., "Interferometric Controlled Planar Nanopositioning System With 100 MM Circular Travel Range", ASPE 2011 Annual Meeting, Denver, Co.

Tomita et al., "Study on a surface-motor driven precise positioning system", Journal of Dynamic Systems, Measurement, and Control Sep. 1995, vol. 117/311-319.

Ueda et al., "A planar actuator with a small mover traveling over large yaw and translational dispalcements", IEEE Transactions on Magnetics, vol. 44, No. 5, May 2008.

Kajiyama et al., "Development of ironless type surface motor", XIX International Conference on Electrical Machines—ICEM 2010, Rome.

Shinno et al., "A Newly Developed Linear Motor-Driven Aerostatic X-Y Planar Motion Table System for Nano-Machining", Annals of the CIRP, 2007, 56/1:369-372.

Gao et al., "A surface motor-driven planar motion stage integrated with an XYθZ surface encoder for precision positioning", Precision Engineering, 2004, 28/3:329-337.

In et al., "Design of a planar-type high speed parallel mechanism positioning platform with the capability of 180 degrees orientation", Annals of the CIRP, 2008, 57/1:421-424.

Lee et al., "Dynamic Modeling and Control of a Ball-Joint-Like Variable-Reluctance Spherical Motor", Journal of Dynamic Systems, Measurement, and Control, 1996, 118/1:29-40.

Weck et al., "Design of a Spherical Motor with Three Degrees of Freedom", Annals of the CIRP, 2000, 49/1:289-294.

Hollis et al., "A six-degree-of-freedom magnetically levitated variable compliance fine-motion wrist: Design, modeling, control", IEEE Trans. Robot. Automat, 1991, 7/3:320-332.

Verma et al., "Six-axis nanopositioning device with precision magnetic levitation technology", IEEE Tran. on Mechatronics, 2004, 9/2:384-391.

Kim et al., "High-precision magnetic levitation stage for photolithography", Precision Engineering, 1998, 22/2:66-77.

Holmes et al., "The Long-Range Scanning Stage: a Novel Platform for Scanned-Probe Microscopy", Precision Engineering, 2000, 24/3:191-209.

Etxaniz et al., "Magnetic Levitated 2D Fast Drive", IEEJ Transactions on Industry Applications, 2006, 126/12:1678-1681.

Compter, J., "Electro-dynamic planar motor", Precision Engineering, 2003, 28/2: 171-180.

Jansen et al., "Modeling of magnetically levitated planar actuators with moving magnets", IEEE Tran. Magnetic, 2007, 43/1:15-25.

Trumper et al., "Magnet arrays for synchronous machines", IEEE Industry Applications Society Annual Meeting, 1993, 1:9-18.

Jansen et al., "Magnetically Levitated Planar Actuator with Moving Magnets", IEEE Tran. Ind. App.,vol. 44, No. 4, 2008.

Kim, W.J., "High-Precision Planar Magnetic Levitation", Massachusetts Institute of Technology, Jun. 1997.

Jansen, J.W., "Magnetically levitated planar actuator with moving magnets: Electromechanical analysis and design", IOP-EMVT, SenterNovem, an agency of the Dutch Ministry of Economic Affairs, 2007.

Khan et al., "A Long Stroke Electromagnetic XY Positioning Stage for Micro Applications", IEEE/ASME Transactions on Mechatronics, vol. 17, No. 5, Oct. 2012, pp. 866-875.

\* cited by examiner

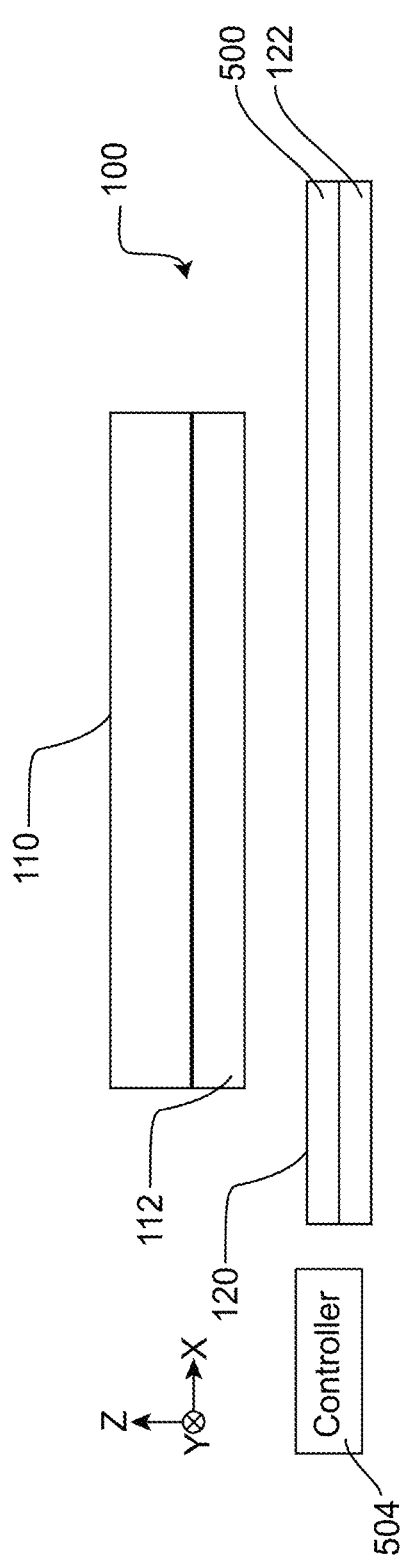
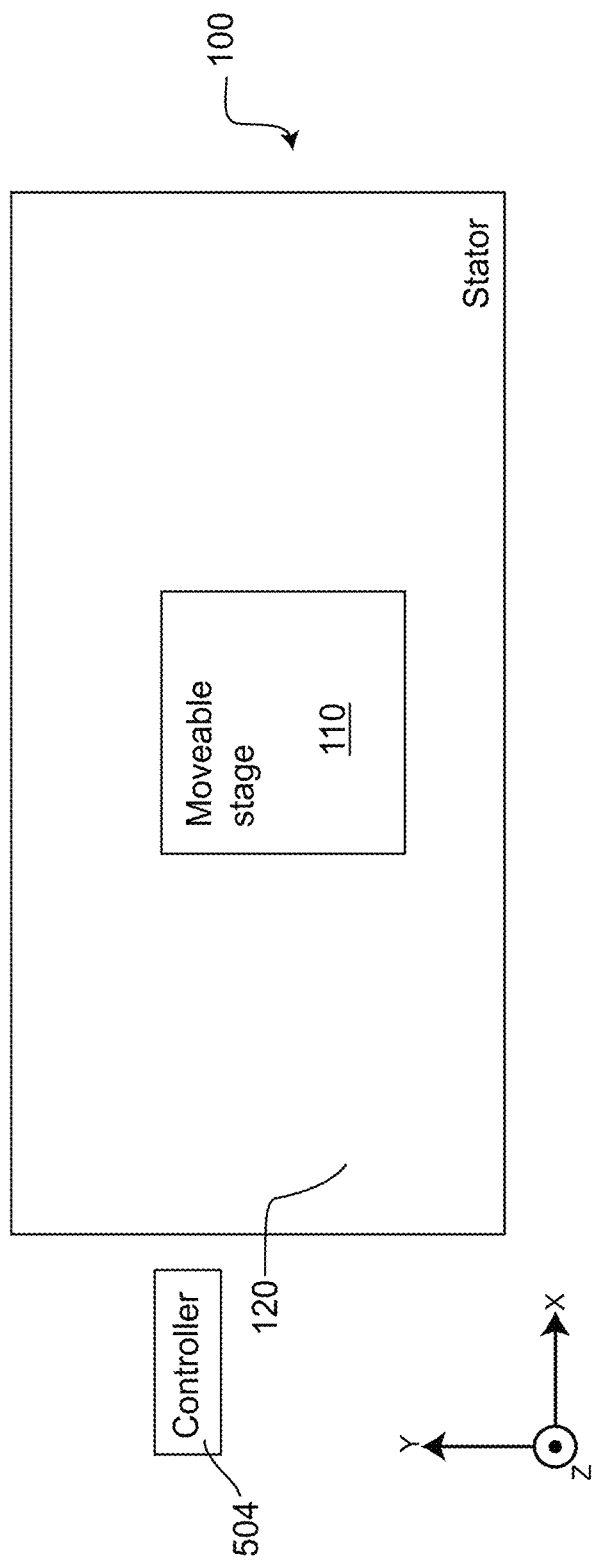
FIGURE 1A
FIGURE 1B

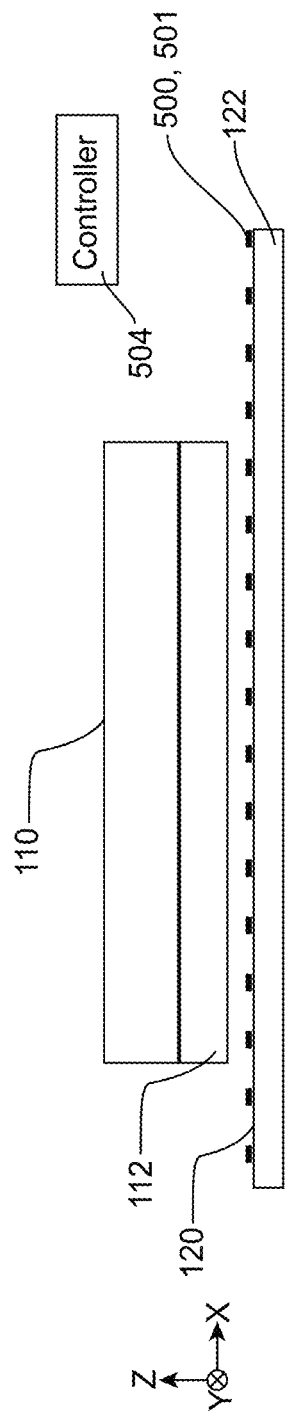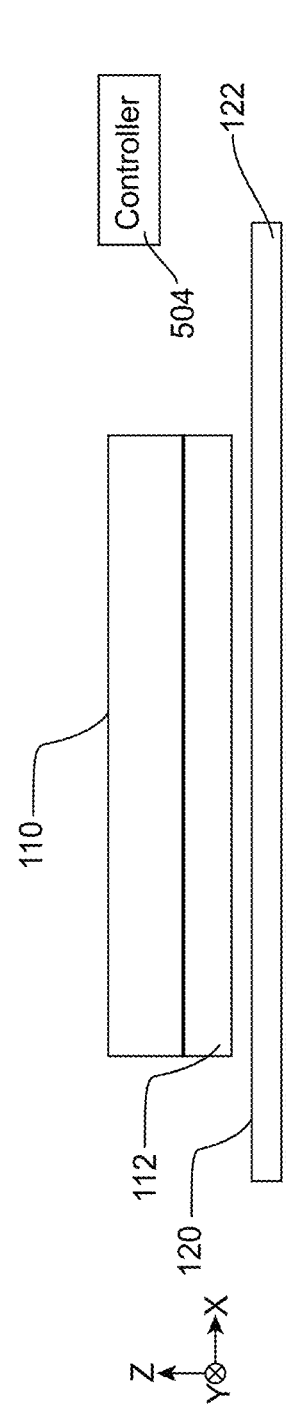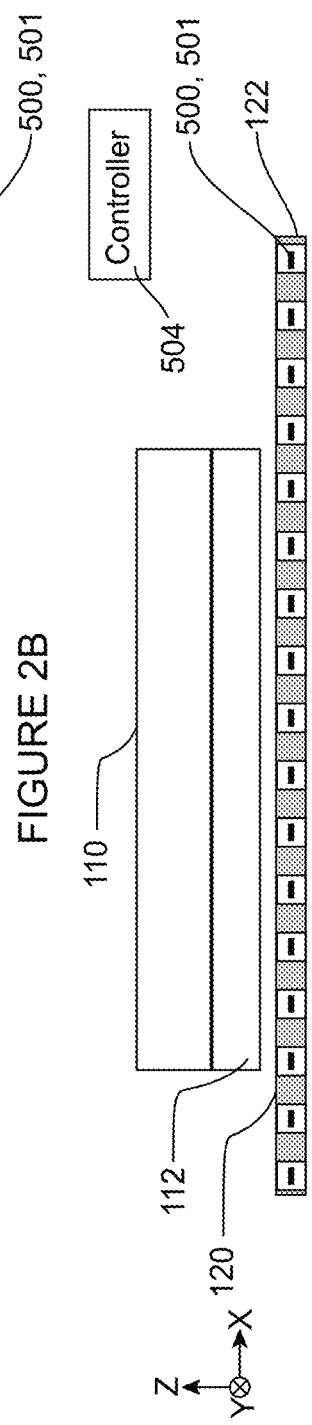

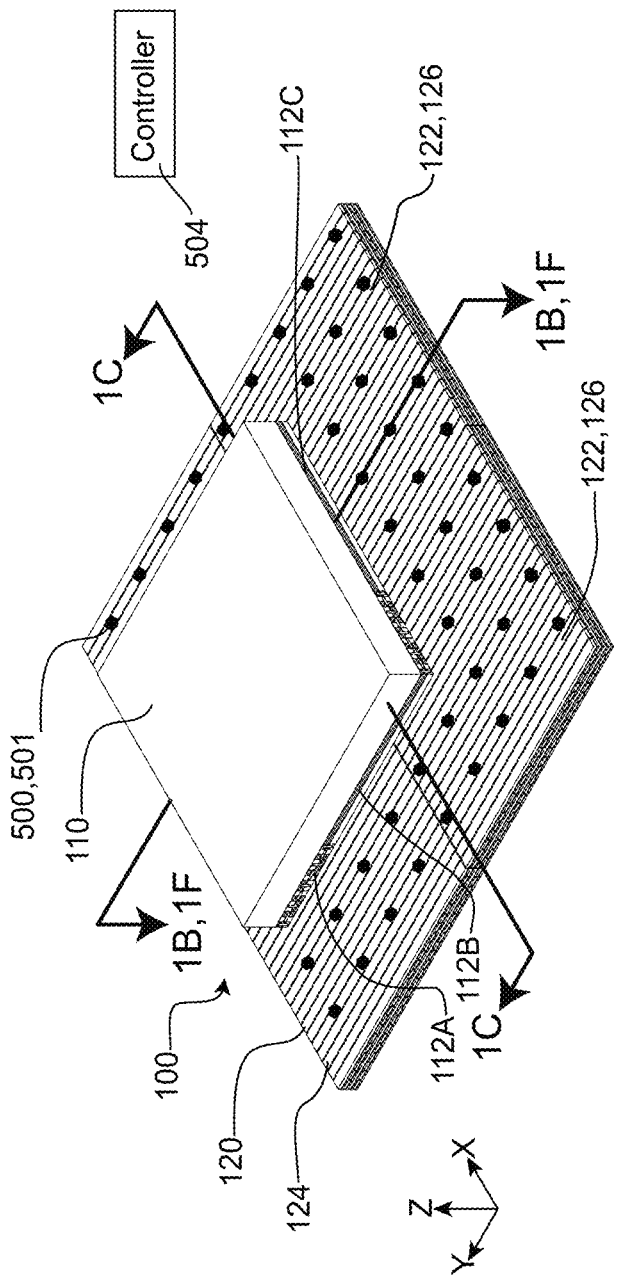
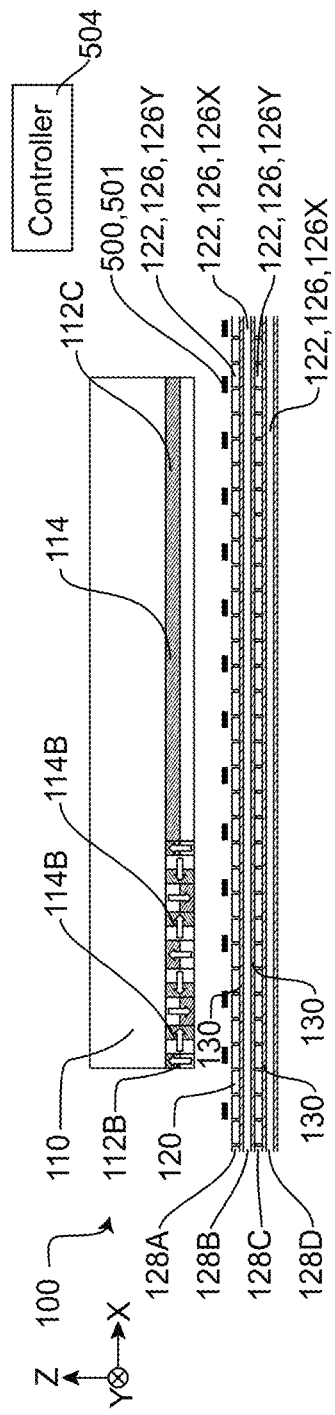
FIGURE 3A
FIGURE 3C

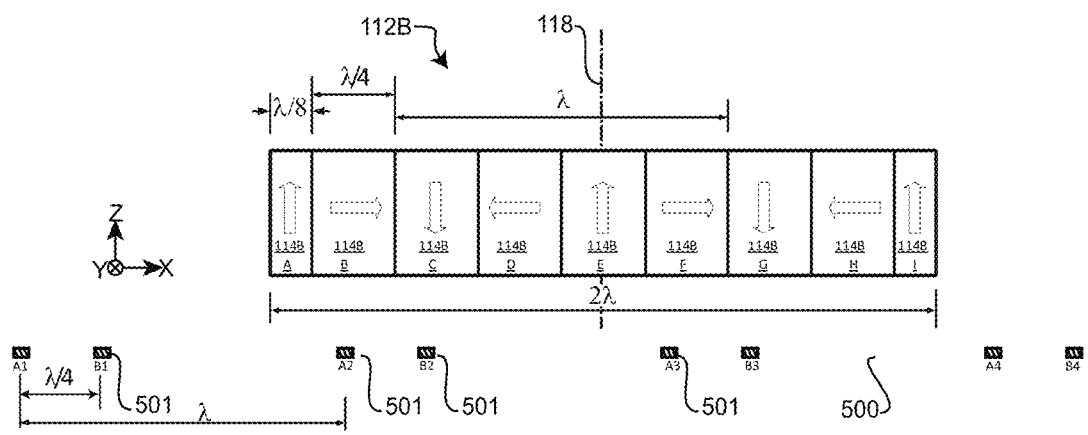
FIGURE 14A
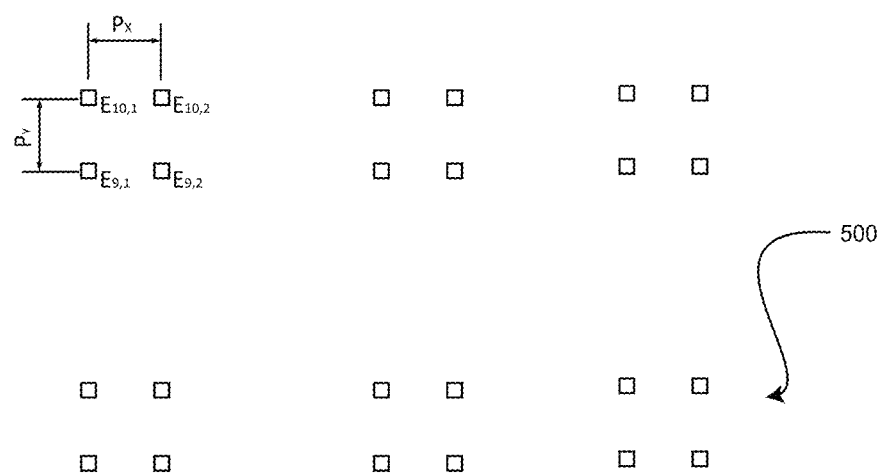
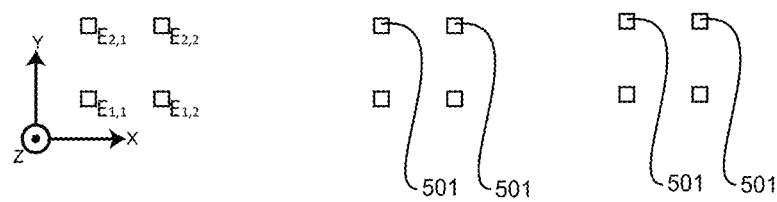
FIGURE 14B

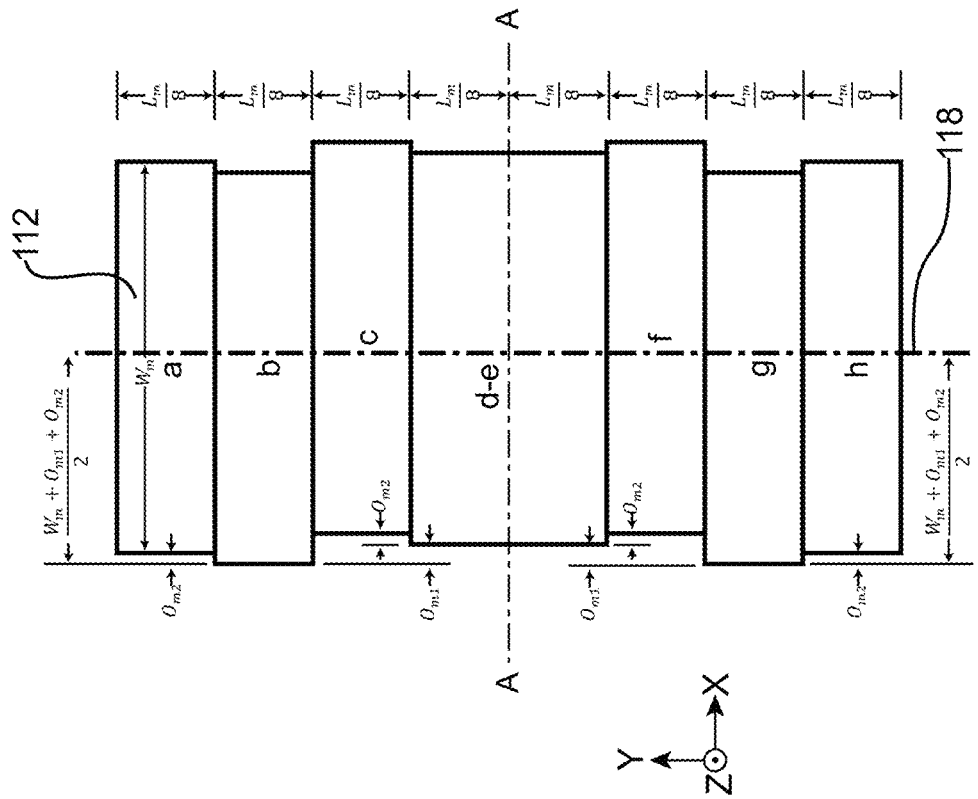
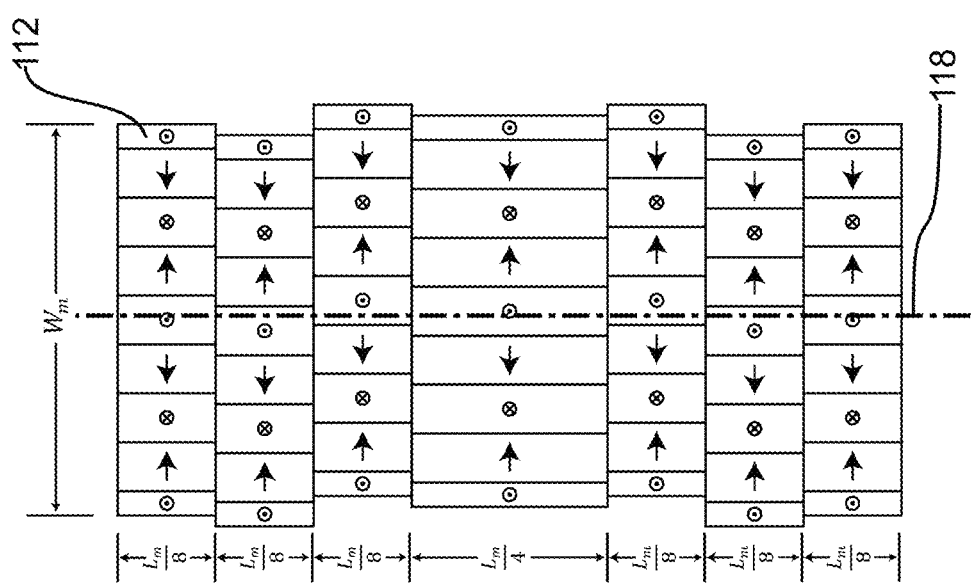
FIGURE 23C
FIGURE 23B

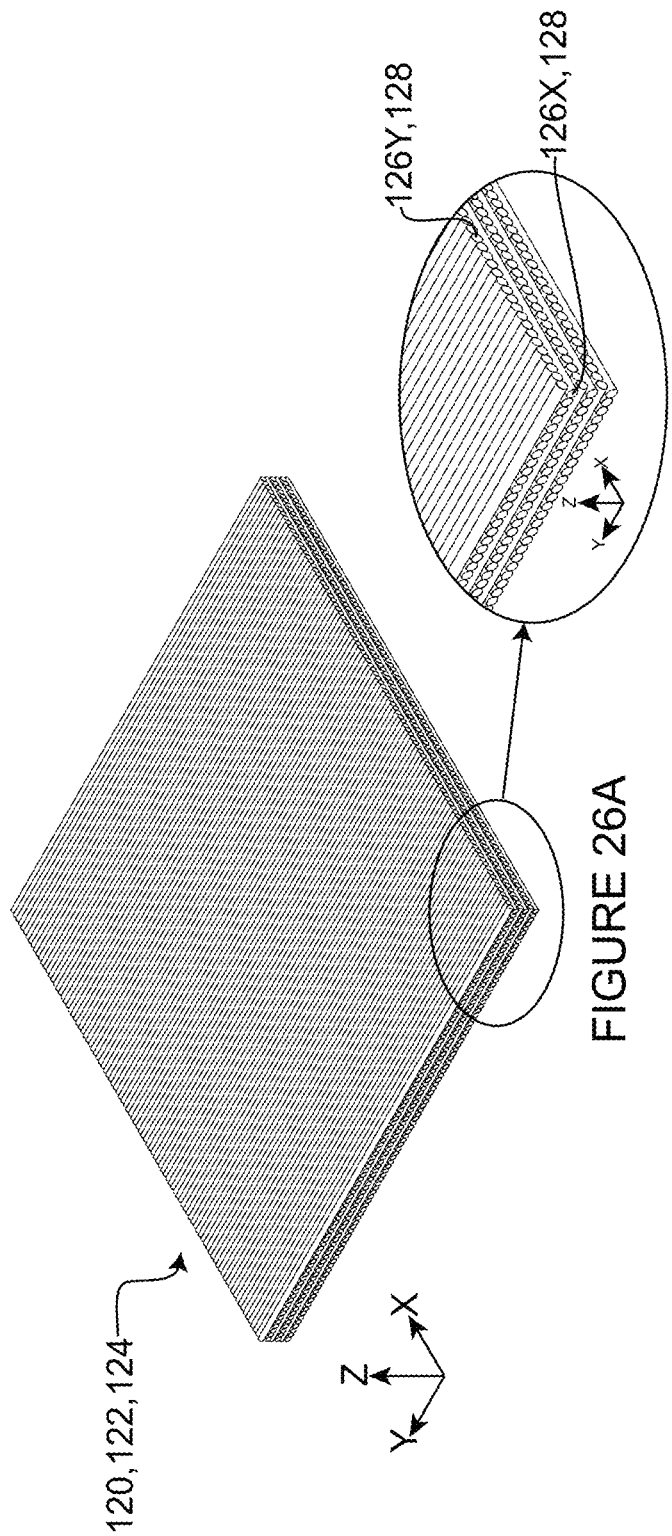
FIGURE 26A
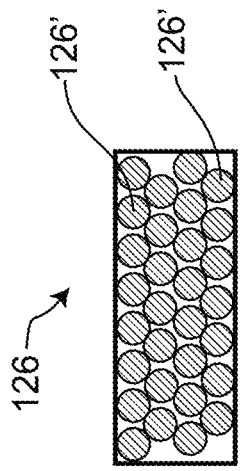
FIGURE 26B
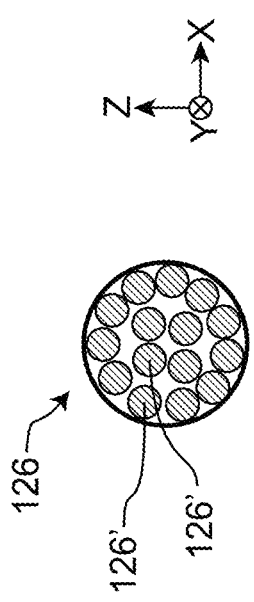
FIGURE 26C
FIGURE 26D

DISPLACEMENT DEVICES AND METHODS AND APPARATUS FOR DETECTING AND ESTIMATING MOTION ASSOCIATED WITH SAME

RELATED APPLICATIONS

This application is a continuation of U.S. application Ser. No. 15/016,027 filed 4 Feb. 2016, which itself is a continuation of PCT application No. PCT/CA2014/050739 having an international filing date of 6 Aug. 2014. PCT application No. PCT/CA2014/050739 claims the benefit of the priority of (and the benefit under 35 USC 1.19 of) U.S. application No. 61/862,520 filed 6 Aug. 2013 and of U.S. application No. 62/008,519 filed 6 Jun. 2014. All of the applications referred to in this paragraph are hereby incorporated herein by reference.

TECHNICAL FIELD

The invention relates to displacement devices, their motion actuation, and measurement (e.g. detection and/or estimation) of their motion. Particular non-limiting embodiments provide displacement devices for use in the semiconductor fabrication industry and general automation industry and methods and apparatus for detecting and/or estimating their associated motion.

BACKGROUND

Motion stages (XY tables and rotary tables) are widely used in various manufacturing, product inspection, and assembling processes. A common solution currently in use achieves XY (i.e. planar) motion by stacking two linear stages (i.e. a X-stage and a Y-stage) together via connecting bearings.

A more desirable solution involves having a single movable stage capable of XY (i.e. planar) motion, eliminating additional bearings. It might also be desirable for such a movable stage to be able to provide at least some Z (out of plane) motion. Attempts have been made to design such displacement devices using the interaction between current-carrying coils and permanent magnets. Examples of efforts in this regard include the following: U.S. Pat. Nos. 6,003,230; 6,097,114; 6,208,045; 6,441,514; 6,847,134; 6,987,335; 7,436,135; 7,948,122; US patent publication No. 2008/0203828; W. J. Kim and D. L. Trumper, High-precision magnetic levitation stage for photolithography. Precision Eng. 22 2 (1998), pp. 66-77; D. L. Trumper, et al, "Magnet arrays for synchronous machines", IEEE Industry Applications Society Annual Meeting, vol. 1, pp. 9-18, 1993; and J. W. Jansen, C. M. M. van Lierop, E. A. Lomonova, A. J. A. Vandenput, "Magnetically Levitated Planar Actuator with Moving Magnets", IEEE Tran. Ind. App., Vol 44, No 4, 2008.

There is a general desire to provide displacement devices having characteristics that improve upon those known in the prior art.

There is a general desire to estimate characteristics of the motion of such displacement devices. For example, there is a desire to estimate the position of (e.g. measure) the movable stage(s) of such devices relative to their stator(s). In some cases, there can be a desire to provide position estimation solutions that are independent of line of sight obstruction.

The foregoing examples of the related art and limitations related thereto are intended to be illustrative and not exclusive. Other limitations of the related art will become apparent to those of skill in the art upon a reading of the specification and a study of the drawings.

BRIEF DESCRIPTION OF THE DRAWINGS

Exemplary embodiments are illustrated in referenced figures of the drawings. It is intended that the embodiments and figures disclosed herein are to be considered illustrative rather than restrictive.

FIGS. 1A and 1B are respectively partial schematic side and top views of a displacement device according to a particular embodiment of the invention.

FIGS. 2A, 2B and 2C are respectively partial schematic side views of the FIG. 1 displacement device according to particular embodiments showing different locations of the sensor array relative to the stator and/or the coils.

FIG. 3A is a partial schematic isometric view of a displacement device according to a particular embodiment of the invention.

FIG. 3C is a partial schematic cross-sectional view of the FIG. 3A displacement device along the line 1C-1C.

FIG. 14A illustrates another embodiment of a Y-magnet array in relation to column sums/averages of column sensors extending in the Y direction in which certain column sums/averages are removed. FIG. 14B illustrates the overall layout of sensors for the FIG. 14A embodiment.

FIGS. 23A-23C show various embodiments of magnet arrays having offset or shifted sub-arrays which may be used in any of the displacement devices described herein according to particular embodiments.

FIGS. 26A and 26B show various views of circular cross-section coil traces which may be used with any of the displacement devices described herein according to particular embodiments. FIGS. 26C and 26D show embodiments of how coil traces may comprise multiple sub-traces having circular cross-section.

DESCRIPTION

Figure 3B:
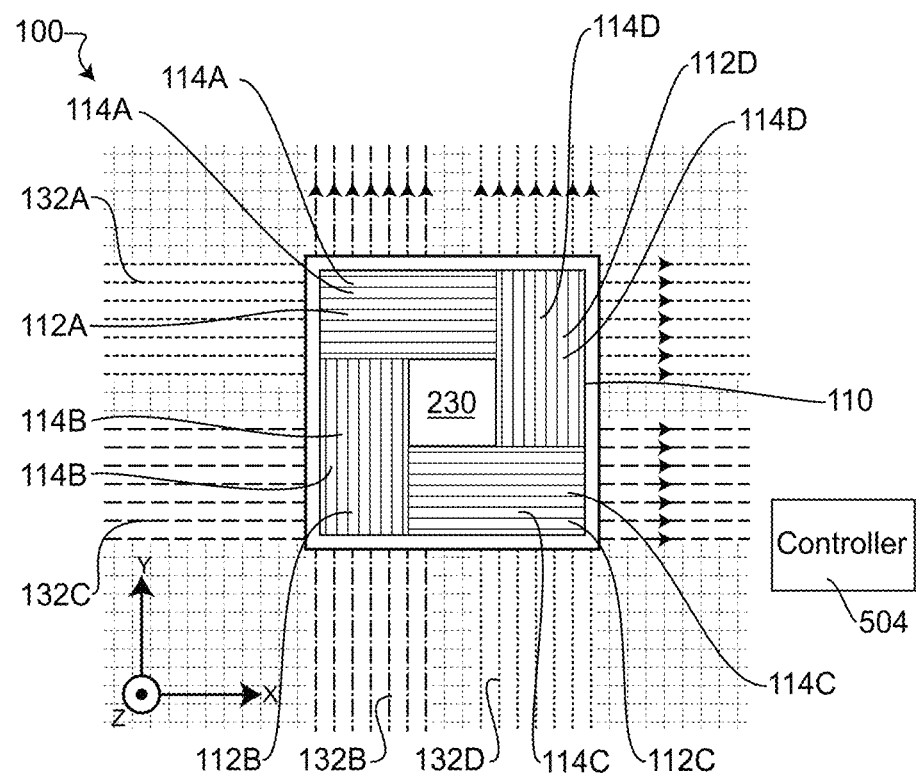
FIG. 3B is a partial schematic cross-sectional view of the FIG. 3A displacement device along the line 1B-1B showing the magnet arrays of the movable stage relative to the coils of the stator.

Throughout the following description specific details are set forth in order to provide a more thorough understanding to persons skilled in the art. However, well known elements may not have been shown or described in detail to avoid unnecessarily obscuring the disclosure. Accordingly, the description and drawings are to be regarded in an illustrative, rather than a restrictive, sense.

Displacement devices are provided which comprise a stator and a movable stage. The stator comprises a two-dimensional sensor array and a plurality of coils shaped to provide pluralities of generally linearly elongated coil traces in one or more layers. Layers of coils may overlap in the Z direction. These layers of coils may also overlap with the sensor array in the Z direction. The movable stage comprises one or more magnet arrays. Each magnet array may comprise a plurality of magnetization segments generally linearly elongated in a corresponding direction. Each magnetization segment has a magnetization direction generally orthogonal to the direction in which it is elongated. The magnetization directions of the plurality of magnetization segments in each magnet array exhibit a magnetic spatial period $\lambda$ in a direction across a width of the magnet array. One or more amplifiers may be selectively connected to drive current in the coil traces and to thereby effect relative movement between the stator and the movable stage. The sensors in the sensor array are configured to sense the position of the movable stage relative to the stator. A controller is connected to receive information based on outputs of the sensors in the array and is configured to use the information to determine a position of the movable stage (e.g. relative to the stator). The controller may also be configured to use information related to the current in coil traces to help determine the position of the movable stage (e.g. to compensate information from sensors to account for magnetic fields created by current in coil traces).

Particular Embodiment

FIGS. 1A and 1B are respectively partial schematic side and top views of a displacement device 100 according to a particular embodiment. Displacement device 100 comprises a movable stage 110 and a stator 120. Moveable stage 110 comprises one or more magnet arrays 112. Stator 120 comprises a two-dimensional (2D) sensor array 500 and a plurality of coils 122. Stator 120 may be located adjacent to and may be oriented generally parallel to movable stage 110. FIGS. 2A, 2B and 2C are respectively partial schematic side views of the FIG. 1 displacement device 100 according to particular embodiments showing different locations of sensor array 500 relative to stator 120 and/or coils 122. Sensor array 500 may be located within stator 120 or may be attached to stator 120. In particular, 2D sensor array 500 may be located on top of (FIG. 2A), below (FIG. 2B) or within (FIG. 2C) stator 120. As explained in more detail below, each sensor 501 in sensor array 500 is a magnetic field sensor sensitive to variation in magnetic field. Sensors 501 may comprise, without limitation, Hall-effect magnetic field sensors, magneto-resistive sensors, and/or other suitable types of magnetic field sensors that can measure magnetic flux density. As explained in more detail below, each of coils 122 is elongated along a particular dimension, such that in a working region 124 of stator 120 (i.e. a region of stator 120 over which movable stage 110 can move), coils 122 effectively provide linearly elongated coil traces 126 (see FIG. 3C).

Displacement device 100 comprises a controller 504 connected to receive information based on an output from sensors 501 in array 500. Controller 504 is configured (e.g. programmed) to use the received information to determine (e.g. estimate) a position of movable stage 110 in one or more non-parallel directions (e.g. directions X, Y and/or Z in the FIG. 1 view). The position of movable stage 110 determined by controller 504 may be determined relative to stator 120, relative to some reference on or associated with stator 120 and/or to some other reference (e.g. some other static reference). Controller 504 may comprise components of a suitable computer. In general, controller 504 comprise any suitably configured processor, such as, for example, a suitably configured general purpose processor, microprocessor, microcontroller, digital signal processor, field-programmable gate array (FPGA), other type of programmable logic device, pluralities of the foregoing, combinations of the foregoing, and/or the like. Controller 504 has access to software which may be stored in computer-readable memory (not expressly shown) accessible to controller 504 and/or in computer-readable memory that is integral to controller 504. Controller 504 may be configured to read and execute such software instructions and, when executed by the controller 504, such software may cause controller 504 to implement some of the functionalities described herein.

For purposes of describing the displacement devices disclosed herein, it can be useful to define a pair of coordinate systems a stator coordinate system which is fixed to the stator (e.g. to stator 120) and does not move; and a stage coordinate system which is fixed to the movable stage (e.g. movable stage 110) and moves relative to the stator and the stator coordinate system. This description may use conventional Cartesian coordinates (X, Y, Z) to describe these coordinate systems, although it will be appreciated that other coordinate systems could be used. For convenience and brevity, in this description and the associated drawings, the directions (e.g. X, Y, Z directions) in the stator coordinate system and the directions in the stage coordinate systems are shown and described as being coincident with one another— i.e. the stator-X, stator-Y and stator-Z directions are shown and described as being coincident with the stage-X, stage-Y and stage-Z directions. Accordingly, this description and the associated drawings may refer to directions (e.g. X, Y and/or Z directions) to refer to directions in both or either of the stator and/or stage coordinate systems. However, it will be appreciated from the description herein that in some embodiments, the movable stage (e.g. stage 110) may move relative to the stator (e.g. stator 120) such that these directions are no longer coincident with one another. In such cases, this disclosure may adopt the convention of using the terms stator-X, stator-Y and stator-Z to refer to directions in the stator coordinate system and the terms stage-X, stage-Y and stage-Z to refer to directions in the stage coordinate system.

FIG. 2A is a partial schematic side view of a displacement device 100 according to a particular embodiment, where sensor array 500 is distributed on the "top" surface of stator 120 (i.e. the surface of stator 120 located between coils 122 and movable stage 110). In the FIG. 2A embodiment, this "top" surface has a normal oriented in the positive z direction, although this is not necessary. FIG. 2B is a partial schematic side view of a displacement device 100 according to a particular embodiment, where sensor array 500 is distributed on the "bottom" surface of stator 120 (i.e. the surface of stator 120 opposite movable stage 110). In the FIG. 2B embodiment, this "bottom" surface has normal oriented in the negative z direction, although this is not necessary. FIG. 2C is a partial schematic side view of a displacement device 100 according to a particular embodiment, wherein sensor array 500 is located in stator 120 and is distributed in spaces between coils 122. For example, coils 122 can be constructed using copper printed-circuit board manufacturing technology. Spaces can be created in the printed circuit board(s) between coil traces 122. Each sensor 501 may be located in a corresponding space between coils 122—i.e. where no coil traces are located.

In the embodiments of FIGS. 2A-2C magnetic field sensors 501 are distributed in array 500 in a plane extended in a first X direction and a second Y direction, with a normal direction in a third Z direction. As explained in more detail below and shown in FIG. 3C, stator coils 122 may comprise a plurality of coil trace layers 128. Each coil trace layer 128 may comprise a plurality of coil traces 126 shaped to be linearly elongated in one of the X, Y directions. As explained in more detail below and shown in FIG. 3B, movable stage 110 may comprise one or more linearly elongated magnet arrays 112 (e.g. linearly elongated in the stage-X or stage-Y directions), each of which may comprise a corresponding plurality of linearly elongated magnetization segments 114 (e.g. linearly elongated in the stage-X or stage-Y directions).

FIGS. 3A-3F (collectively FIG. 3) show more detail of displacement device 100 according to a particular embodiment of the invention. FIGS. 3A-3F show a variety of different views of displacement device 100 and in some of FIGS. 3A-3F, particular components of displacement device 100 are not shown to better illustrate other components. Displacement device 100 comprises a movable stage 110 and a stator 120. Moveable stage 110 comprises one or more linearly elongated magnet arrays 112. Movable stage 110 of the illustrated embodiment comprises a plurality (e.g. 4) of arrays of permanent magnets 112A, 112B, 112C, 112D (collectively, magnet arrays 112). Stator 120 comprises a plurality of coils 122 and a two-dimensional (2D) magnetic sensor array 500. As explained in more detail below, each of coils 122 is elongated along a particular dimension, such that in a working region 124 of stator 120 (i.e. a region of stator 120 over which movable stage 110 can move), coils 122 effectively provide linearly elongated coil traces 126. As explained in more detail below, each of coil traces 126 comprises a corresponding axis (e.g. X or Y-axis) along which it is linearly elongated. For clarity, only a portion of the working region 124 of stator 120 is shown in the views of FIG. 3. In general, the working region 124 of stator 120 may be significantly larger than that shown in FIG. 3 and may be significantly larger than movable stage 110. It will be appreciated that outside of the partial views of FIG. 3, coils 122 may have loops which are not linearly elongated. As explained in more detail below, each sensor 501 of 2D sensor array 500 may be located at a two-dimensional grid point. These grid points are the intersection points of two groups of parallel lines. Lines in one group are non-parallel (e.g. orthogonal) with lines in the other group. Each sensor 501 can measure magnetic field flux density in one direction, or in more than one direction.

In the illustrated FIG. 3 embodiment (as best seen in FIG. 3C), stator 120 comprises a plurality (e.g. 4) of layers 128A, 128B, 128C, 128D (collectively, layers 128) of coil traces 126, with each pair of coil trace layers 128 separated from one another by an electrically insulating layer 130. It will be appreciated that the number of layers 128 in stator 120 may be varied for particular implementations and that the number of layers 128 shown in the illustrated embodiment is convenient for the purposes of explanation. In the illustrated embodiment, each layer 128 comprises coil traces 126 that are linearly elongated along axes that are parallel to one another. In the case of the illustrated embodiment, layers 128A, 128C comprise coil traces 126Y which are generally linearly elongated in directions parallel to the Y direction (stator-Y direction) and layers 128B, 128D comprise coil traces 126X which are generally linearly oriented in directions parallel to the X direction (stator-X direction). Coil traces 126Y which are generally linearly oriented along the Y direction may be referred to herein as "Y-coils" or "Y-traces" and, as explained in more detail below, may be used to move movable stage 110 in the X and Z directions. Similarly, coil traces 126X which are generally linearly oriented along the X direction may be referred to herein as "X-coils" or "X-traces" and, as explained in more detail below, may be used to move movable stage 110 in the Y and Z directions.

In the illustrated embodiment (as shown best in FIG. 3B), movable stage 110 comprises four magnet arrays 112. In some embodiments, movable stage 110 may comprise more than four magnet arrays 112. In other embodiments, movable stage 110 may comprise fewer than four magnet arrays. For example, movable stage 110 may comprise one or more magnet arrays. Each magnet array 112A, 112B, 112C, 112D of the FIG. 3 embodiment comprises a plurality of corresponding magnetization segments 114A, 114B, 114C, 114D (collectively, magnetization segments 114) having different magnetization directions. In the illustrated embodiment, each magnetization segment 114 is generally linearly elongated along a corresponding axial dimension. The elongated shape of magnetization segments 114 of the illustrated embodiment is shown, for example, in FIG. 3B. In some embodiments, the elongation direction length (i.e. dimension in the elongation direction) of each magnetization segment 114 is at least twice its width and height (i.e. the cross-sectional dimensions orthogonal to the elongation direction). In some embodiments, this ratio of elongation direction length of each magnetization segment 114 versus its orthogonal width and height dimensions may be at least four. This relationship between the elongation direction length of each magnetization segment 114 and its orthogonal width and height dimensions may hold independently of the dimensions of magnet arrays 112.

It can be seen that in the case of the illustrated FIG. 3 embodiment, magnetization segments 114A of magnet array 112A and magnetization segments 114C of magnet array 112C are generally elongated in directions parallel to the stage-X direction and magnetization segments 114B of magnet array 112B and magnetization segments 114D of magnet array 112D are generally elongated in directions parallel to the stage-Y direction. Because of the direction of elongation of their respective magnetization segments 114: magnet arrays 112A, 112C may be referred to herein as "X-magnet arrays" 112A, 112C and their corresponding magnetization segments 114A, 114C may be referred to herein as "X-magnetization segments"; and magnet arrays 112B, 112D may be referred to herein as "Y-magnet arrays" 112B, 112D and their corresponding magnetization segments 114B, 114D may be referred to herein as "Y-magnetization segments". This description uses a number of symbols to describe dimensions of magnet arrays 112. As shown best in FIGS. 3D, 3E and 4, $L_{xx}$ represents the stage-X direction length of an X-magnet array (e.g. X-magnet arrays 112A, 112C); $W_{xy}$ represents the stage-Y direction width of an X-magnet array (e.g. X-magnet arrays 112A, 112C); $H_{xz}$ represents the stage-Z direction height of an X-magnet array (e.g. X-magnet arrays 112A, 112C); $L_{yy}$ represents the stage-Y direction length of a Y-magnet array (e.g. Y-magnet arrays 112B, 112D); $W_{yx}$ represents the stage-X direction width of a Y-magnet array (e.g. Y-magnet arrays 112B, 112D); and $H_{yz}$ represents the stage-Z direction height of an Y-magnet array (e.g. Y-magnet arrays 112B, 112D).

Magnetization segments 114 may be elongated. In some embodiments, the elongated lengths of magnetization segments 114 in their elongation directions are greater (e.g. twice, four times or more) than the widths and heights of magnetization segments 114 in directions orthogonal to their elongation directions see FIGS. 3B, 3D, 3E and 4. In some embodiments, the elongation direction lengths of magnetization segments 114 (e.g. lengths $L_{xx}$ of X-magnetization segments 114A, 114C and/or lengths $L_{yy}$ of Y-magnetization segments 114B, 114D in the case of the illustrated FIG. 3 embodiment, where the elongated direction lengths of magnetization segments 114 are the same as the corresponding dimensions of their respective magnet arrays 112) may be at least twice (and in some embodiments, at least four times) their respective widths (e.g. $\lambda/(2Nt)$ or $\lambda/N_t$, as explained in more detail below). Further, in some embodiments, the elongation direction lengths of magnetization segments 114 (e.g. lengths $L_{xx}$ of X-magnetization segments 114A, 114C and/or lengths $L_{yy}$ of Y-magnetization segments 114B, 114D in the case of the illustrated FIG. 3 embodiment, where the elongated direction lengths of magnetization segments 114 are the same as the corresponding dimensions of their respective magnet arrays 112) may be at least twice (and in some embodiments, at least four times) their respective stage-Z direction heights (e.g. heights $H_{xz}$ of X-magnetization segments 114A, 114C and heights $H_{yz}$ of Y-magnetization segments 114B, 114D) see FIGS. 3B, 3D, 3E and 4. It will be appreciated that the dimensions $L_{xx}$ and $L_{yy}$ are used above for convenience since in the illustrated embodiment of FIG. 3, the dimensions $L_{xx}$, $L_{yy}$ of magnet arrays 112 are the same the elongation direction lengths of magnetization segments 114; in general, however, these relationships between the elongation direction lengths of magnetization segments 114 and their orthogonal width and height dimensions may hold independently of the dimensions of magnet arrays 112.

FIG. 3C schematically shows the orientation of the magnetization of the various magnetization segments 114B of Y-magnet array 112B in accordance with a particular non-limiting example. More particularly, the schematically illustrated arrows in Y-magnet array 112B of FIG. 3C show the magnetization directions of the various magnetization segments 114B. Also, within each magnetization segment 114B, the shaded regions represent the north poles of the magnets and the white regions represent the south poles of the magnets.

Figure 3D:
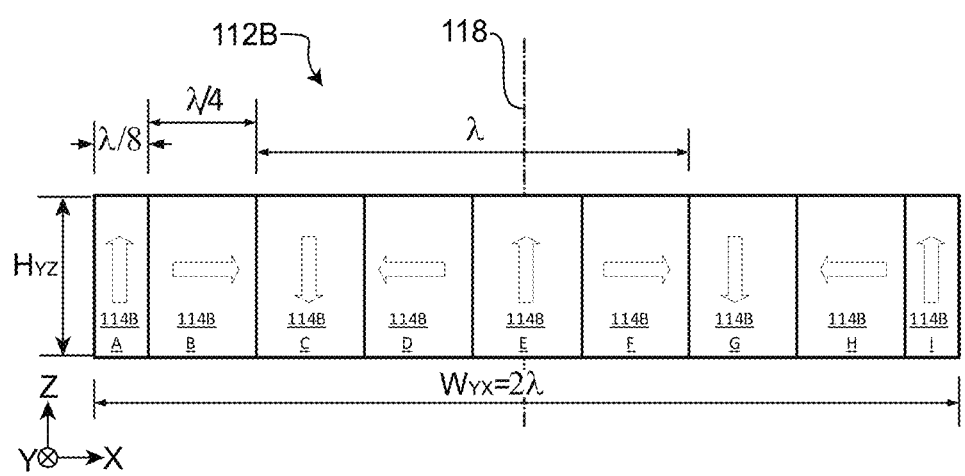
FIG. 3D shows additional detail of one of the Y-magnet arrays of the FIG. 3A displacement device in accordance with a particular embodiment.

FIG. 3D shows a cross-sectional view of Y-magnet array 112B in more detail. It can be seen that Y-magnet array 112B is divided into a number of mechanically contiguous magnetization segments 114B along the stage-X direction and that the magnetization directions of the various segments 114B are oriented in directions orthogonal to the stage-Y direction—i.e. the magnetization directions of the magnetization segments 114B are orthogonal to the stage-Y direction along which magnetization segments 114B are elongated. Mechanically contiguous magnetization segments 114B of Y-magnet array 112B that are adjacent to one another in the stage-X direction are in contact with one another. It may also be observed from FIG. 3D that the magnetization directions of magnetization segments 114B have a spatial periodicity with a period (or wavelength) $\lambda$ along the stage-X direction. This spatial periodicity $\lambda$ of the magnetization directions of the magnetization segments 114 of a magnet array 112 may be referred to herein as the magnetic period $\lambda$, magnetic spatial period $\lambda$, magnetic wavelength $\lambda$ or magnetic spatial wavelength $\lambda$.

In the illustrated FIG. 3D embodiment, Y-magnet array 112B has a total stage-X direction width $W_{yx}$ of $2\lambda$—i.e. two periods of the magnetic period $\lambda$. This is not necessary. In some embodiments, Y-magnet array 112B has a total stage-X direction width $W_{yx}$ given by $W_{yx}=N_m\lambda$, where $N_m$ is a positive integer. In some embodiments, the stage-X direction width $W_{yx}$ of Y-magnet arrays 112B, 112D is the same as the stage-Y direction width $W_{xy}$ of X-magnet arrays 112A, 112C—i.e. $W_{yx}=W_{xy}=W_m$.

In the case of the illustrated FIG. 3D embodiment, magnetization segments 114B comprise four different magnetization directions: +Z, −Z, +X, −X (where Z refers to the stage-Z direction and X refers to the stage-X direction) which together provide a magnetic spatial period $\lambda$. This is not necessary. In some embodiments, magnetization segments 114B may comprise as few as two magnetization directions to provide a magnetic spatial period $\lambda$ and in some embodiments, magnetization segments 114B may comprise more than four magnetization directions to provide a magnetic spatial period $\lambda$. The number of different magnetization directions of a magnet array 112 that make up a complete magnetic spatial period $\lambda$ may be referred to herein as $N_t$. Regardless of the number $N_t$ of magnetization directions of magnetization segments 114B, the magnetization direction of each segment 114B is oriented generally orthogonally to the stage-Y direction. FIG. 3D also shows that, in the illustrated embodiment, the stage-X direction width of a magnetization segment 114B is either: $\lambda/(2Nt)$ or $\lambda/N_t$. In the case of the FIG. 3D embodiment, where the number $N_t$ of magnetization directions is $N_t=4$, the stage-X direction width of magnetization sections 114B is either $\lambda/8$ (as is the case for the edge segments labeled A, I) or $\lambda/4$ (as is the case for the interior segments labeled B, C, D, E, F, G, H). As discussed above, in some embodiments, the elongation direction lengths of Y-magnetization segments 114B (e.g. $L_{yy}$ in the illustrated embodiment) may be at least twice (and in some embodiments, at least four times) their respective widths (e.g. $\lambda/(2Nt)$ or $\lambda/N_t$). FIG. 3D also shows the stage-Z direction height $H_{yz}$ of Y-magnetization segments 114B. As discussed above, in some embodiments, the elongation direction lengths of Y-magnetization segments 114B (e.g. $L_{yy}$ in the illustrated embodiment) may be at least twice (and in some embodiments, at least four times) their respective stage-Z direction heights (e.g. heights $H_{yz}$).

Another observation that may be made in the case of the illustrated FIG. 3D embodiment is that the magnetization of magnetization segments 114B is mirror symmetric about a central stage Y-Z plane 118 (i.e. a plane 118 that extends in the stage-Y and stage-Z directions and that intersects magnet array 112B at the center of its stage-X dimension $W_{yx}$). While not explicitly shown in FIG. 3D, in some embodiments, magnet array 112B may be provided with a non-magnetic spacer at the center of its stage-X direction dimension $W_{yx}$. More particularly, magnetization segment 114B at the center of the stage-X direction dimension $W_{yx}$ of magnet array 112B (i.e. the segment labeled E in the illustrated embodiment) may be divided into two segments of width $\lambda/(2Nt)=\lambda/8$ and a non-magnetic spacer may be inserted therebetween. As explained in more detail below, such a non-magnetic spacer can be used to cancel disturbance forces/torques generated by higher order harmonic magnetic fields. Another function of such a non-magnetic spacer is that such a non-magnetic spacer can be used to cancel/attenuate higher order harmonic magnetic fields detected by the sensor array 500. Even with such non-magnetic spacer, magnet array 112B and its magnetization segments 114B will still exhibit the properties that: the magnetization directions of the various segments 114B are oriented in directions orthogonal to the stage-Y direction; the stage-X direction widths of the various segments 114B will be either: $\lambda/(2Nt)$ (for the outer segments A, I and the two segments formed by dividing segment E) or $\lambda/Nt$ (for the interior segments B, C, D, F, G, H); and the magnetization of magnetization segments 114B is mirror symmetric about central Y-Z plane 118.

Other than for its location on movable stage 110, the characteristics of Y-magnet array 112D and its magnetization segments 114D may be similar to those of Y-magnet array 112B and its magnetization segments 114B.

Figure 3E:
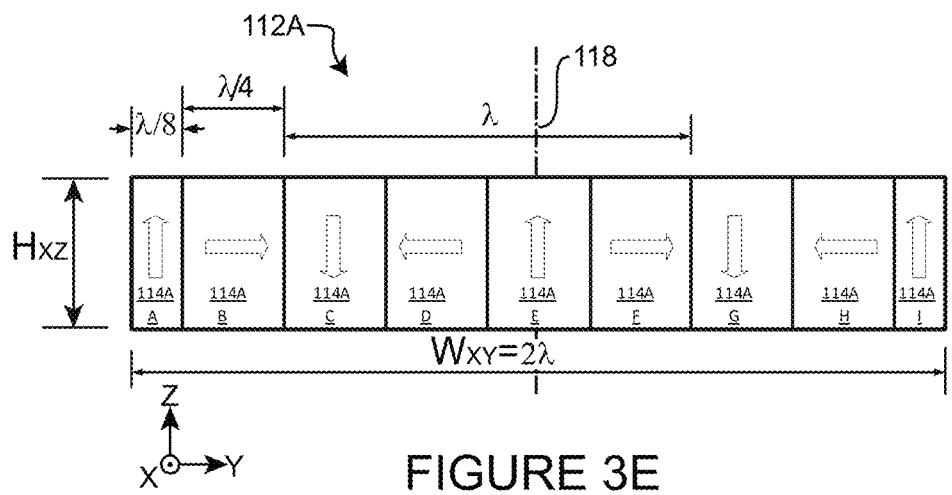
FIG. 3E shows additional detail of one of the X-magnet arrays of the FIG. 3A displacement device in accordance with a particular embodiment.

FIG. 3E shows a cross-sectional view of X-magnet array 112A in more detail. It will be appreciated that X-magnet array 112A is divided, along the stage-Y direction, into a number of mechanically contiguous magnetization segments 114A which are generally linearly elongated in the stage-X direction. Mechanically contiguous magnetization segments 114A of X-magnet array 112A that are adjacent to one another in the stage-Y direction are in contact with one another. In the illustrated embodiment, the characteristics of X-magnet array 112A and its magnetization segments 114A may be similar to those of Y-magnet array 112B and its magnetization segments 114B, except that the stage-X and stage-Y directions are swapped. For example, the magnetization directions of magnetization segments 114A have a spatial periodicity with a period (or wavelength) $\lambda$ along the stage-Y direction; the width $W_{xy}$ of X-magnet array 112A in the stage-Y direction is given by $W_{xy}=N_m\lambda$ where $N_m$ is a positive integer; the magnetization directions of the various magnetization segments 114A are oriented in directions orthogonal to the stage-X direction; the stage-Y direction widths of the various magnetization segments 114A are either: $\lambda/(2N_t)$ (for the outer segments A, I) or $\lambda/N_t$ (for the interior segments B, C, D, E, F, G, H), where $N_t$ represents the number of different magnetization directions in magnet array 112A; and the magnetization of magnetization segments 114A is mirror symmetric about central X-Z plane 118. As discussed above, in some embodiments, the elongation direction lengths of X-magnetization segments 114A (e.g. $L_{xx}$ in the illustrated embodiment) may be at least twice (and in some embodiments, at least four times) their respective widths (e.g. $\lambda/(2Nt)$ or $\lambda/N_t$). FIG. 3E also shows the stage-Z direction height $H_{xz}$ of X-magnetization segments 114A. As discussed above, in some embodiments, the elongation direction lengths of X-magnetization segments 114A (e.g. $L_{xx}$ in the illustrated embodiment) may be at least twice (and in some embodiments, at least four times) their respective stage-Z direction heights (e.g. heights $H_{xz}$).

Other than for its location on movable stage 110, the characteristics of X-magnet array 112C and its magnetization segments 114C may be similar to those of X-magnet array 112A and its magnetization segments 114A.

Referring to FIGS. 3B and 3C, the operation of displacement device 100 is now explained. FIG. 3C shows how movable stage 110 is spaced upwardly apart from stator 120 in the stator-Z direction. This space between stator 120 and movable stage 110 can be maintained (at least in part) by stator-Z direction forces created by the interaction of coils 122 on stator 120 with magnet arrays 112 on movable stage 110 as discussed below. In some embodiments, this space between stator 120 and movable stage 110 can be maintained using additional lifting and/or hoisting magnets, aerostatic bearings, roller bearings, sliding bearings and/or the like (not shown), as is known in the art.

FIG. 3B shows four sets of active coil traces 132A, 132B, 132C, 132D (collectively, coil traces 132), each of which (when carrying current) is primarily responsible for interacting with a corresponding one of magnet arrays 112A, 112B, 112C, 112D to impart forces which cause movable stage 110 to move. More particularly: when coil traces 132A are carrying current, they interact with X-magnet array 112A to impart forces on movable stage 110 in the stator-Y and stator-Z directions; when coil traces 132B are carrying current, they interact with Y-magnet array 112B to impart forces on movable stage 110 in the stator-X and stator-Z directions; when coil traces 132C are carrying current, they interact with X-magnet array 112C to impart forces on movable stage 110 in the stator-Y and stator-Z directions; and when coil traces 132D are carrying current, they interact with Y-magnet array 112D to impart forces on movable stage 110 in the stator-X and stator-Z directions.

It will be appreciated that coil traces 132 shown in FIG. 3B can be selectively activated (e.g. by controller 504) to impart desired forces on movable stage 110 and to thereby control the movement of movable stage 110 with six degrees of freedom relating to the rigid body motion of movable stage 110. As explained further below, coil traces 132 can also be controllably activated to control some flexible mode vibrating motion of movable stage 110. When movable stage 110 is shown in the particular position shown in FIG. 3B, coil traces other than coil traces 132 may be inactive. However, it will be appreciated that as movable stage 110 moves relative to stator 120, different groups of coil traces will be selected to be active and to impart desired forces on movable stage 110.

It may be observed that the active coil traces 132 shown in FIG. 3B appear to interact with other magnet arrays. For example, when carrying current, coil traces 132C interact with X-magnet array 112C as discussed above, but coil traces 132C also pass under a portion of Y-magnet array 112B. One might expect that, the current in coil traces 132C might interact with the magnets in Y-magnet array 112B and impart additional forces on movable stage 110. However, because of the aforementioned characteristics of Y-magnet array 112B, the forces that might have been caused by the interaction of coil traces 132C and the magnetization segments 114B of Y-magnet array 112B cancel one another out, such that these parasitic coupling forces are eliminated or kept to a minimal level. More particularly, the characteristics of Y-magnet array 112B that eliminate or reduce these cross-coupling forces include: Y-magnet array 112B includes magnetization segments which are generally elongated in the stage-Y direction with varying magnetizations which are oriented orthogonally to the stage-Y direction; the stage-X direction width $W_{yx}$ of Y-magnet array 112B is $W_{yx}=N_m\lambda$ where $N_m$ is an integer and $\lambda$ is the magnetic period $\lambda$ described above; and Y-magnet array 112B is mirror symmetric about a stage Y-Z plane that runs through the center of the stage-X dimension $W_{yx}$ of Y-magnet array 112B.

For example, the stage-X dimension width $W_{yx}$ of Y-magnet array 112B being an integer number of magnetic wavelengths ($W_{yx}=N_m\lambda$) minimizes force coupling with non-aligned coil traces 132C, because the net force on magnet array 112B will integrate to zero (i.e. will cancel itself out) over each wavelength $\lambda$ of magnet array 112B. Also, the mirror-symmetry of Y-magnet array 112B about a stage Y-Z plane that is orthogonal to the stage-X direction and runs through the center of the stage-X dimension $W_{yx}$ of Y-magnet array 112B minimizes the net moment (about the Z axis and about the Y axis) due to the interaction of magnet array 112B with stage-X-oriented coil traces 132C. Similar characteristics of Y-magnet array 112D eliminate or minimize cross-coupling from coil traces 132A.

In an analogous manner, the characteristics of X-magnet array 112A eliminate or reduce cross-coupling forces from coil traces 132B. Such characteristics of X-magnet array 112A include: X-magnet array 112A includes magnetization segments which are generally elongated in the stage-X direction with varying magnetizations which are oriented orthogonally to the stage-X direction; the stage-Y dimension width $W_{xy}$ of X-magnet array 112A is $W_{xy}=N_m\lambda$ where $N_m$ is an integer and $\lambda$ is the magnetic period $\lambda$ described above; and X-magnet array 112A is mirror symmetric about a stage X-Z plane that is orthogonal to the stage-Y direction and runs through the center of the stage-Y dimension $W_{xy}$ of X-magnet array 112A. Similar characteristics of X-magnet array 112C eliminate or minimize cross coupling from coil traces 132D.

Figure 3F:
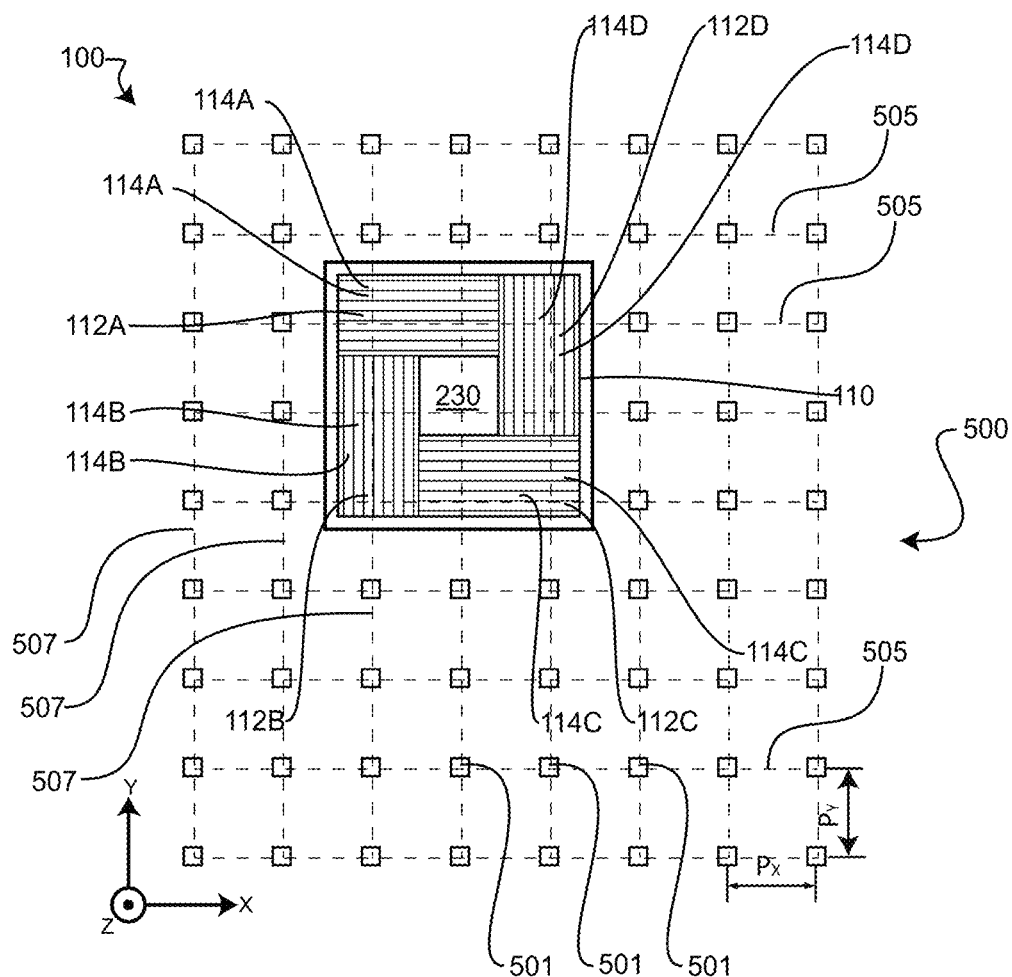
FIG. 3F is a partial schematic cross-sectional view of the FIG. 3A displacement device along the line 1F-1F showing the magnet arrays of the movable stage relative to the sensors of the stator.

FIG. 3F shows a top view of the 2D array 500 magnetic field sensors 501 with respect to movable stage 110. Each sensor 501 is sensitive to magnetic flux density in one, or two, or three non-parallel directions (e.g. in the stator-X, Y and/or Z directions). In the illustrated embodiment, sensors 501 are located at the intersection points between equally spaced, generally parallel lines 505 oriented in a first extension direction (e.g. the stator-X direction) and equally spaced, generally parallel lines 507 oriented in second extension direction (e.g. the stator-Y direction). Sensors 501 positioned generally on or suitably close to a line 505 may be said to be generally aligned with one another in a stator-X direction and may be said to belong to a stator-X oriented sensor row. Sensors 501 positioned generally on or suitably close to a line 507 may be said to be generally aligned with one another in a stator-Y direction and may said to belong to a stator-Y oriented sensor column. It may be desirable to have the first extension direction (lines 505) and the second extension direction (lines 507) of array 500 be orthogonal to each other. However, generally, the two extension directions of sensor array 500 can be in any non-parallel relation. In the illustrated FIG. 3F embodiment, sensors 501 are generally equally spaced along both the first extension (e.g. stator-X) direction and the second extension (e.g. stator-Y) direction with $P_x$ being the sensor pitch along stator-X direction and $P_y$ being the sensor pitch along stator-Y axis. These pitches $P_x$, $P_y$ or other references to the spacing or distance between sensors 501 may be interpreted to be the distance between the geometric center points of sensors 501.

In some embodiments, these sensor pitches $P_x$, $P_y$ are set in general accordance with:

$$P_X = n\lambda_X/N,$$

$$P_Y = m\lambda_Y/M,$$

where $\lambda_X$ is the stage-X oriented magnetic spatial period of Y-magnet arrays 112 (e.g. arrays 112B, 112D); $\lambda_Y$ is the stage-Y oriented magnetic spatial period of X-magnet arrays 112 (e.g. arrays 112A, 112C); n, m, N and M are positive integer numbers; n, N selected such that $$\frac{n}{N}$$

is not an integer; and m, M selected such that $$\frac{m}{M}$$

is not an integer. As described in more detail below, this selection of the relationship between sensor pitches $P_x$, $P_y$ and magnetic periods $\lambda_X$, $\lambda_Y$ (together with suitable selection of widths of magnet arrays 112 e.g. Y-magnet array width $W_{yx}=N_{my}\lambda_x$ and X-magnet array width $W_{xy}=N_{mx}\lambda_y$, $N_{my}$ and $N_{mx}$ are positive integers): may permit synchronous summing/averaging of sensor rows/columns which may aid in position detection; may permit sums/averages of stator-X oriented sensor rows to be insensitive to Y-magnet arrays (e.g. Y-magnet arrays 112B, 112D), and accordingly permit determination of the position of X-magnet magnet arrays (e.g. magnet arrays 112A, 112C) without impact from the fields of Y-magnet arrays; and may permit sums/averages of stator-Y oriented sensor columns to be insensitive to X-magnet arrays (e.g. X-magnet arrays 112A, 112C), and accordingly permit determination of the position of Y-magnet magnet arrays (e.g. magnet arrays 112B, 112D) without impact from the fields of X-magnet arrays.

Coil Array

Additional detail of stator 120 and its coil arrays is now provided. As described above, stator 120 comprises a plurality of layers 128 of coil traces 126 which are generally linearly oriented in the working region 124. Each layer 128 comprises coil traces 126 that are generally aligned with one another (e.g. generally linearly elongated in the same direction). In the illustrated embodiment of FIGS. 3A-3E, vertically adjacent layers 128 (i.e. layers 128 next to one another in the stator-Z direction) comprise coil traces 126 that are orthogonally oriented with respect to one another. For example, coil traces 126Y in layers 128A, 128C (FIG. 3C) are generally linearly oriented parallel to the stator-Y direction and coil traces 126X in layers 128B, 128D are generally linearly oriented parallel to the stator-X direction. It will be appreciated that the number of layers 128 of coil traces 126 in stator 120 need not be limited to the four traces shown in the illustrated embodiment. In general, stator 120 may comprise any suitable number of layers 128 of coil traces 126. Further, it is not a requirement that the orientations of coil traces 126 in vertically adjacent layers 128 be different from one another. Some embodiments may comprise a number of vertically adjacent layers 128 of Y-oriented traces 126Y followed by a number of vertically adjacent layers 128 of X-oriented coil traces 126X.

Stator 120 and its arrays of coils 122 may be fabricated using one or more printed-circuit boards (PCBs). PCBs can be manufactured using standard PCB fabrication, flat-panel display lithography, lithography and/or similar technology known in the art to provide coils 122 and coil traces 126. Insulator layers 130 (such as FR4 core, prepreg, ceramic material and/or the like) may be fabricated or otherwise inserted between coil layers 128. One or more coil layers 128 may be stacked together (i.e. in the stator-Z direction) in a single PCB board. In some embodiments, coil traces 126 generally elongated in the same direction (at different layers 128) may be connected in parallel or serially, depending on via design and/or connecting methods for the ends of coil traces 126. In some embodiments, coil traces 126 generally elongated in the same direction (at different layers 128) are not connected to one another.

Coils 122 fabricated using PCB technology can accommodate sufficient current for controlling the motion of movable stage 110. By way of non-limiting example, each coil 122 can be made from 6 oz copper (about 200-220 μm thick) or more. As discussed above, in working region 124, each coil 122 is in the shape of a flat strip or coil trace 126, which provides good thermal conductivity due to the high ratio of surface area to volume. The inventors have confirmed (via testing) that laminated copper can carry a sustained current density of 10 A/mm² with a 50° C. temperature rise above ambient without using an active heat sink. Another advantage of planar layers 128 of coils 122 and coil traces 126 is that the naturally stratified conductors that provide coils 122 make them ideally suitable for carrying AC current, because the self-generated alternating magnetic field can easily penetrate the conductor through top and bottom surfaces but generates only low self-induced eddy currents.

Multiple PCBs may be aligned side by side in both stator X and Y directions (similar to floor tiles) to provide the desired stator X-Y dimensions for working region 124. Board-to-board lateral connections (in the stator-X and/or stator-Y directions) may be made at the edges by connecting pads, through-holes of edge-adjacent boards, copper wires and/or using other suitable bridging components of the like for electrically connecting conductors on adjacent PCB boards. In some embodiments, such bridging components may be located underneath the PCB boards (e.g. on the side opposite movable stage 110); in some embodiments, such bridging components may be additionally or alternatively located above the PCB boards or on the side(s) of the PCB boards. When PCBs are connected adjacent to one another in the stator-X and/or stator-Y directions, the end terminals (not shown) of coils 122 may be located at or near the perimeter of stator 120 for ease of wiring to the drive electronics. Connecting PCBs to one another in this manner allows displacement device 100 to be easily extended in both stator-X and stator-Y dimensions for various applications. When PCBs are connected to one another in the stator-X and/or stator-Y dimensions, the total number of coils 122 increases linearly with the stator X-Y dimensions of working region 124 of stator 120 (instead of quadratically, as is the case in some prior art techniques involving so-called "racetrack" coil designs). In some embodiments, coil traces 126 on stator X-Y adjacent PCB boards may be serially connected to one another to reduce the number of amplifiers (not shown) for driving current through coil traces 126. In some embodiments, coil traces 126 on stator X-Y adjacent PCB boards may be individually controlled by separate amplifiers to increase the flexibility for multi-stage actuation and to reduce heat generation.

A single PCB board may be fabricated to have a thickness (in the stator-Z direction) of up to 5 mm (or more) using available PCB technology. When thicker boards are required for heavy-duty applications, multiple PCBs can be stacked vertically in the stator-Z direction. Another benefit of using PCB technology to fabricate stator 120 is the possibility of deploying large numbers of low-profile sensors (such as Hall-effect position sensor, capacitive position sensors and/or the like) directly on the board using daisy chain connections.

The PCB board of stator 120 may also include circuits to perform functions for column and row summing or averaging, as described below. These circuits may be on the same PCB board as the stator coil assembly or on a different PCB board attached to the stator coil assembly by epoxy, for example.

Magnet Arrays

Figure 4A:
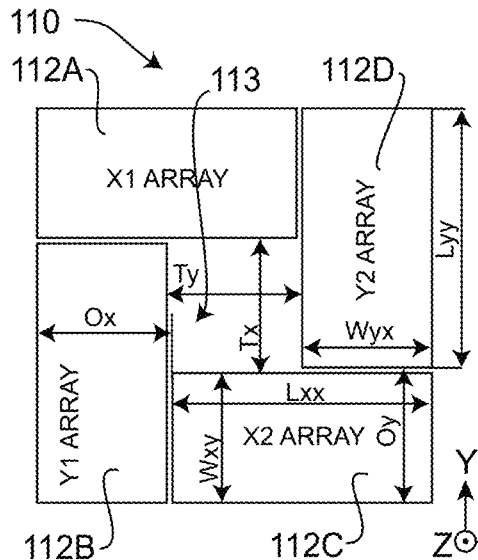
FIGS. 4A and 4B are schematic partial cross-sectional views of layouts of magnet arrays which may be used in connection with any of the displacement devices described herein and which are useful for showing a number of magnet array parameters.
Figure 4B:
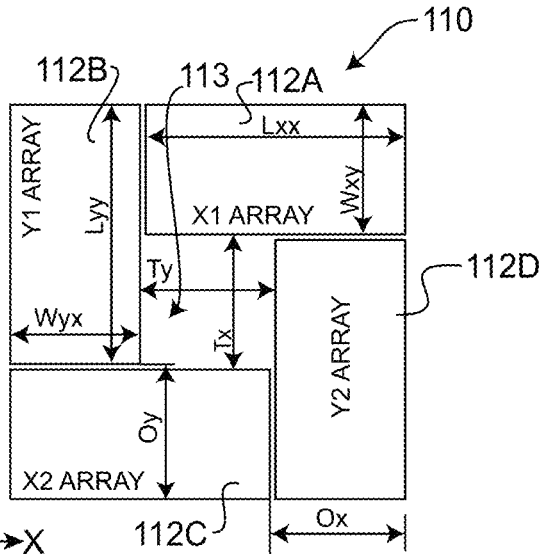

FIGS. 4A and 4B (collectively, FIG. 4) are schematic partial cross-sectional views of layouts of magnet arrays 112 which may be used in movable stage 110 of the FIG. 3 displacement device 100 and which are useful for showing a number of magnet array parameters. It can be observed that the layout of magnet arrays 112A, 112B, 112C, 112D in FIG. 4A is the same as that of magnet arrays 112A, 112B, 112C, 112D in FIG. 3B. The layout of magnet arrays 112A, 112B, 112C, 112D in FIG. 4B is similar to that of magnet arrays 112A, 112B, 112C, 112D shown in FIGS. 4A and 3B. The discussion in this section applies to both of the layouts shown in FIGS. 4A and 4B.

FIG. 4 shows that X-magnet arrays 112A, 112C have widths $W_{xy}$ and lengths $L_{xx}$ and Y-magnet arrays 112B, 112D have widths $W_{yx}$ and lengths $L_{yy}$. In some embodiments, like the illustrated embodiments of FIGS. 4A and 4B, $W_{xy}=W_{yx}=W_m$ and/or $L_{xx}=L_{yy}=L_m$, although this is not necessary. In the illustrated embodiment of FIG. 4, the lines associated with corresponding stage-Y oriented edges of X-magnet arrays 112A, 112C (i.e. the stage-Y oriented edges on the same relative sides of the arrays) are offset from one another in the stage-X direction by an offset $O_x$ and the lines associated with proximate stage-X oriented edges of X-magnet arrays 112A, 112C (i.e. the stage X-oriented edges of the arrays that are most proximate to one another) are spaced apart from one another by a space $T_x$. Similarly, in the illustrated embodiment of FIG. 4, the lines associated with corresponding stage-X oriented edges of Y-magnet arrays 112B, 112D (i.e. the stage-X oriented edges on the same relative sides of the arrays) are offset from one another in the stage-Y direction by an offset $O_y$ and the lines associated with proximate stage-Y oriented edges of Y-magnet arrays 112B, 112D (i.e. the stage Y-oriented edges of the arrays that are most proximate to one another) are spaced apart from one another by a space $T_y$. In some embodiments, like the illustrated embodiment $O_x=O_y=O_m$ and/or $T_x=T_y=T_m$, although this is not necessary. It can be observed that in the illustrated embodiment, movable stage 110 comprises a non-magnetic region 113 located in a center of its magnet arrays 112 and that the dimensions of non-magnetic region 113 are $T_x$ by $T_y$. In some embodiments, the dimensions $T_x$, $T_y$ are chosen to be greater or equal to the magnetic period $\lambda$, such that active coil traces 126 for two parallel magnet arrays 112 don't interfere with one another. As discussed above, for each magnet array 112, the magnetization segments 114 and corresponding magnetization directions are uniform along their elongated dimensions $L_{xx}$, $L_{yy}$ and are oriented orthogonally to their elongated dimensions $L_{xx}$, $L_{yy}$. For each magnet array 112, the magnetization segments 114 and corresponding magnetization direction vary along the direction of their widths $W_{xy}$, $W_{yx}$. While not expressly shown in the illustrated views, the magnet arrays 112 shown in FIG. 4 may be mounted under a suitable table or the like which may be used to support an article (e.g. a semiconductor wafer) thereatop.

One particular non-limiting implementation of magnet arrays 112 is described above in connection with FIGS. 3D (for Y-magnet array 112B) and 3E (for X-magnet array 112A). In the description of magnet arrays 112 that follows, a comprehensive explanation is provided in the context of an exemplary Y-magnet array 112B. X-magnet arrays may comprise similar characteristics where the X and Y directions and dimensions are appropriately interchanged. For brevity, in the description of Y-magnet array 112B that follows, the alphabetic notation is dropped and Y-magnet array 112B is referred to as magnet array 112. Similarly, the magnetization segments 114B of Y-magnet array 112B are referred to as magnetization segments 114.

Figure 5A:
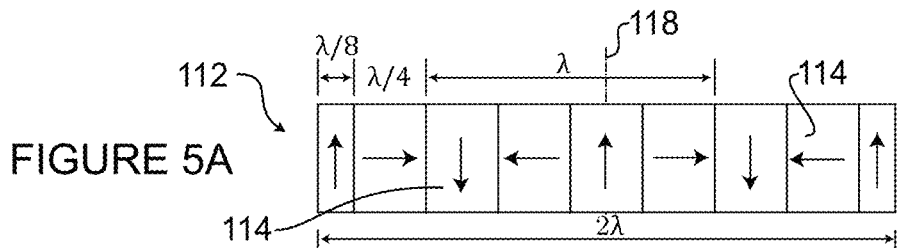
FIGS. 5A-5L show additional details of magnet arrays suitable for use with any of the displacement devices described herein in accordance with particular embodiments.

FIG. 5A shows an embodiment of a magnet array 112 substantially similar to magnet array 112B described above in connection with FIG. 3D. Magnet array 112 is divided, along the stage-X axis, into a number of magnetization segments 114 which are generally linearly elongated in the stage-Y axis direction. In the illustrated embodiment, the magnetization directions of magnetization segments 114 have a spatial periodicity with a period (or wavelength) $\lambda$ along the stage-X axis; the width $W_{yx}$ of magnet array 112 in the stage-X direction is given by $W_{yx}=N_m\lambda$ where $N_m$ is a positive integer (and $N_m=2$ in the FIG. 5A embodiment); the magnetization directions of the various magnetization segments 114 are oriented in directions orthogonal to the stage-Y direction; the stage X-direction widths of the various magnetization segments 114 are either: $\lambda/(2N_t)$ for the two outermost (edge) segments 114 or $\lambda/N_t$ for the interior segments 114, where $N_t$ represents the number of different magnetization directions in magnet array 112 (and $N_t=4$ in the FIG. 5A embodiment); and the magnetization of magnetization segments 114 is mirror symmetric about central Y-Z plane 118. It will be appreciated that with $W_{yx}=N_m\lambda$ and the magnetization of magnetization segments 114 being mirror symmetric about central Y-Z plane 118, the outermost (edge) segments 114 have stage-X axis widths that are half the stage-X axis widths of interior segments 114 and that the outermost edge segments 114 have magnetizations that are oriented in along the stage-Z direction.

Figure 5B:
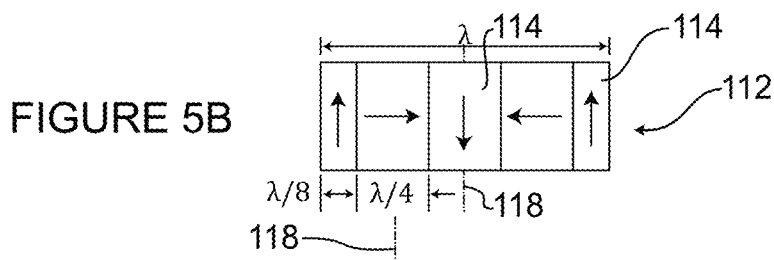

FIG. 5B is another embodiment of a magnet array 112 suitable for use with the FIG. 3 displacement device. The FIG. 5B magnet array 112 has characteristics similar to those of the FIG. 5A magnet array 112, except that $N_m=1$ and $N_t=4$. It can be observed from FIG. 5B that the magnetic spatial period $\lambda$ is defined even where the total stage-X axis width $W_{yx}$ of the magnet array is less than or equal to $\lambda$. In the FIG. 5B case, the magnetization directions of magnetization segments 114 of magnet array 112 may be considered to be spatially periodic in the stage-X direction with a period $\lambda$, even though there is only a single period.

As discussed above, magnet arrays 112 that exhibit the properties of those shown in FIGS. 5A and 5B eliminate or reduce cross-coupling forces from coil traces 126 oriented in stator-X directions. Such characteristics of magnet arrays 112 shown in FIGS. 5A and 5B include: magnet arrays 112 including magnetization segments 114 which are generally elongated in the stage-Y direction with corresponding magnetizations oriented orthogonally to the stage-Y direction; the stage-X dimension width $W_{yx}$ of magnet arrays 112 is $W_{yx}=N_m\lambda$ where $N_m$ is an integer and $\lambda$ is the magnetic period $\lambda$ described above; and magnet arrays 112 are mirror symmetric about a stage Y-Z axis that runs through the center of the stage-X dimension $W_{yx}$ of magnet arrays 112.

Figure 5C:
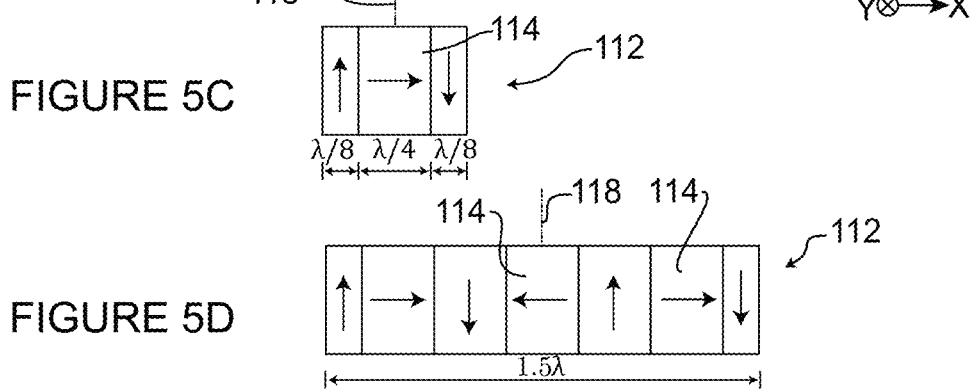
Figure 5D:
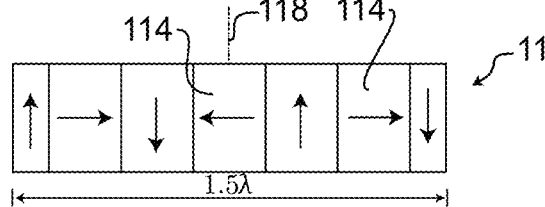

FIGS. 5C and 5D show other embodiments of magnet arrays 112 suitable for use with the FIG. 3 displacement device. In these embodiments, the magnetization directions of magnetization segments 114 have a spatial periodicity with a period (or wavelength) $\lambda$ along the stage-X direction; the width $W_{yx}$ of magnet array 112 in the stage-X direction is given by $W_m=(N_m+0.5)\lambda$ where $N_m$ is a non-negative integer (and $N_m=0$ in the FIG. 5C embodiment and $N_m=1$ in the FIG. 5D embodiment); the magnetization directions of the various magnetization segments 114 are oriented in directions orthogonal to the stage-Y direction; the magnetization of magnetization segments 114 is mirror anti-symmetric about central stage Y-Z plane 118; and the outermost (edge) segments 114 have magnetizations that are oriented in the Z direction and stage-X direction widths of $\lambda/(2N_t)=\lambda/8$ (where $N_t=4$ in the embodiments of both FIGS. 5C and 5D) which are half of the stage-X direction widths $\lambda/N_t=\lambda/4$ for the interior segments 114. In the FIG. 5C case, the magnetization directions of magnetization segments 114 of magnet array 112 may be considered to be spatially periodic in the stage-X direction with a period $\lambda$, even though magnet array 112 exhibits less than a single period $\lambda$.

When the width $W_{yx}$ of magnet array 112 is a non-integer number of magnetic wavelengths λ (as in the case in the embodiments of FIGS. 5C and 5D, for example), then there will be coupling of force or moment to magnet array 112 from current flow in non-aligned coil traces 126 that interact with the magnetic field of array 112. For example, in the case of the Y-magnet arrays 112 shown in FIGS. 5C and 5D (which are mirror anti-symmetric about Y-Z plane 118), there will be coupling of moment in the rotational direction about Z to Y-magnet arrays 112 from current flow in coil traces oriented along the stator-X direction. This net moment can be compensated using suitable control techniques or using suitable arrangements of additional magnetic arrays 112 with different (e.g. opposite) magnetization patterns.

FIGS. 5E-5H show other embodiments of magnet arrays 112 suitable for use with the FIG. 3 displacement device. In these embodiments, the magnetization directions of magnetization segments 114 have a spatial periodicity with a period (or wavelength) λ along the stage-X direction; the width $W_{yx}$ of magnet array 112 in the stage-X direction is given by $W_{yx}=N_m\lambda/2$, where $N_m$ is a positive integer (and $N_m=1$ in the FIG. 5E embodiment, $N_m=2$ in the FIG. 5F embodiment, $N_m=3$ in the FIG. 5G embodiment and $N_m=4$ in the FIG. 5H embodiment); the magnetization directions of the various magnetization segments 114 are oriented in directions orthogonal to the stage-Y direction; and the outermost (edge) segments 114 have magnetizations that are oriented along the stage-X direction and stage-X direction widths of $\lambda/(2N_t)=\lambda/8$ (where $N_t=4$ in the embodiments of FIGS. 5E and 5H) which are half of the stage-X direction widths $\lambda/N_t=\lambda/4$ for the interior segments 114. Note that the central stage Y-Z plane 118 is not explicitly shown in FIGS. 5E-5H. However, it will be appreciated that this stage Y-Z plane 118 divides the stage-X dimension $W_{yx}$ of magnet array 112 in half.

Figure 5E:
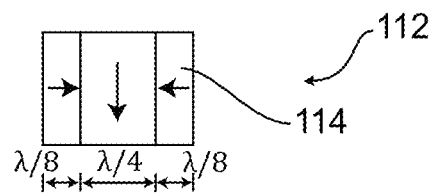
Figure 5F:
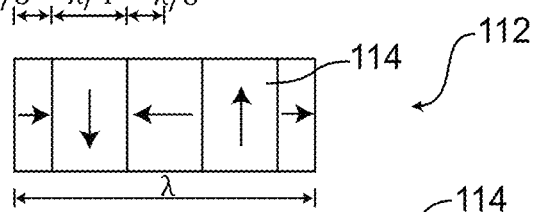
Figure 5G:
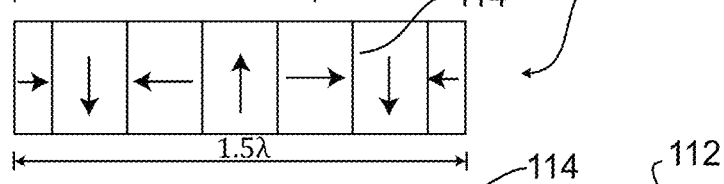

In FIGS. 5E and 5G, the magnetization of magnetization segments 114 is mirror symmetric about central stage Y-Z plane 118, and the width $W_{yx}$ of magnet array 112 in the stage-X direction is not an integer number of spatial periods λ. In the case of Y-magnet arrays 112 shown in FIGS. 5E and 5G, there will be coupling of forces in the stage-Y direction to Y-magnet arrays 112 from current flow in coil traces 126 oriented along the stage-X direction. This net force can be compensated for using suitable control techniques or using suitable arrangements of additional magnetic arrays 112 with different (e.g. opposite) magnetization patterns.

Figure 5H:
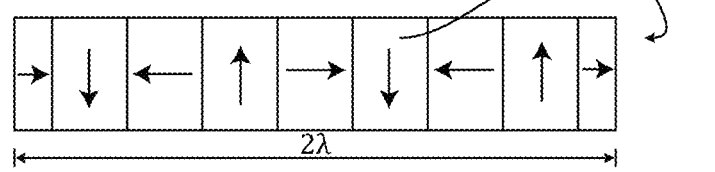
Figure 5I:
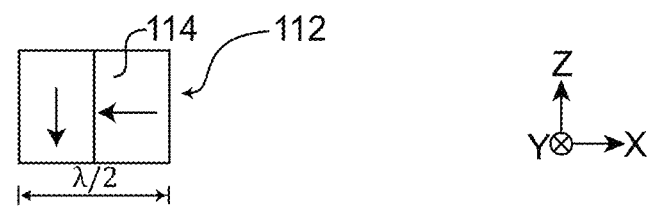
Figure 5J:
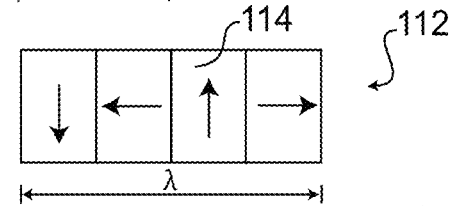
Figure 5K:
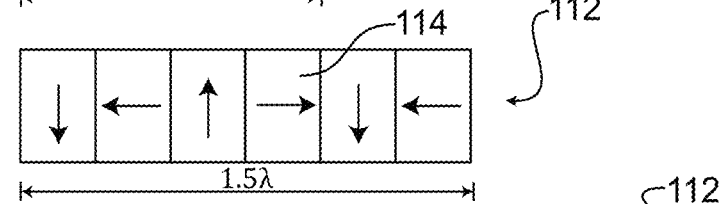
Figure 5L:
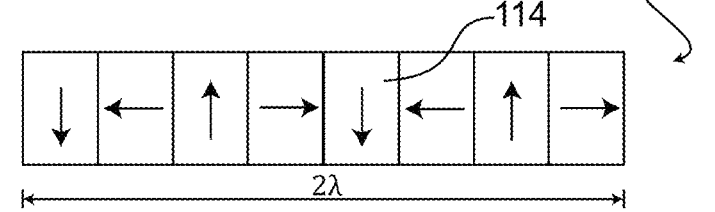

In FIGS. 5F and 5H, the magnetization of magnetization segments 114 is mirror anti-symmetric about central stage Y-Z plane 118, and the width $W_{ux}$ of magnet array 112 in the stage-X direction is an integer number of spatial periods λ. In the case of Y-magnet arrays 112 shown in FIGS. 5F and 5H, there will be coupling of moment in the rotational direction around Z to Y-magnet arrays 112 from current flow in coil traces 126 oriented along the stator-X direction. This net moment can be compensated using suitable control techniques or using suitable arrangements of additional magnetic arrays 112 with different (e.g. opposite) magnetization patterns.

FIGS. 5I-5L show other embodiments of magnet arrays 112 suitable for use with the FIG. 3 displacement device. In these embodiments, the magnetization directions of magnetization segments 114 have a spatial periodicity with a period (or wavelength) λ along the stage-X direction; the width $W_{yx}$ of magnet array 112 in the stage-X direction is given by $W_{yx}=N_m\lambda/2$, where $N_m$ is a positive integer (and $N_m=1$ in the FIG. 5I embodiment, $N_m=2$ in the FIG. 5J embodiment, $N_m=3$ in the FIG. 5K embodiment and $N_m=4$ in the FIG. 5L embodiment); the magnetization directions of the various magnetization segments 114 are oriented in directions orthogonal to the stage-Y direction; and the stage-X direction widths of all of the magnetization segments 114 are $\lambda/N_t$ (where $N_t=4$ in the illustrated embodiments of FIGS. 5I-5L. As the magnetization of magnetization segments in FIGS. 5I-5L is not mirror symmetric about central stage Y-Z plane 118, there will be coupling of moment in the rotational direction around Z to Y-magnet arrays 112 from current flow in coil traces oriented along the stator-X direction. In addition, for the cases in FIGS. 5I and 5K, as the width $W_{yx}$ of magnet array 112 in the stage-X direction is not an integer number of spatial periods λ, there will be coupling of forces in the stator-Y direction to Y-magnet arrays 112 from current flow in coil traces 126 oriented along the stator-X direction. This net force and moment can be compensated using suitable control techniques or using suitable arrangements of additional magnetic arrays 112 with different (e.g. opposite) magnetization patterns.

In some embodiments, Y-magnet arrays 112 of FIGS. 5A-5L may be fabricated from a plurality of contiguous unit Y-magnetization segments 114. Mechanically contiguous Y-magnetization segments 114 that are adjacent to one another in the stage-X direction are in contact with one another along their stage-Y dimensions. Unit Y-magnetization segments 114 may have stage-Y direction lengths $L_{yy}$ and stage-X direction widths $\lambda/(2N_t)$ or $\lambda/(N_t)$ where $N_t$ is the number of magnetization directions in a period λ as discussed above. In some embodiments, Y-magnetization segments 114 having stage-X direction widths $\lambda/(N)$ may be fabricated from a pair of side-by-side magnetization segments 114 having stage-X direction widths $\lambda/(2N_t)$ and having their magnetization directions oriented in the same direction. In some embodiments, the stage-Z direction heights $H_{yz}$ of the unit Y-direction magnetization segments 114 may be same as their stage-X direction widths e.g. $\lambda/(2N_t)$ or $\lambda/(N_t)$.

As discussed above, a central non-magnetic spacer may be provided in magnet arrays 112. In embodiments which are symmetric or mirror symmetric about central stage Y-Z plane 118, such a non-magnetic spacer may divide the central magnetization segment 114 into a pair of "half-width" magnetization segments 114 (i.e. having stage-X direction widths similar to the stage-X direction widths of the edge segments 114). The resultant magnet arrays 118 remain symmetric or mirror symmetric about a central stage Y-Z plane 118. In embodiments which are not symmetric about a central stage Y-Z plane 118, different patterns may be used.

FIGS. 6A-6L show magnet arrays 112 suitable for use with the FIG. 3 displacement device 100 in accordance with particular embodiments. The magnet arrays 112 of FIGS. 6A-6L have features similar to those of magnet arrays 112 of FIGS. 5A-5L, except that the magnet arrays 112 of FIGS. 6A-6L include non-magnetic spacers 136 centrally located (in their stage-X dimensions $W_{yx}$). Spacers 136 (of the Y-magnet arrays 112 shown in FIGS. 6A-6L) may be provided with a stage-X direction width g which is at least approximately equal to $$g = \left(\frac{N_g}{5} + \frac{1}{10}\right)\lambda,$$

where $N_g$ is a non-negative integer number. When the width g of spacers 136 exhibits this property, spacers 136 will have an attenuating (cancelling) effect on disturbance torques and/or forces created by the 5$^{th}$ order harmonic field of magnet array 112. In general, the width g of the non-magnetic spacer 136 may be set to be at least approximately equal to $$= \left(\frac{N_g}{k} + \frac{1}{2k}\right)\lambda,$$

where $N_g$ has the above described properties and k is the order of the harmonic of the magnetic field to be attenuated. In some embodiments, spacers 136 (of the Y-magnet arrays 112 shown in FIGS. 6A-6L) may be provided with a stage-X direction width g which is at least approximately equal to $$g = \frac{K_g}{5}\lambda - W_c,$$

where $K_g$ is a non-negative integer number and $W_c$ is the stator-X direction width of coil traces 126 generally elongated in stator-Y direction. When the width g of spacers 136 exhibits this property, spacers 136 will have an attenuating (cancelling) effect on disturbance torques and/or forces created by the 5$^{th}$ order harmonic field of magnet array 112. In general, the width g of the non-magnetic spacer 136 may be set to be at least approximately equal to $$= \frac{K_g}{k}\lambda - W_c,$$

where $K_g$ and $W_c$ have the above described properties and k is the order of the harmonic of the magnetic field to be attenuated.

Figure 6A:
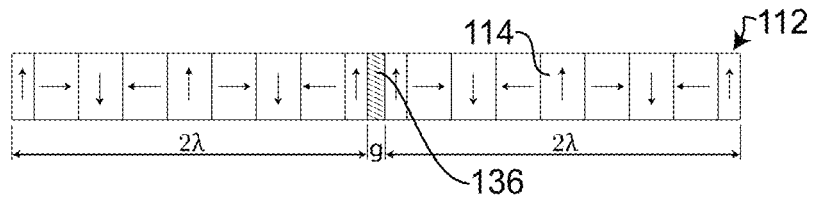
FIGS. 6A-6L show additional details of magnet arrays suitable for use with any of the displacement devices described herein in accordance with particular embodiments.
Figure 6B:
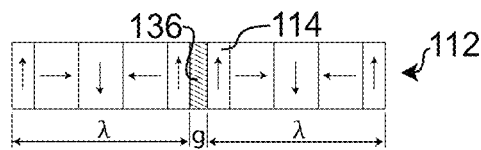

The magnet array 112 embodiments shown in FIGS. 6A and 6B have two sides arranged on either stage-X direction side of non-magnetic spacer 136. Both the left and right sides (in the illustrated view) of the FIG. 6A magnet array 112 have magnetization patterns similar to those of magnet array 112 of FIG. 5A; and both the left and right sides of the FIG. 6B magnet array 112 have magnetization patterns similar to those of magnet array 112 of FIG. 5B. The stage-X direction width $W_{side}$ of each side of the magnet arrays 112 of FIGS. 6A and 6B (i.e. the stage-X direction distance between an edge of array 112 and the edge of non-magnetic spacer 136) is $W_{side}=N_m\lambda$ where $N_m$ is a positive integer and the total stage-X direction width of the magnet arrays 112 of FIGS. 6A and 6B is $W_{yx}=2N_m\lambda+g$, where $N_m=2$ in FIG. 6A and $N_m=1$ in FIG. 6B.

Figure 6C:
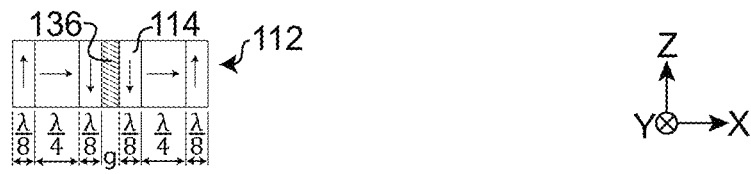
Figure 6D:
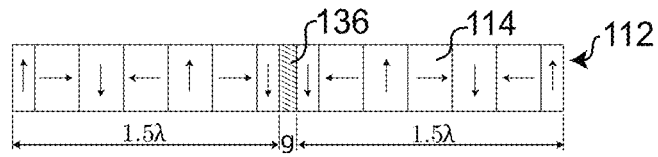
Figure 6E:
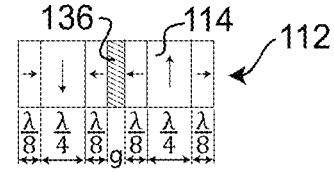
Figure 6F:
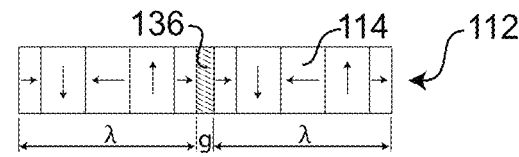
Figure 6G:
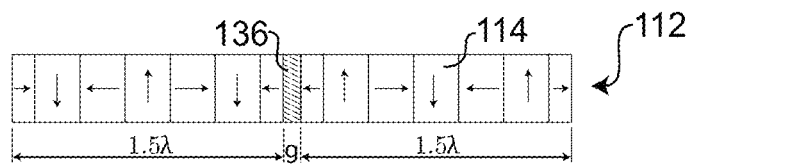
Figure 6H:
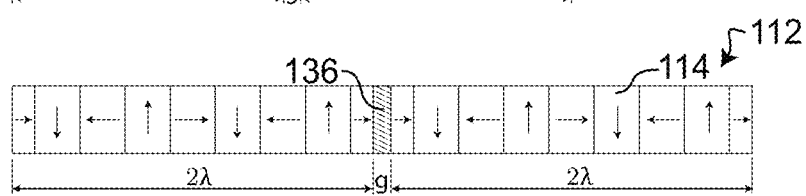
Figure 6I:
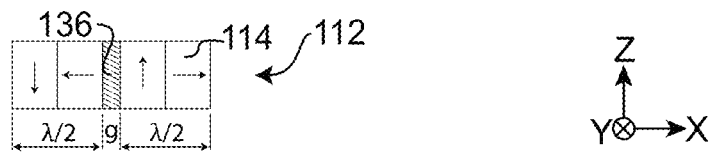
Figure 6J:
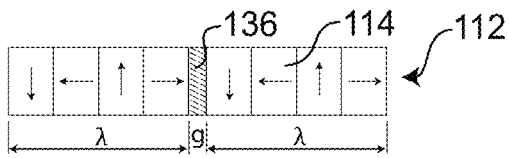
Figure 6K:
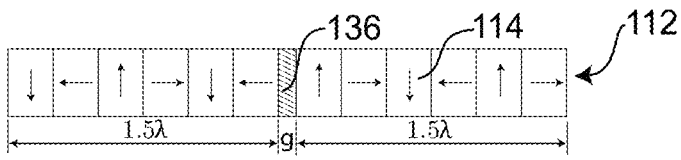
Figure 6L:
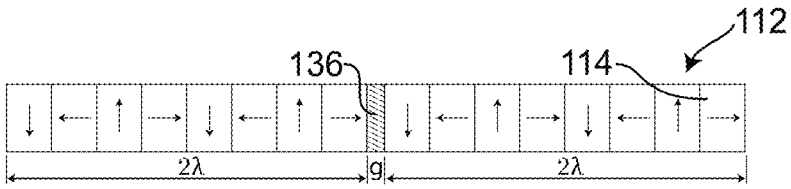

The magnet array 112 embodiments shown in FIGS. 6C and 6D have two sides arranged on either stage-X direction side of non-magnetic spacer 136. The left (in the illustrated view) sides of magnet arrays 112 shown in FIGS. 6C and 6D have magnetization patterns similar to those of magnet arrays 112 shown in FIGS. 5C and 5D respectively. The right (in the illustrated view) sides of magnet arrays 112 shown in FIGS. 6C and 6D have magnetization patterns that are opposite those of the left sides—i.e. as if the left side of the magnet array 112 was duplicated in the location of the right side of the magnet array 112 and then each individual magnetization segment 114 in the right side of the magnet array 112 was rotated 180° about its own central axis along which it is linearly elongated. The stage-X direction width $W_{side}$ of each side of the magnet arrays 112 of FIGS. 6C and 6D is $W_{side}=(N_m-0.5)\lambda$ where $N_m$ is a positive integer and the total stage-X direction width of the magnet arrays 112 of FIGS. 6C and 6D is $W_{yx}=(2N_m-1)\lambda+g$, where $N_m=1$ in FIG. 6C and $N_m=2$ in FIG. 6D.

Similarly, the magnet array 112 shown in FIGS. 6E, 6G, 6I, 6K have two sides arranged on either stage-X direction side of non-magnetic spacer 136, with their respective left (in the illustrated view) sides having magnetization patterns similar to FIGS. 5E, 5G, 5I, 5K magnet array 112 and their respective right (in the illustrated view) sides having magnetization patterns that are the opposite to those of the left (in the illustrated view) sides, where "opposite" has the same meaning as discussed above for the case of FIGS. 6C and 6D. The stage-X direction widths $W_{side}$ of each side of the magnet arrays 112 of FIGS. 6E, 6G, 6I, 6K is $W_{side}=(N_m-0.5))\lambda$ where $N_m$ is a positive integer and the total stage-X direction width of the magnet arrays 112 of FIGS. 6E, 6G, 6I, 6K is $W_{yx}=(2N_m-1)\lambda+g$, where $N_m=1$ in FIG. 6E, $N_m=2$ in FIG. 6G, $N_m=1$ in FIG. 6I, $N_m=2$ in FIG. 6K.

The magnet arrays 112 shown in FIGS. 6F, 6H, 6J, 6L have two sides arranged on either stage-X direction side of non-magnetic spacer 136, with both their left and right sides having magnetization patterns similar to those of magnet arrays 112 of FIGS. 5F, 5H, 5J, 5L, respectively. The stage-X direction width $W_{side}$ of each side of the magnet arrays 112 of FIGS. 6F, 6H, 6J, 6L is $W_{side}=N_m\lambda$ where $N_m$ is a positive integer and the total stage-X direction width of the magnet arrays 112 of FIGS. 6F, 6H, 6J, 6L is $W_{yx}=2N_m\lambda+g$, where $N_m=1$ in FIG. 6F, $N_m=2$ in FIG. 6H, $N_m=1$ in FIG. 6J, $N_m=2$ in FIG. 6L. The magnet arrays 112 shown in FIGS. 6A-6L may be fabricated in a manner similar to that described above for FIGS. 5A-5L.

Layout of Magnet Arrays

Figure 7A:
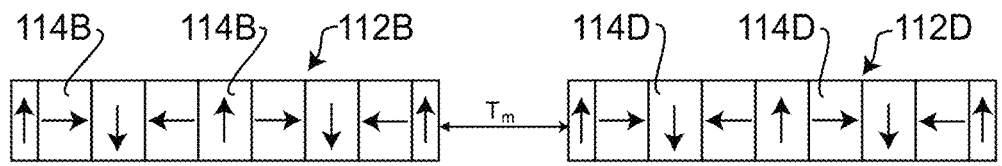
FIGS. 7A and 7B are schematic cross-sectional views of pairs of parallel adjacent magnet arrays according to particular embodiments suitable for use with any of the displacement devices described herein.
Figure 7B:
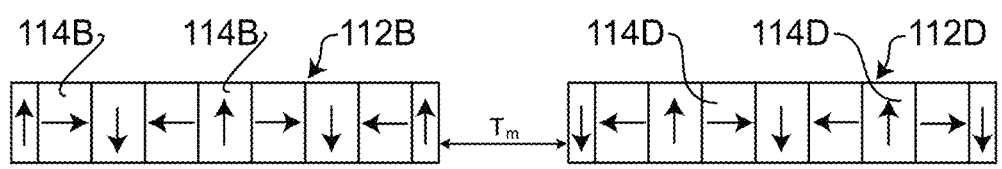

As discussed above, FIGS. 4A and 4B show layouts of the magnet arrays 112 which may be used in movable stage 110 of displacement device 100 in accordance with particular embodiments. In accordance with particular embodiments, when arranging magnet arrays 112 on movable stage 110, the spacing between corresponding Y-oriented edges of X-magnet arrays 112A, 112C (i.e. Y-oriented edges on the same respective sides of the arrays) may be given by $W_{xy}+N_x$ and (in the case of the FIG. 4 embodiment), this spacing may be given by $$W_{xy} + T_x = N_S\frac{\lambda}{2}$$

where $N_S$ is a positive integer and a, is the magnetic period of the X-magnet arrays 112A, 112C. Similarly, in accordance with particular embodiments, the spacing between corresponding X-oriented edges of Y-magnet arrays 112B, 112D (i.e. X-oriented edges on the same respective sides of the arrays) may be given by $W_{yx}+T_y$ and (in the case of the FIG. 4 embodiment), this spacing may be given by $$W_{yx} + T_y = N_S\frac{\lambda}{2}$$

where $N_S$ is a positive integer and $\lambda$ is the magnetic period of the Y-magnet arrays 112B, 112D. Where the spacing of adjacent parallel magnet arrays 112 (e.g. a pair of X-magnet arrays 112, such as X-magnet array 112A and X-magnet array 112C in the case of the FIG. 4 embodiment and/or a pair of Y-magnet arrays 112, such as Y-magnet arrays 112B and Y-magnet arrays 112D, in the case of the FIG. 4 embodiment) are designed to have this feature, then the current distribution in the active coil traces 126 for each parallel magnet array 112 can be substantially similar in spatial distribution (i.e. in phase), provided that the parallel magnet arrays 112 have the same magnetization pattern (FIG. 7A) and $N_S$ is even or the parallel magnet arrays 112 have opposite magnetization patterns (FIG. 7B) and $N_S$ is odd.

In some embodiments, two parallel magnet arrays 112 on movable stage 110 (e.g. a pair of X-magnet arrays 112, such as X-magnet arrays 112A,112C in the case of the FIG. 4 embodiment and/or a pair of Y-magnet arrays 112, such as Y-magnet arrays 112B, 112D in the case of the FIG. 4 embodiment) may comprise magnetization segments 114 with magnetization orientations that are the same as one another. This characteristic is shown, for example, in FIG. 7A where Y-magnet array 112B and Y-magnet array 112D comprise magnetization segments 114B, 114D with magnetization orientations that are the same as one another. In some embodiments, two parallel magnet arrays 112 on movable stage 110 may comprise magnetization segments 114 with magnetization orientations that are the opposites of one another—i.e. as if each magnetization segment 114 is individually rotated 180° about a corresponding central axis along which it is linearly elongated. This characteristic is shown, for example, in FIG. 7B, where magnet array 112B and magnet array 112D comprise magnetization segments 114B, 114D with magnetization orientations that are opposite to one another.

In some embodiments, the elongated dimensions $L_{xx}$, $L_{yy}$ of magnet arrays 112 shown in FIGS. 4A and 4B is set at least approximately equal to $L_m = L_{xx} = L_{yy} = N_L \lambda$, where $N_L$ is a positive integer number and $\lambda$ is the magnetic period. Where magnet arrays 112 exhibit this characteristic, there will be a further reduction in the coupling force generated between a magnet array 112 and current flowing in coil traces 126 in directions orthogonal to the elongated dimension of magnet array 112.

The layout of magnet arrays 112 shown in FIGS. 4A and 4B is not the only possible layout for magnet arrays 112 that could be used for movable stage 110 of the FIG. 3 displacement device 100. More particularly, another possible layout of magnet arrays 112 suitable for use in movable stage 110 of the FIG. 3 displacement device 100 is shown in FIG. 8.

Figure 8:
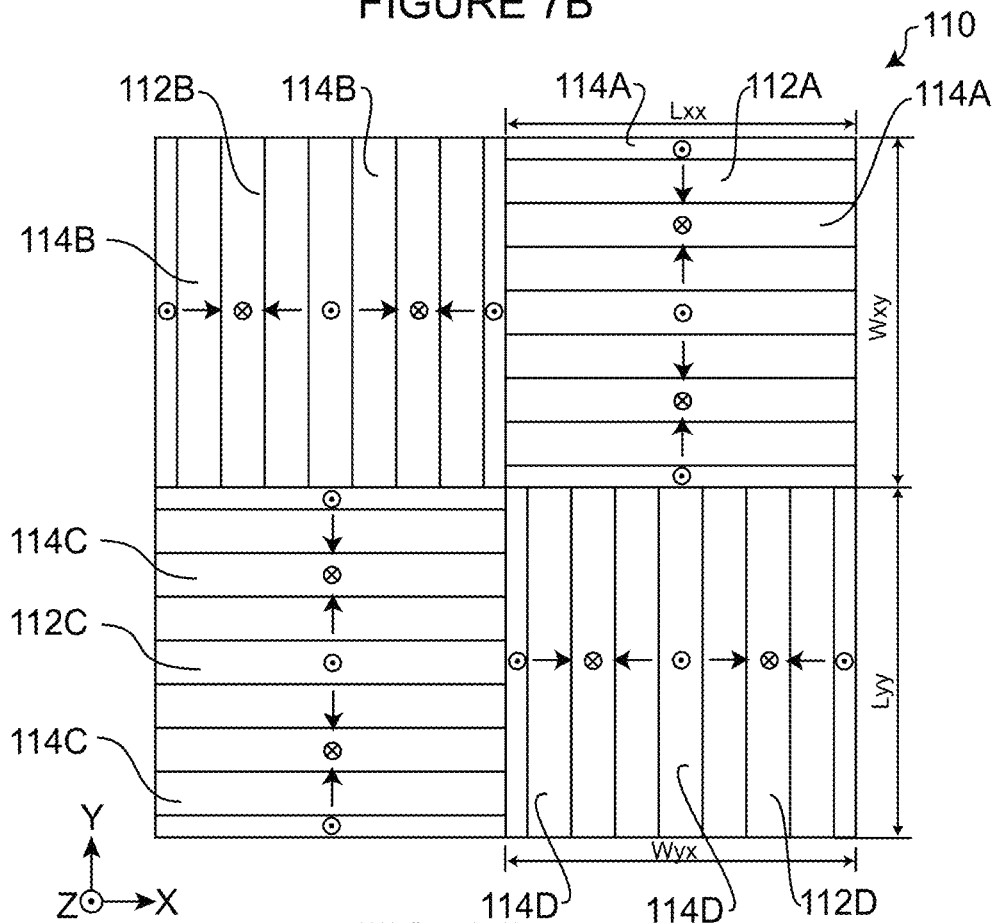
FIG. 8 is a schematic cross-sectional view of layouts of magnet arrays which may be used in any of the displacement devices described herein in accordance with other embodiments.

FIG. 8 shows a schematic cross-sectional view of layout of magnet arrays 112A, 112B, 112C, 112D which may be used for movable stage 110 of the FIG. 3 displacement device 100 in accordance with a particular non-limiting embodiment. The FIG. 8 layout of magnet arrays 112 differs from the FIG. 4 layout of magnet arrays 112 because magnet arrays 112 are shaped (e.g. as squares) such that non-magnetic region 113 is eliminated and all of the undersurface area of movable stage 110 is occupied by magnet arrays 112. In other words, the two X-magnet arrays 112A, 112C of the FIG. 8 embodiment and the two Y-magnet arrays 112B, 112D of the FIG. 8 embodiment have no space between their proximate elongation direction oriented edges, so that $T_x=0$ and $T_x=0$, where $T_x$ and $T_y$ have the meanings described above in connection with FIG. 4. In the illustrated embodiment of FIG. 8, each magnet array 112 comprises a pattern of magnetization segments 114 having the characteristics of those shown in FIG. 5A, although it will be appreciated that magnet arrays 112 of the FIG. 8 layout could be provided with magnetization segments 114 exhibiting characteristics of any of the magnet arrays 112 and/or magnetization segments 114 described herein e.g. exhibiting any of the magnetization patterns shown in FIGS. 3, 4, 5A-5L and/or 6A-6L.

The characteristics of each individual magnet array 112 in the layouts of FIG. 8 (e.g. the orientations of magnetization segments 114, the elongated dimension lengths $L_{xx}$, $L_{yy}$, the widths $W_{xy}$, $W_{yx}$ and the like) can be similar to any of those described herein e.g. exhibiting any of the magnetization patterns shown in FIGS. 5A-5L and 6A-6L.

2D Array of Magnetic Field Sensors

Figure 9:
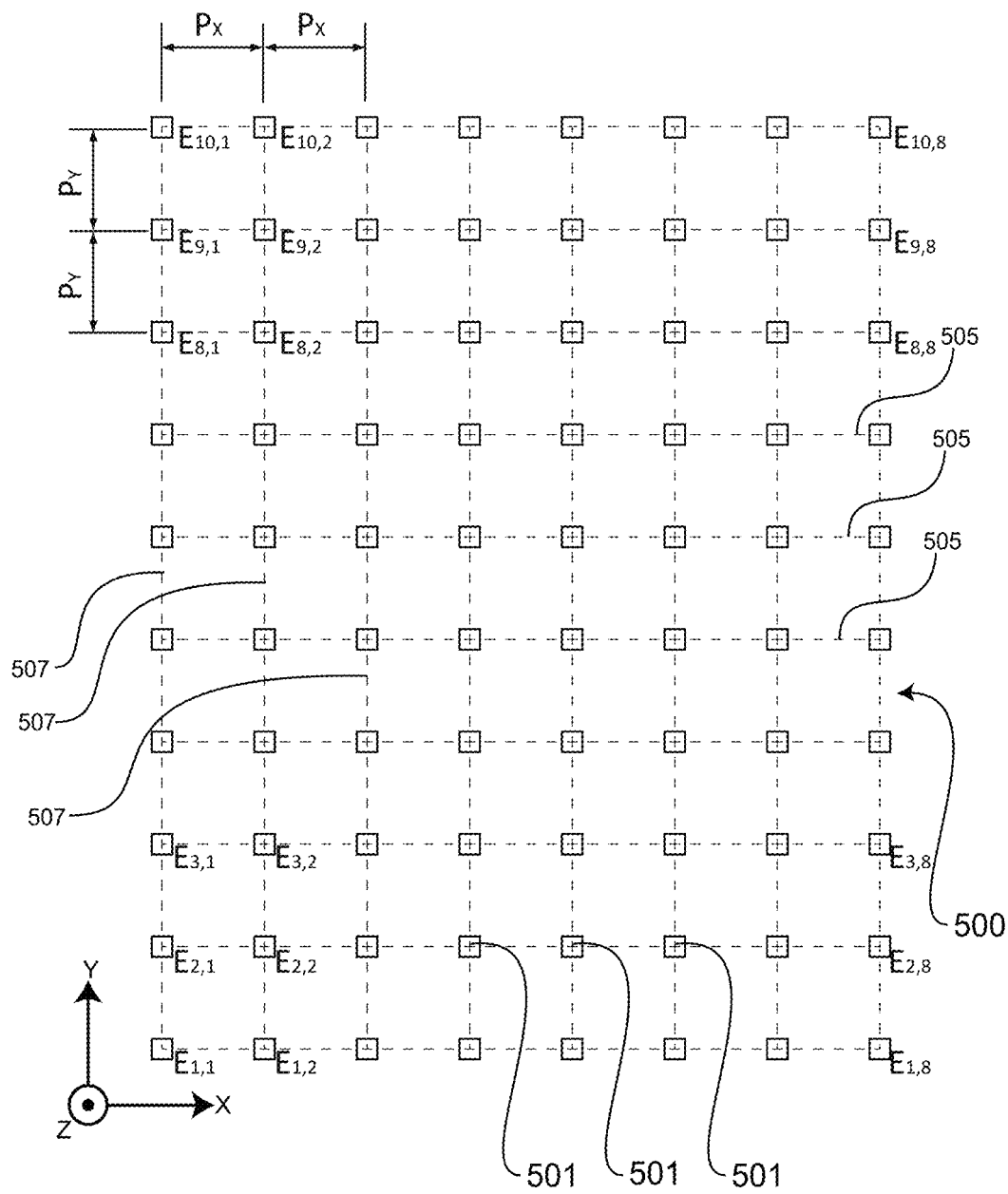
FIG. 9 is a schematic cross-sectional view of a sensor array which may be used with any of the displacement devices described herein in particular embodiments.

FIG. 9 depicts sensor array 500 and the distribution of magnetic field sensors 501 in more detail. Sensors 501 of sensor array 500 in the FIG. 9 embodiment are generally located at the intersection points between equally spaced, generally parallel lines 505 oriented in a first extension direction (e.g. the stator-X direction) and equally spaced, generally parallel lines 507 oriented in a second extension direction (e.g. the stator Y-direction). It may be desirable to have the first extension direction (lines 505) and the second extension direction (lines 507) of array 500 be orthogonal to each other. However, generally, the two extension directions of sensor array 500 can be in any non-parallel relation. In the illustrated embodiment, sensors 501 in array 500 are arranged stator-X oriented sensor rows and stator-Y oriented sensor columns, where: sensors in a stator-X oriented sensor row are generally aligned with one another along a corresponding line 505 (e.g. along a corresponding stator-X direction) with each adjacent pair of sensors 501 in the stator X-oriented sensor row separated from one another by a pitch $P_x$; and sensors in a stator-Y oriented sensor column are generally aligned with one another along a corresponding line 507 (e.g. along a corresponding stator-Y direction) with each adjacent pair of sensors 501 in the stator Y-oriented sensor column separated from one another by a pitch $P_y$. Sensors 501 in array 500 of the FIG. 9 embodiment for a 2D array may be labelled $E_{i,j}$, where i is the row index (indicating a sensor's location in the stator-Y direction) and j is the column index (indicating the sensors's location in the stator-X direction). In some embodiments, sensors 501 may be distributed over the working region 124 of stator 120.

In some embodiments, the pitches $P_x$ and $P_y$ are set in general accordance with $$P_X = n\lambda_X/N \qquad (1a)$$

$$P_Y = m\lambda_Y/M \qquad (1b)$$

where $\lambda_X$ is the stage-X oriented magnetic spatial period of Y-magnet arrays 112 (e.g. arrays 112B, 112D); $\lambda_Y$ is the stage-Y oriented magnetic spatial period of X-magnet arrays 112 (e.g. arrays 112A, 112C); n, m, N and M are positive integer numbers; n, N selected such that $$\frac{n}{N}$$

is not an integer; and m, M selected such that $$\frac{m}{M}$$

is not an integer. For example, $P_X$ can be set at $\lambda_X/2$, or $3\lambda_X/2$, or $5\lambda_X/2$, or $\lambda_X/3$, or $2\lambda_X/3$, or $4\lambda_X/3$, or $5\lambda_X/3$, or $7\lambda_X/3$, or $\lambda_X/4$ or $3\lambda_X/4$, and so on; $P_Y$ can be set at $\lambda_Y/2$, or $3\lambda_Y/2$, or $5\lambda_Y/2$, or $\lambda_Y/3$, or $2\lambda_Y/3$, or $4\lambda_Y/3$, or $5\lambda_Y/3$, or $7\lambda_Y/3$, or $\lambda_Y/4$, or $3\lambda_Y/4$, and so on. As described in more detail below, this selection of the relationship between sensor pitches $P_x$, $P_y$ and magnetic periods $\lambda_X$, $\lambda_Y$ (together with suitable selection of widths of magnet arrays 112 e.g. Y-magnet array width $W_{yx}=N_{my}\lambda_x$ and X-magnet array width $W_{xy}=N_{mx}\lambda_y$, $N_{my}$ and $N_{mx}$ are positive integers) may permit synchronous summing/averaging of sensor rows/columns which may aid in position detection; may permit sums/averages of stator-X oriented sensor rows to be insensitive to Y-magnet arrays (e.g. Y-magnet arrays 112B, 112D), and accordingly permit determination of the position of X-magnet magnet arrays (e.g. magnet arrays 112A, 112C) without impact from the fields of Y-magnet arrays; and may permit sums/averages of stator-Y oriented sensor columns to be insensitive to X-magnet arrays (e.g. X-magnet arrays 112A, 112C), and accordingly permit determination of the position of Y-magnet magnet arrays (e.g. magnet arrays 112B, 112D) without impact from the fields of X-magnet arrays. In some embodiments at least two of the stator-X direction rows (e.g. rows oriented along lines 505) are spaced apart from each other by a distance of $\frac{1}{4}\lambda_Y$ in the stator-Y direction. Similarly, in some embodiments, at least two of the stator-Y direction columns (e.g. columns oriented along lines 507) are spaced apart from each other by a distance of $\frac{1}{4}\lambda_x$ in the stator-X direction. In some embodiments at least two of the stator-X direction rows (e.g. rows oriented along lines 505) are spaced apart from each other by a distance of $g\frac{1}{4}\lambda_Y$ in the stator-Y direction where g is an odd integer greater than zero. Similarly, in some embodiments, at least two of the stator-Y direction columns (e.g. columns oriented along lines 507) are spaced apart from each other by a distance of $h\frac{1}{4}\lambda_x$ in the stator-X direction where h is an odd integer greater than zero.

Figure 10:
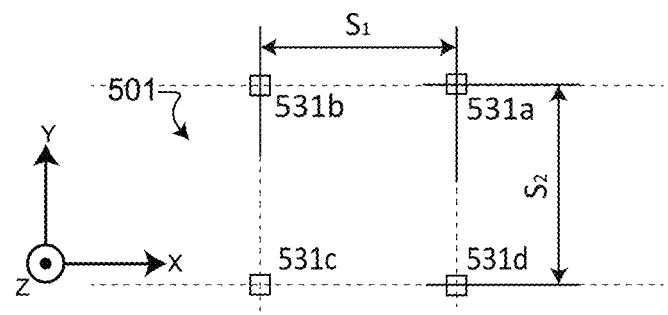
FIG. 10 is a schematic depiction of a particular sensor comprising a plurality of sensor sub-units according to a particular embodiment.

In some embodiments, each magnetic field sensor $E_{i,j}$ may contain several sub-units. FIG. 10 shows one particular embodiment of a sensor 501 comprising a plurality (e.g. 4) of sub-units 531a, 531b, 531c, 531d (collectively and individually, sub-units 531). Sensor 501 of FIG. 10 may form one of the sensors 501 in array 500 of FIGS. 3F and 9, for example. Each sub-unit 531 is capable of measuring magnetic field flux density in one to three non-parallel directions. In some embodiments, the stator-Y direction distance $S_2$ between sub-units 531a and 531d may be selected to conform generally with $$S_2 = \lambda_Y\left(\frac{v}{5} + \frac{1}{10}\right),$$

where v is a suitable non-negative integer. In some embodiments, the stator-X direction distance $S_1$ between sub-units 531b and 531a may be selected to conform generally with $$S_1 = \lambda_X\left(\frac{v}{5} + \frac{1}{10}\right),$$

where v is a suitable non-negative integer number. The output of the FIG. 10 sensor 501 may comprise a sum and/or average of the outputs from its sub-units 531 it will be appreciated that determining an average typically comprises determining a sum. This means that the output of the FIG. 10 sensor 501 provides a sum/average value of magnetic field intensity at a plurality (e.g. 4) discrete points. The summing/averaging operation can be either performed by a digital computing device (e.g. controller 504) or by an analog circuit. By setting $S_1$ to conform generally with $$S_1 = \lambda_X\left(\frac{v}{K} + \frac{1}{2K}\right),$$

the sum/average value of four sub-units 531 will filter off the magnetic field distortion of $K^{th}$ order harmonics from Y-magnet arrays, where v is a non-negative integer and K is an integer greater than 1; and by setting $S_2$ to conform generally with $$S_2 = \lambda_Y\left(\frac{v}{K} + \frac{1}{2K}\right),$$

the sum/average value of four sub-units 531 will filter off the magnetic field distortion of $K^{th}$ order harmonics from X-magnet arrays, where v is a non-negative integer and K is an integer greater than 1. Where sensors 501 comprise multiple sub-units 531, the pitches $P_x$, $P_y$ or other references to the spacing or distance between sensors may be interpreted to be the distance between the geometric center points of the plurality of the sub-units 531 that make up sensors 501.

Figure 11A:
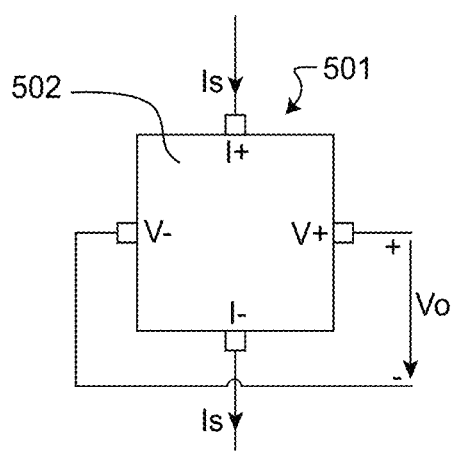
FIGS. 11A-11C show various techniques for extracting measurement signals from sensors (e.g. hall-effect sensors) which may be used in particular embodiments.
Figure 11B:
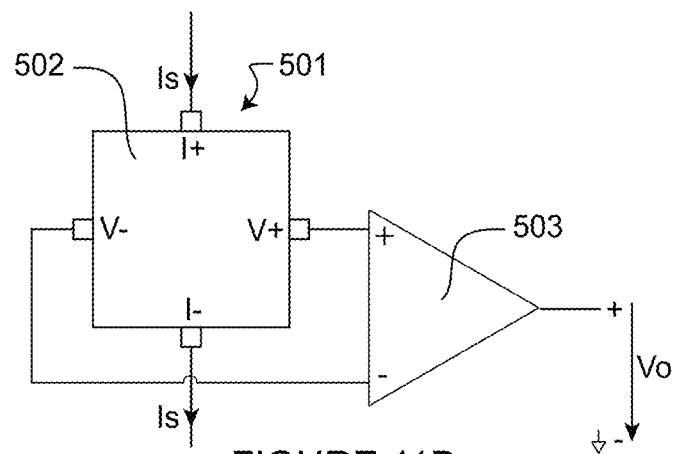
Figure 11C:
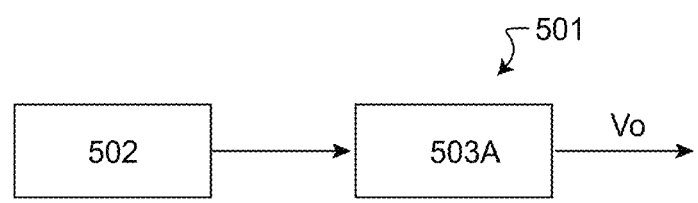

FIGS. 11A-11C show various techniques for extracting measurement signals from sensors 501 which may be used in particular embodiments. In FIG. 11A, sensor 501 comprises a raw hall-effect sensor element 502 excited with a suitable excitation current $I_s$. The output voltage $V_o$ of the FIG. 11A magnetic field sensor 501 is a voltage potential difference (differential format) of two terminals of the hall-effect sensor element 502. Hall-effect sensor element 502 comprise four terminals, I+, I−, V+, V−. The I+ and I− are connected to a voltage or current source so that a bias current $I_s$ can flow from I+ to I−. The V+ and V− are output voltage terminals, and their voltage potential difference $V_o$ is proportional to externally applied magnetic field flux density. In FIG. 11B, magnetic field sensor 501 comprises a raw hall-effect sensor element 502 (similar to that of FIG. 11A), a suitable amplifier 503 and other suitable electronics circuits such as excitation current supply (not shown) for hall-effect sensor element 502 and voltage supply for amplifier 503 (not shown). The output $V_o$ of the FIG. 11B magnetic field sensor 501 is the output voltage of amplifier 503 reference to a ground (or to some other suitable reference). Amplifier 503 can be a differential amplifier or an instrument amplifier or other type of suitable amplifier. In FIG. 11C, a general structure of a magnetic field sensor 501 is shown. Magnetic field sensor 501 comprises a magnetic field sensing element 502 and a suitable processing circuit 503A. The output of the FIG. 11C sensor 501 can be in a format of analog voltage (a differential voltage or a ground-referenced voltage), analog current, or a digital signal according to a transmission protocol such as but not limited to SPI or I2C. In some particular embodiment, processing circuit 503A can be as simple as two lines, as shown in FIG. 11A. Magnetic field sensing element 502 can be a hall-effect sensor element, a magneto-resistive sensing element, or a magneto-strictive sensing element, or any suitable sensor element that is sensitive to magnetic field flux density.

One consideration associated with the 2-D grid layout 500 of sensors 501 (e.g. of the embodiments shown in FIGS. 3F and 9) is the potentially large number of outputs to be processed. By way of non-limiting example only, a 30 by 30 sensor array 500 contains 900 sensors and 900 corresponding outputs and each output can be a scalar or a vector of length 2 to 3, depending on the number of magnetic field directions that each sensor 501 can measure. To reduce the number of outputs to be processed and simplify the output signal processing and/or to otherwise aggregate outputs from various sensors 501, the sum and/or average of sensors 501 in each stator-X oriented sensor row and each stator-Y oriented sensor column can be used, instead of processing the output of each sensor 501 directly. It will be appreciated that determining an average typically comprises determining a sum. In some embodiments, controller 504 is configured (e.g. programmed) to determine the stator-X direction position of movable stage 110 based on the sum and/or average of sensors 501 in each of a plurality of stator-Y oriented sensor columns. Controller 504 may be additionally or alternatively configured to determine the stator-Y direction position of movable stage 110 based on the sum and/or average of sensors 501 in each of a plurality of stator X-oriented sensor rows.

Mathematically, we can convert the outputs of sensors 501 outputs according to column averaging $$A_{Y,j} = \frac{1}{N_Y} \sum_{i=1}^{N_Y} E_{i,j} \quad (2a)$$

row averaging $$A_{X,i} = \frac{1}{N_X} \sum_{j=1}^{N_X} E_{i,j} \quad (2b)$$

where $A_{X,i}$ is the average of the outputs of an $i^{th}$ group sensors 501 distributed along the first extension direction (e.g. the average of the outputs of sensors 501 in the $i^{th}$ stator-X oriented sensor row), $N_X$ is the number of sensors 501 in the $i^{th}$ group/row, $A_{Y,j}$ is the average of the outputs of at group of sensors 501 distributed along the second extension direction (e.g. the average of the outputs of sensors 501 in the $i^{th}$ stator-Y oriented sensor column), and $N_Y$ is the number of sensors 501 in the $i^{th}$ group/column. It will be appreciated that summing these outputs is involved in computing these averages and may be performed using similar equations, but without dividing by $N_x$ or $N_y$. One non-limiting method of setting $N_x$ and $N_y$ comprises selecting $N_x*P_x$ to be greater than or equal to the stage-X direction length $L_{xx}$ of a X-magnet array, and $N_y*P_y$ is greater than the stage-Y direction length $L_{yy}$ of a Y-magnet array, as described in more detail below. In the example described above, this summing and/or averaging reduces the original 900 outputs $E_{i,j}$ (i=1 . . . 30, j=1, . . . 30) to 60 outputs: $A_{X,i}$ (i=1, . . . , 30) and $A_{Y,j}$ (j=1, . . . , 30). As a result, the number of outputs to be processed is significantly reduced. It should be noted that there can be any number of groups of sensors 501 distributed along the first extension direction (e.g. stator-X oriented sensor rows) and/or any number of groups of sensors 501 distributed along the second extension direction (e.g. stator-Y oriented sensor columns) and that the number of groups in each extension direction do not have to be equal to one another.

Figure 12A:
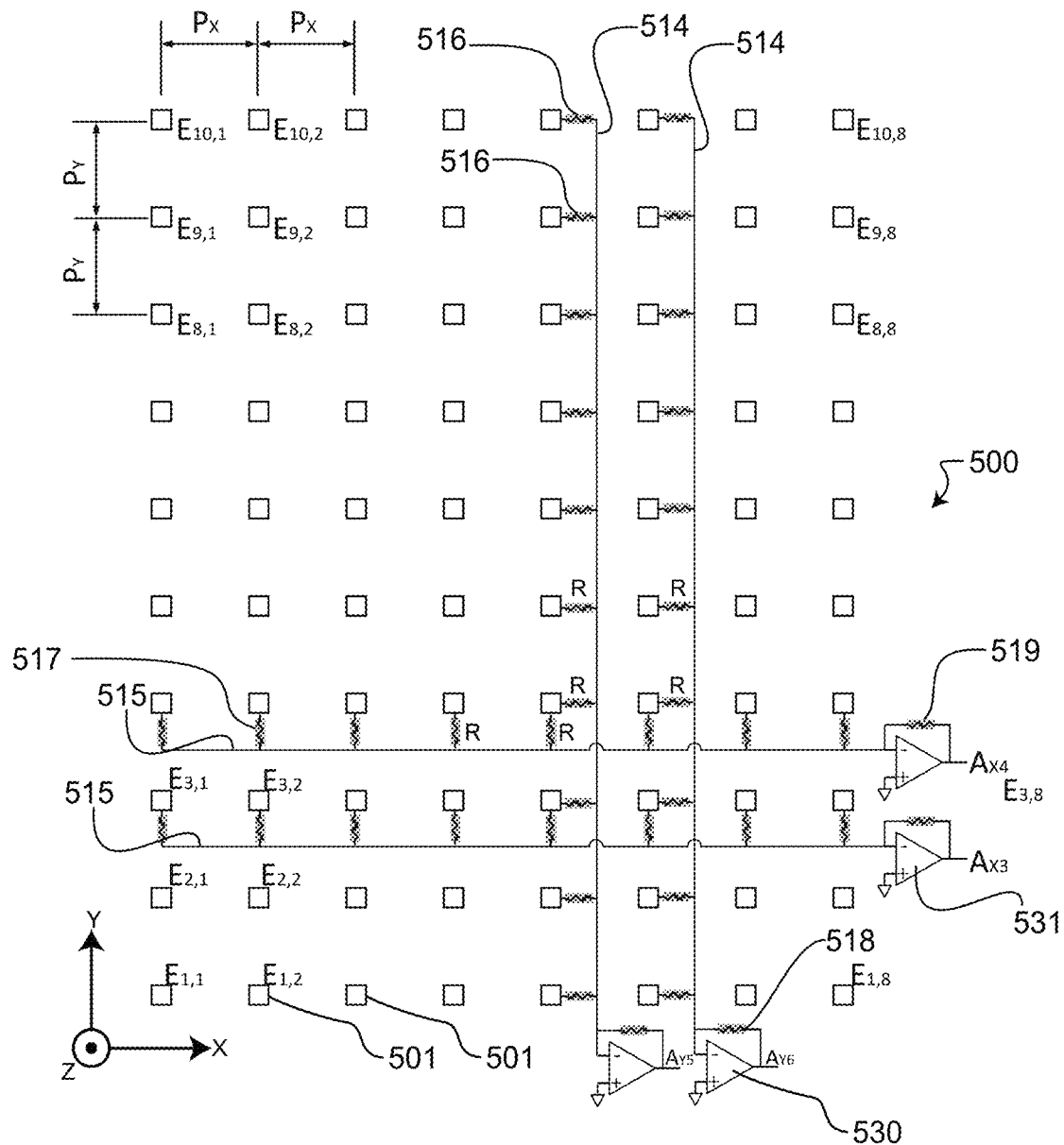
FIGS. 12A-12B illustrate arrays of field sensing elements with different embodiments of column summing/averaging operations and row summing/averaging operations implemented by analog circuits on some rows and columns.

For brevity, the remainder of this description refers to the summing/averaging over groups of sensors in the first and second extension directions as summing/averaging over rows and columns, without loss of generality. The column and row summing/averaging operation for sensors 501 can be implemented either digitally (e.g. by controller 504) or by suitable analog circuitry. FIG. 12A shows one non-limiting embodiment of such column and row summing/averaging operations implemented by analog circuitry. For clarity, FIG. 12A only expressly depicts the circuits for the $5^{th}$ and $6^{th}$ stator-Y oriented sensor columns and the $3^{rd}$ and $4^{th}$ stator-X oriented sensor rows, it being understood that other stator-X oriented rows and other stator-Y oriented columns can be summed/averaged in a similar way. Each resistor value R may have slightly different value in order to precisely compensate the response (i.e. calibrate) for non-uniformity among sensors 501. Each sensor 501 may be connected to (or comprise) an associated analog circuit, for purposes of: buffering its output, adjusting its offset, or adjusting its scaling factor, and/or converting its output between a differential voltage signal and a single-ended voltage signal. It should be noted that the sensors 501 and associated circuitry of FIG. 12A can be implemented on a rigid or flexible printed circuit board (where all the sensors 501, resistors, and operational amplifiers are installed); such a printed circuit board can be one of the same printed circuit board(s) used for implementing the stator coil assembly or a different printed circuit board bonded to one of the printed circuit board(s) used to implement the stator coil assembly, with epoxy, for example.

In one embodiment, each stator-Y oriented column summing trace 514 in FIG. 12A is coincident with or close to a stator-Y oriented line associated with each stator-Y oriented column; each stator-X oriented row summing trace 515 in FIG. 12A is coincident with or close to a stator-X oriented line associated with each stator-X oriented row. In the particular case of FIG. 12A, the stator-Y oriented column summing trace 514 for the sensors $E_{i,5}$ (i=1, . . . 30) in the $5^{th}$ stator-Y oriented column may go through or close to the centers of the sensing elements of the sensors $E_{i,5}$ (i=1, . . . 30) in the $5^{th}$ stator-Y oriented column; and the stator-X oriented row summing trace 515 for the sensors $E_{3,j}$ (j=1, . . . 30) in the $3^{rd}$ stator-X oriented row may go through or close to the centers of sensing elements of the sensors $E_{3,j}$ (j=1, . . . 30) in the $3^{rd}$ stator-X oriented row. Here the centers of the sensing elements of the sensors may be understood to mean the geometric center of a raw hall-effect sensor element.

When a Y-magnet array 112B, 112D travels in stator-X direction at high speeds, a column sum/average result as processed in FIG. 12A not only contains the magnetic field from the Y-magnet array 112B, 112D, but also includes the back-emf induced voltage. When a column summing trace 514 goes through the stator-X dimension center of a sensing element, the back emf voltage and the sensor output are proportional. This means the back-emf voltage only creates a scaling error. Due to identical scaling errors for all column average values, there will be no error in calculating stator-X position of a Y-magnet array 112B, 112D by using the algorithm discussed later. However, for stator-Z position calculation, suitable compensation (e.g. scaling and/or off-setting) of back-emf may be used to increase the accuracy of the result.

Figure 12B:
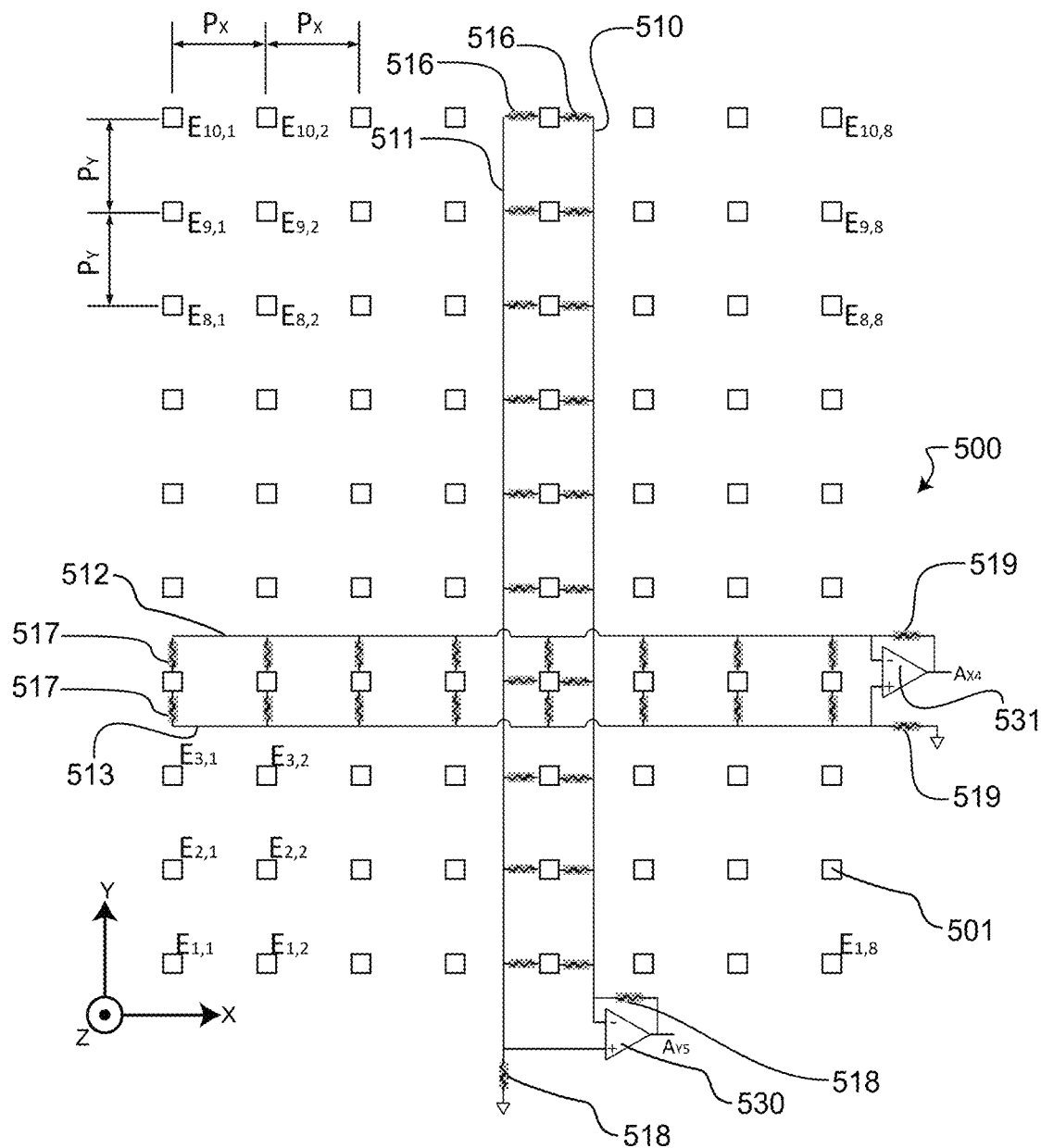

FIG. 12B shows another embodiment of such column/row summing/averaging operation. Each sensor 501 comprises a raw hall-effect sensor element. The column summing/averaging operation for sensors 501 along $5^{th}$ stator-Y oriented sensor column is implemented through vertical summing traces 510 and 511 and a summing operational amplifier 530 to produce a sum/average value $A_{Y,5}$. The row summing/averaging operation for sensors 501 along $4^{th}$ stator-X oriented sensor row is implemented through horizontal summing traces 512 and 513 and a summing operational amplifier 531 to produce sum/average value $A_{X,4}$. The row/column summing/averaging operation for sensors 501 along other rows or columns may be implemented in a similar way.

To simplify the signal processing associated with the outputs of sensors 501, it may be desirable: to minimize the sensitivity of the sums/averages of the stator-Y oriented sensor columns $A_{Y,j}$ to motion of the X-magnet arrays (for example, 112A and 112C in FIG. 3F); to minimize the sensitivity of the sums/averages of the stator-Y oriented sensor columns $A_{Y,j}$ to stator-Y direction motion of Y-magnet arrays (for example 112B and 112D in FIG. 3F); to minimize the sensitivity of the sums/averages of the stator-X oriented sensor rows $A_{X,i}$ to motion of the Y-magnet arrays (for example, 112B and 112D in FIG. 3F); and/or to minimize the sensitivity of the sums/averages of the stator-X oriented sensor rows $A_{X,i}$ to stator-X direction motion of X-magnet arrays (for example 112A and 112C in FIG. 3F). To achieve these desires, the stage-Y direction length $L_{yy}$ of the Y-magnet arrays 112B, 112D may be set at an integer multiple of the pitch $P_Y$; and/or the stage X-direction length $L_{xx}$ of the X-magnet arrays 112A, 112C may be set at an integer multiple of the pitch $P_X$. Additionally, in some embodiments, the stage-Y direction width $W_{xy}$ of each X-magnet array 112A, 112C may be set to be an integer multiple of its magnetic spatial period $\lambda_Y$ (e.g. $W_{xy}=N_{my}\lambda_y$, $N_{mx}$ is a positive integer); and/or stage-X direction width $W_{yx}$ of each Y-magnet array 112B, 112D may be set to be an integer multiple of its magnetic spatial period $\lambda_X$ (e.g. $W_{yx}=N_{my}\lambda_x$, $N_{my}$ is a positive integer). Further, in some embodiments, the relationship between the sensor pitch $P_x$ and the magnetic spatial period $\lambda_X$ of the Y-magnet arrays 112B, 112D conforms with equation (1a) described above; and/or the relationship between the sensor pitch $P_y$ and the magnetic spatial period $\lambda_Y$ of the X-magnet arrays 112A, 112C conforms with equation (1b) described above. With this configuration, the stator-X and stator-Z positions of Y-magnet arrays 112B, 112D can be derived from the sums/averages $A_{Y,j}$ of the stator-Y oriented sensor columns and the stator-Y and stator-Z positions of X-magnet arrays 112A, 112C can be derived from the outputs $A_{X,i}$ of the stator-X oriented sensor rows, as described in more detail below.

The remaining problem is to determine stator-X and stator-Z position of a Y-magnet array 112B, 112D from the available sums/averages $A_{Y,j}$ (j=1, 2, 3, . . . , N) of the stator-Y-oriented sensor columns; and to determine stator-Y and stator-Z position of an X-magnet array 112A, 112C from the available sums/average $A_{X,i}$ (i=1, 2, 3, . . . , M) of the stator-X oriented sensor rows. As these two issues can be solved in a similar way, the following discussion only focuses on the first one: to derive stator-X and stator-Z motion of a Y-magnet array 112B, 112D from the available sums/averages $A_{Y,j}$ (j=1, 2, 3, . . . , N) of the stator-Y-oriented sensor columns.

Figures 13A, 13B:
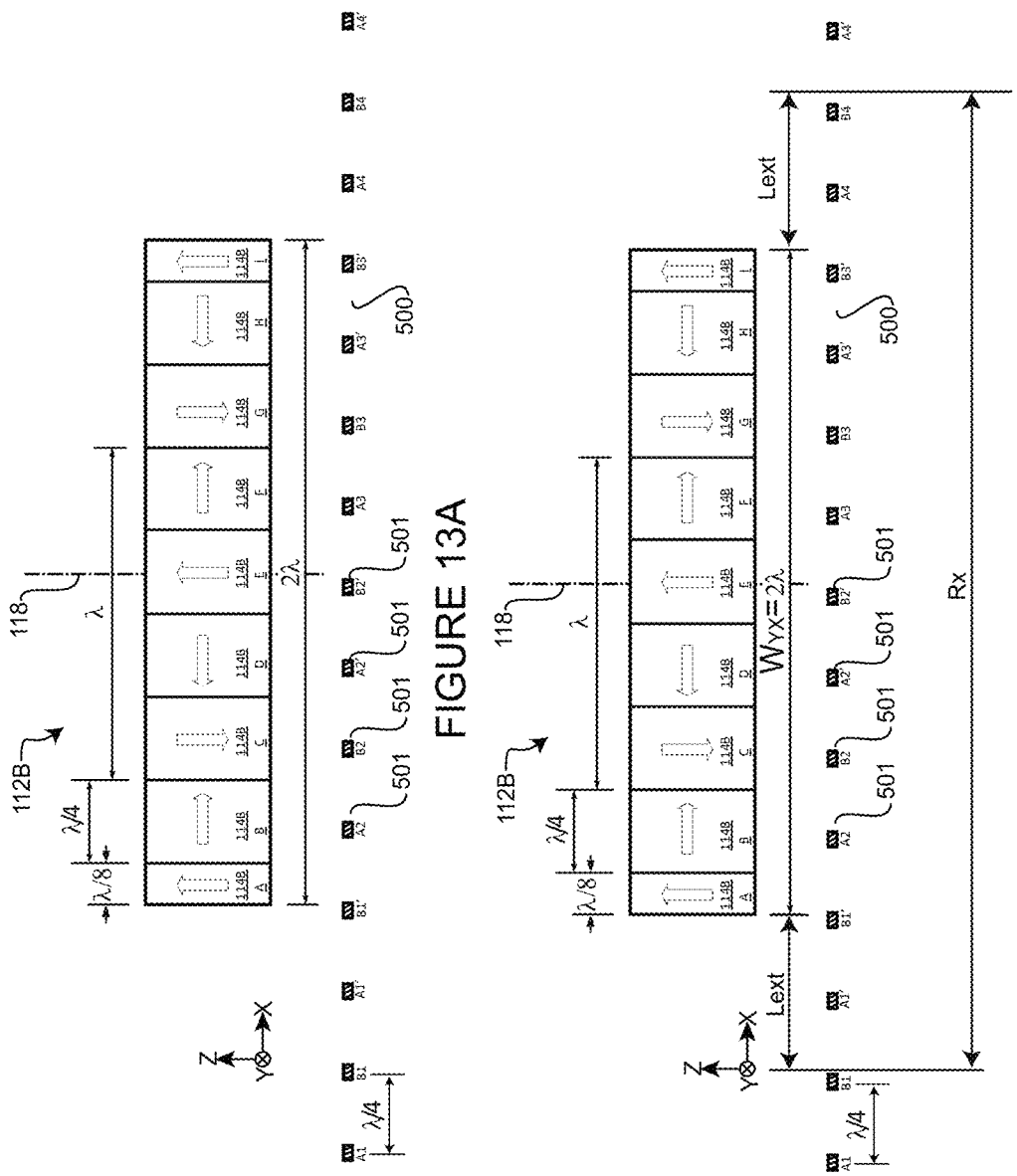
FIGS. 13A-13B illustrate different embodiments of a Y-magnet in relation to column sums/averages of column sensors extending in the Y direction.

FIG. 13A shows one non-limiting example embodiment, where a Y-magnet array 112B with spatial period $\lambda_X=\lambda$, is shown in relation to (e.g. above) a plurality of sums/averages of stator-Y oriented sensor columns. Each of A1, B1, A1', B1', A2, B2, . . . represents the sum/average $A_{Y,j}$ of the sensors 501 in a corresponding stator-Y oriented sensor column. The stator-x direction pitch $P_x$ of the stator-Y oriented sensor columns is set at $P_x=\lambda/4$.

Stator-Y oriented sensor columns which are separated from one another by a stator-X direction distance $\lambda$ or an integer multiple of $\lambda$ may be referred to herein as synchronous stator-Y oriented sensor columns or, for brevity, synchronous columns. The sum/average of the outputs of sensors 501 in each synchronous column may be referred to as a corresponding synchronous stator-Y oriented column value or, or brevity, a synchronous column value. In an analogous manner, stator-X oriented sensor rows which are separated from one another by a stator-Y direction distance $\lambda$ or an integer multiple of $\lambda$ may be referred to herein as synchronous stator-X oriented sensor rows or, for brevity, synchronous rows. The sum/average of the outputs of sensors 501 in each synchronous row may be referred to as a corresponding synchronous stator-X oriented row value or, or brevity, a synchronous row value.

For the particular configuration shown in FIG. 13A embodiment, sets of synchronous column values include: {A1, A2, A3, A4, . . . }, {B1, B2, B3, B4, . . . }, {A1', A2', A3', A4', . . . } and {B1', B2', B3', B4', . . . }. We may then define synchronous sum values and/or synchronous average values to be the sum/average of synchronous column values. For example, for the particular embodiment of FIG. 13A, the synchronous average values may be defined to be:

$$A = \frac{1}{n_1}(A_1 + A_2 + A_3 + A_4 + \ldots + A_{n_1}) \tag{3a}$$

$$A' = \frac{1}{n_2}(A'_1 + A'_2 + A'_3 + A'_4 + \ldots + A_{n_2}) \tag{3b}$$

$$B = \frac{1}{n_3}(B_1 + B_2 + B_3 + B_4 + \ldots + A_{n_3}) \tag{3c}$$

$$B' = \frac{1}{n_4}(B'_1 + B'_2 + B'_3 + B'_4 + \ldots + A_{n_4}) \tag{3d}$$

Where $n_1$, $n_2$, $n_3$, $n_4$ are the number of synchronous column values in each corresponding set. It will be appreciated that synchronous sum values may be determined in a manner similar to that of determining synchronous average values, except that it is not necessary to divide the sums by $n_1$, $n_2$, $n_3$, $n_4$.

It will be appreciated by those skilled in the art that the synchronous sum/average values A and A' are 180 degrees out of phase with one another, the synchronous sum/average values B and B' are 180 degrees out of phrase with one another and that $\alpha=A-A'$ and $\beta=B-B'$ are quadrature signals 90 degrees out of phase with one another. In particular, $\alpha$ and $\beta$ represent two sinusoidal functions of the stator-X position of Y-magnet array 112B, whose amplitudes are exponentially related to the magnet array stator-Z motion, as follows:

$$\alpha = A - A' = C_0 e^{-\frac{2\pi z}{\lambda}} \cos\left(\frac{2\pi x}{\lambda}\right) \tag{4a}$$

$$\beta = B - B' = C_0 e^{-\frac{2\pi z}{\lambda}} \sin\left(\frac{2\pi x}{\lambda}\right) \tag{4b}$$

From $\alpha=A-A'$ and $\beta=B-B'$, we can derive the stator-X direction and stator-Z direction positions of Y-magnet array 112B at very high resolution, such as 100 to 1000 times smaller than the spatial period $\lambda_X=\lambda$ of Y-magnet array 112B. Particularly, the stator-X direction position of a Y-magnet array 112B can be derived with the well-known quadrature decoding method:

$$x = \operatorname{atan2}(B - B', A - A') \frac{\lambda}{2\pi} \quad (5)$$

where a tan 2 is the arctangent function with two arguments. In particular, a tan 2(y,x) may be defined (in radians) over the range $(-\pi,\pi]$ as $$\operatorname{atan2}(y, x) = \begin{cases} \arctan\left(\frac{y}{x}\right) & x > 0 \\ \arctan\left(\frac{y}{x}\right) + \pi & y \geq 0, x < 0 \\ \arctan\left(\frac{y}{x}\right) - \pi & y < 0, x < 0 \\ +\frac{\pi}{2} & y > 0, x = 0 \\ -\frac{\pi}{2} & y < 0, x = 0 \\ \text{undefined} & y = 0, x = 0 \end{cases} \quad (6)$$

and can be mapped to the range $[0,2\pi)$ by adding $2\pi$ to any negative results.

In some embodiments, controller 504 may be configured to use synchronous sum/average values to determine a stator-Z position of movable stage 110. In the FIG. 13A example, the stator-Z direction position of Y-magnet array 112B can be derived according to:

$$z = \frac{\lambda}{2\pi} \ln\left(\frac{C_0}{\sqrt{(B - B')^2 + (A - A')^2}}\right) \quad (7)$$

where the constant $C_0$ can be calibrated when magnet array 112B is at position z=0 (i.e. magnet array 112B sits on top of sensors 501) or at another convenient reference position.

Although the sum/average of the outputs of sensors 501 in each individual sensor-Y oriented column (e.g. each individual column value A1, B1, A1', B1', A2, B2, . . . ) is not a sinusoidal function of stator-X direction position of Y-magnet array 112B due to the finite stage-X-width of Y-magnet array 112B, the synchronous sum/average values (e.g. A, A', B, B') are sinusoidal functions. These synchronous sum/average values can effectively eliminate the fringing field effect of magnet array 112B and help produce accurate position information.

As shown in FIG. 13B, the stator-X direction scope or range $R_x$ of stator-Y oriented sensor columns used to obtain synchronous sum/average values (e.g. A, A', B, B') in the above-described synchronous averaging operation is greater than the stator-X direction width $W_{yx}$ of Y-magnet array 112B by a suitable distance $L_{ext}$ on both sides of magnet array 112B—that is $R_x = W_{yx} + 2L_{ext}$. Synchronous column values beyond this range $R_x$ can also be included to calculate synchronous sum/average values, but synchronous column values outside of this range $R_x$ make little contribution to the accuracy of the position determination due to the fact that the magnetic field strength beyond the range $R_x$ is relatively weak. A typical choice of $L_{ext}$ is a value between $\lambda/4$ and $\lambda$. Accordingly, the spacing $T_y$ between two Y-magnet arrays 112B, 112D may be chosen to be at least $T_y = 2L_{ext}$. Similarly, the spacing $T_x$ between two X-magnet arrays 112A, 112C may be chosen to be at least $T_x = 2L_{ext}$. For larger values of $L_{ext}$, more accurate results may be obtained, but at the cost of computational expense and larger spacing $T_x$, $T_y$ between magnet arrays 112. For example, $L_{ext}$ can be set at $\lambda/2$, or $\lambda/4$, or $3\lambda/4$. In some embodiments, $L_{ext}$ is set at $\lambda/2$.

In some embodiments, sensor array 500 disclosed herein can be used to determine an absolute position of a magnet array 112 without requiring a homing operation during the start of system operation or calibration. Referring to FIG. 13A, we may define groups of stator-Y oriented sensor columns to be the stator-Y oriented sensor columns in a particular magnetic period $\lambda$. For example, in the FIG. 13A embodiment, groups of stator-Y oriented sensor columns may be defined to be sensor group 1={A1, B1, A1', B1'}; sensor group 2={A2, B2, A2', B2'}; sensor group 3={A3, B3, A3', B3'}; sensor group 4={A4, B4, A4', B4'}, and so on. Using such defined groups and the sum/average of the outputs of sensors 501 in each individual sensor-Y oriented column (e.g. each individual column value A1, B1, A1', B1', A2, B2, . . . ), a suitable algorithm can be used to determine in which group of sensor-Y oriented columns, the center of magnet array 112B is located. The exact position of the center of magnet array 112B within a particular sensor group can be derived from the quadrature signals $\alpha = A - A'$ and $\beta = B - B'$, as described above. As the quadrature signal amplitudes are exponential functions of stator-Z motion of magnet array 112B, the stator-Z motion of magnet array 112B can be determined in accordance with equation (7).

It should be noted that electrical current inside coils near each sensor 501 can also influence the output of a sensor 501. However, current in each coil trace is known to controller 504 (e.g. because controller 504 calculates the driving currents associated with moving movable stage 110) and the influence of the current in each coil trace on corresponding sensors 501 can be pre-calibrated and thus be subtracted or otherwise removed from the sensor outputs e.g. from the output of each sensor 501, from the output (e.g. sum/average) of each stator-Y oriented sensor column value, from the output of each synchronous sum/average value and/or the like.

It will be appreciated that the methods described herein for determining stator-X and stator-Z positions of Y-magnet array 112B from the output (e.g. sum/average) of each stator-Y oriented sensor column (e.g. $A_{Y_j}$ (j=1, 2, 3, . . . , N)) can be applied for determining stator-X and stator-Z positions of any Y-magnet array (e.g. Y-magnet array 112D), and can also be applied for determining stator-Y and stator-Z positions of X-magnet arrays 112A, 112C from the output (e.g. sum/average) of each stator-X oriented sensor row (e.g. $A_{X,i}$ (i=1, 2, 3, . . . , N)).

It is understood that outputs of sensors 501 and/or outputs corresponding to sums/averages of the outputs of sensors 501 in sensor rows/columns (e.g. as shown in the embodiments of FIG. 12A, 12B) may be converted to digital values by suitable analog-to-digital convertor(s), and the converted values can be processed by controller 504 to derive the position of each magnet array 112. Position information for all magnet arrays 112 of a movable stage 110 may be used to calculate 6-dimensional positions of movable stage 110. For example, for the case in FIG. 3F, the stator-X and stator-Z positions of Y-magnet arrays 112B, 112D may be determined from the output (e.g. sum/average) of each stator-Y oriented sensor column (e.g. $A_{Y_j}$ (j=1, 2, 3, . . . , N)), the stator-Y and stator-Z positions of X-magnet arrays 112A, 112C may be determined from the output (e.g. sum/average) of each stator-X oriented sensor row (e.g. $A_{X,i}$ (i= 1, 2, 3, . . . , N)), and this position information may be combined together to determine the three translational positions and three rotational positions of movable stage 110.

FIGS. 14A and 14B (together FIG. 14) show cross-sectional and top views of another non-limiting embodiment of the invention. The embodiment of FIG. 14 differs from the embodiment of FIGS. 9 and 13A in that the stator-Y oriented sensor columns corresponding to Ai' and Bi' (i=1, 2, . . . ) are removed in the embodiment of FIG. 14. The FIG. 14 configuration may continue to provide information desirable for determining the stator-X and stator-Y positions of Y-magnet array 112B because the synchronous sum/average values A' and A (equations (3a), (3b)) are nearly opposite to each other as they have 180 degree phase difference, and thus have redundant information. Similarly, the synchronous sum/average values B' and B (equations (3c), (3d)) are nearly opposite to each other and thus have redundant information. Comparing the layout of sensor array 500 in FIGS. 9 and 14, it can be seen that some stator-Y oriented sensor columns and/or some stator-X oriented sensor rows are removed from the FIG. 14B embodiment. Such removal has a periodic repetitive pattern, leaving the sensor array 500 of FIG. 14B with a period pattern. In FIG. 14B implementation, the previously mentioned methods of summing/average over each stator-Y oriented sensor column and each stator-X oriented sensor row and determining synchronous sum/average values can still be applied. Accordingly, for the case of synchronous averaging, the synchronous averaging values for the embodiment of FIG. 14 can be modified as:

$$A = \frac{1}{n_5}(A_1 + A_2 + A_3 + A_4 + \ldots + A_{n_5}) \quad (8a)$$

$$B = \frac{1}{n_6}(B_1 + B_2 + B_3 + B_4 + \ldots + A_{n_6}) \quad (8b)$$

Where $n_5$, $n_6$ are the number of synchronous column values in each synchronous average value. It will be appreciated that synchronous sum values may be determined in a manner similar to that of determining synchronous average values, except that it is not necessary to divide the sums by $n_5$, $n_6$. The stator-X and stator-Z direction positions of Y-magnet array 112B can be determined according to $$A = C_0 e^{-\frac{2\pi z}{\lambda}} \cos\left(\frac{2\pi x}{\lambda}\right) \quad (9a)$$

$$B = C_0 e^{-\frac{2\pi z}{\lambda}} \sin\left(\frac{2\pi x}{\lambda}\right) \quad (9b)$$

$$x = \text{atan2}(B, A)\frac{\lambda}{2\pi} \quad (9c)$$

$$z = \frac{\lambda}{2\pi}\ln\left(\frac{C_0}{\sqrt{B^2 + A^2}}\right) \quad (9d)$$

As before, the stator-X and stator-Z positions of Y-magnet array 112D and the stator-Y and stator-Z positions of X-magnet arrays 112A, 112C can be determined in an analogous manner.

Figure 15:
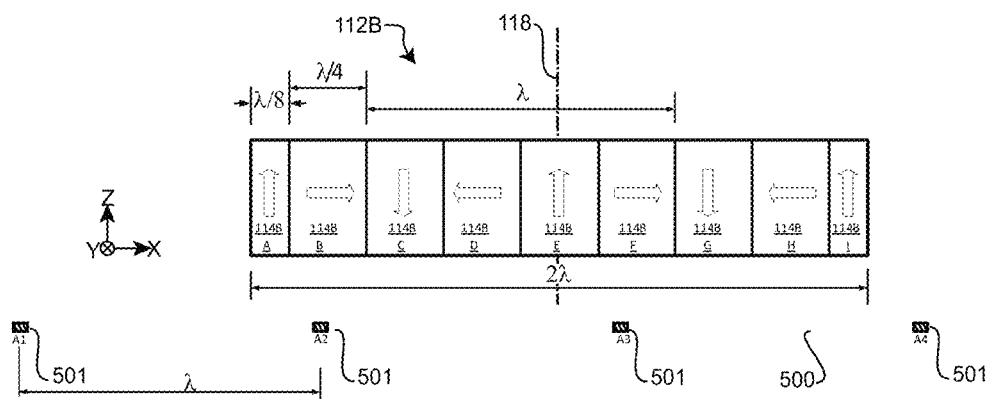
FIG. 15 illustrates another embodiment of a Y-magnet array in relation to column sums/averages of column sensors extending in the Y direction in which additional column sums/averages are removed.

FIG. 15 shows a cross-sectional view of another non-limiting embodiment of the invention. The embodiment of FIG. 15 differs from the embodiment of FIGS. 9 and 13A in that the stator-Y oriented sensor columns corresponding to Ai', Bi, and Bi' (i=1, 2, . . . ) are removed in the embodiment of FIG. 14. The FIG. 15 configuration may continue to provide information desirable for determining the stator-X and stator-Y positions of Y-magnet array 112B when each sensor 501 can sense magnetic field in two directions Z and X, because the flux density in stator-Z and stator-X are separated by a 90 degree phase different and thus can be used to interpolate the position of magnet array 112B accurately. In the case of the FIG. 15 embodiment, the stator-X direction field measurement outputs from sensors 501 may be column summed/averaged and also synchronously summed/averaged; and the stator-Z direction field measurement outputs from sensors 501 may be column summed/averaged and also synchronously summed/averaged. Then, the two synchronous sum/average outputs (i.e. corresponding to stator-X and stator-Z direction field sensitivity) may be used to determine the stator-X and stator-Z positions of Y-magnet array 112B. In the FIG. 15 embodiment, the synchronous sum/average values can be determined according to:

stator-X field synchronous average:

$$A_x = \frac{1}{n_7}(A_{1x} + A_{2x} + A_{3x} + A_{4x} + \ldots + A_{n_7}) \quad (10a)$$

stator-Z field synchronous average:

$$A_z = \frac{1}{n_8}(A_{1z} + A_{2z} + A_{3z} + A_{4z} + \ldots + A_{n_8}) \quad (10b)$$

Where: $A_{ix}$ (i=1, 2, . . . ) represents the average of over a stator-Y oriented sensor column of the sensor outputs corresponding to the stator-X direction magnetic field sensitivity; $A_{iz}$ (i=1, 2, . . . ) represents the average of over a stator-Y oriented sensor column of the sensor outputs corresponding to the stator-Z direction magnetic field sensitivity; $A_x$ is synchronous average value of $A_{ix}$ (i=1, 2, . . . ), $A_z$ is synchronous average value of $A_{iz}$ (i=1, 2, . . . ); and $n_7$, $n_8$ are the number of synchronous column values in each synchronous average value. It will be appreciated that synchronous sum values may be determined in a manner similar to that of determining synchronous average values, except that it is not necessary to divide the sums by $n_7$, $n_8$. The stator-X and stator-Z direction positions of Y-magnet array 112B can be determined according to:

$$A_x = C_0 e^{-\frac{2\pi z}{\lambda}} \sin\left(\frac{2\pi x}{\lambda}\right) \quad (11a)$$

$$A_z = C_0 e^{-\frac{2\pi z}{\lambda}} \cos\left(\frac{2\pi x}{\lambda}\right) \quad (11b)$$

$$x = \text{atan2}(A_x, A_z)\frac{\lambda}{2\pi} \quad (11c)$$

$$z = \frac{\lambda}{2\pi}\ln\left(\frac{C_0}{\sqrt{A_z^2 + A_x^2}}\right) \quad (11d)$$

Figure 16:
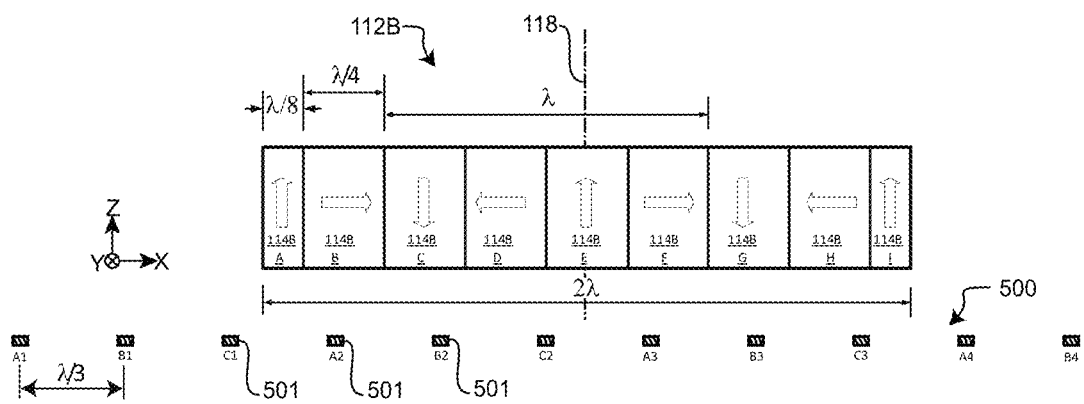
FIG. 16 illustrates another embodiment of a Y-magnet array in relation to column sums/averages of column sensors extending in the Y direction, the sensors having an alternative sensor pitch.

As before, the stator-X and stator-Z positions of Y-magnet array 112D and the stator-Y and stator-Z positions of X-magnet arrays 112A, 112C can be determined in an analogous manner FIG. 16 shows a cross-sectional view of another non-limiting embodiment of the invention. The embodiment of FIG. 16 differs from the embodiment of FIGS. 9 and 13A in that instead of four stator-Y oriented sensor columns per spatial period λ (as is the case in the embodiment of FIG. 13A), the embodiment of FIG. 16 comprise three generally equally-spaced stator-Y oriented sensor columns per spatial period $\lambda$ (i.e. $P_x=\lambda/3$). Each of Ai, Bi, Ci (i=1, 2, 3, . . . ) represents sum/average sensors 501 distributed along a stator-Y oriented sensor column (e.g. aligned along a line oriented in the stator-Y direction). Synchronous sum/average values A, B, C may be used to determine the stator-X and stator-Z position of a Y-magnet array according to:

$$A = \frac{1}{n_9}(A_1 + A_2 + A_3 + A_4 + \ldots A_{n_9}) \qquad (12a)$$

$$B = \frac{1}{n_{10}}(B_1 + B_2 + B_3 + B_4 + \ldots B_{n_{10}}) \qquad (12b)$$

$$C = \frac{1}{n_{11}}(C_1 + C_2 + C_3 + C_4 + \ldots C_{n_{11}}) \qquad (12c)$$

Where $n_9$, $n_{10}$, $n_{11}$ are the number of synchronous column values in each synchronous average value. It will be appreciated that synchronous sum values may be determined in a manner similar to that of determining synchronous average values, except that it is not necessary to divide the sums by $n_9$, $n_{10}$, $n_{11}$.

Each of the synchronous sum/average values A, B, C will be a sinusoidal function of the stator-X position of Y-magnet array 112B separated by a 120 degree phase difference, where phase is the stator-X position of Y-magnet array 112B divided by spatial period $\lambda$ and multiplied by $2\pi$. The sinusoidal amplitude is related to the stator-Z position of Y-magnet array 112B exponentially and can be used to derive the stator-Z position of Y-magnet array 112B.

Mathematically, A, B, C can be represented as:

$$A = C_0 e^{-\frac{2\pi z}{\lambda}} \cos\left(\frac{2\pi x}{\lambda}\right) \qquad (13a)$$

$$B = C_0 e^{-\frac{2\pi z}{\lambda}} \cos\left(\frac{2\pi x}{\lambda} - \frac{2\pi}{3}\right) \qquad (13b)$$

$$C = C_0 e^{-\frac{2\pi z}{\lambda}} \cos\left(\frac{2\pi x}{\lambda} - \frac{4\pi}{3}\right) \qquad (13c)$$

These three values are sufficient to solve the two unknowns (the stator-X and stator-Z positions of Y-magnet array 112B) with a suitable method/algorithm, where constant $C_0$ can be either pre-calibrated by experiments or be pre-calculated with an aid of simulation software.

One non-limiting method to determine stator-X and stator-Z position of a Y-magnet array 112B from synchronous average values A, B, C is as follows:

$$A_{90} = [A, B, C]\begin{bmatrix} 0 \\ \sin\left(\frac{2\pi}{3}\right) \\ -\sin\left(\frac{2\pi}{3}\right) \end{bmatrix} = 1.5 C_0 e^{-\frac{2\pi z}{\lambda}} \sin\left(\frac{2\pi x}{\lambda}\right) \qquad (14a)$$

$$A_0 = [A, B, C]\begin{bmatrix} 1 \\ -0.5 \\ -0.5 \end{bmatrix} = 1.5 C_0 e^{-\frac{2\pi z}{\lambda}} \cos\left(\frac{2\pi x}{\lambda}\right) \qquad (14b)$$

$$x = \operatorname{atan2}(A_{90}, A_0)\frac{\lambda}{2\pi} \qquad (14c)$$

$$z = \frac{\lambda}{2\pi}\ln\left(\frac{1.5 C_0}{\sqrt{A_0^2 + A_{90}^2}}\right) \qquad (14d)$$

As before, the stator-X and stator-Z positions of Y-magnet array 112D and the stator-Y and stator-Z positions of X-magnet arrays 112A, 112C can be determined in an analogous manner.

Another variation of FIG. 16 implementation is to change the sensor spacing from $\lambda/3$ to $2\lambda/3$ or $4\lambda/3$, to reduce the number of sensors 501 in the system.

Figure 17:
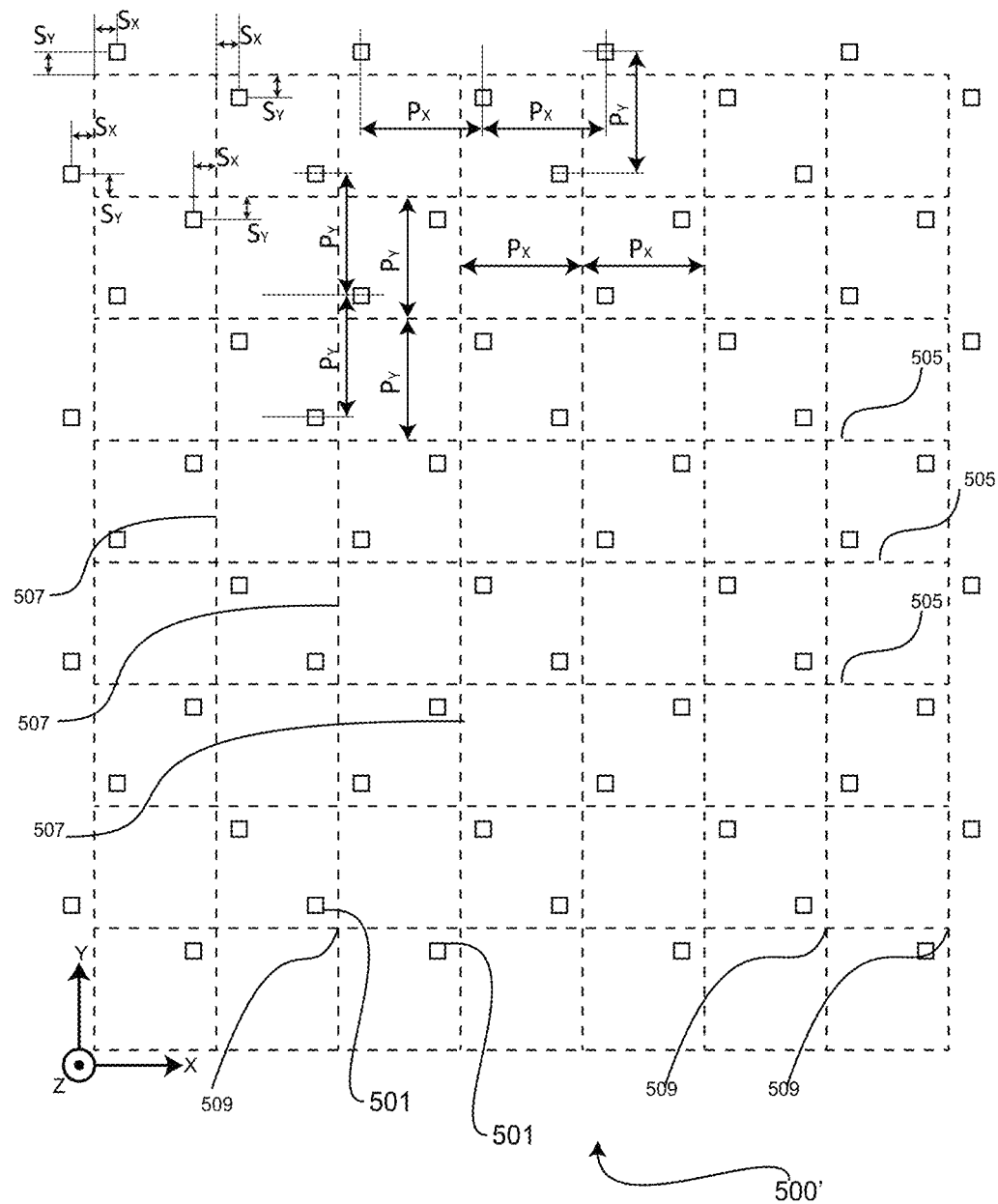
FIG. 17 illustrates an array of sensors according to a particular embodiment in which each sensor is offset away from equally spaced two dimensional grid points.

FIG. 17 shows a top view of a sensor array 500' according to another non-limiting embodiment of the invention. In comparison to sensor array 500 in the FIG. 9 embodiment, each sensor 501 of array 500' of the FIG. 17 embodiment is offset away from equally spaced 2-dimensional grid points 509 (i.e. offset from the intersection points 509 of stator-X oriented lines 505 and stator-Y oriented lines 507). The pitches of the grid intersection points are $P_x$ in the stator-X direction and $P_y$ in the stator-Y direction. The actual location of each sensor 501 is shifted away in the stator-X direction by an amount of either $\pm S_x$, and shifted in the stator-Y direction by an amount of either $\pm S_y$. Spatially, the shifts exhibit a periodic pattern in the stator-X and stator-Y directions. In particular, each sensor 501 in a stator-Y oriented sensor column, while offset (by an offset $2S_x$) from adjacent sensors 501 in the stator-Y oriented sensor column, is still generally aligned with the other sensors 501 in the stator-Y oriented sensor column and pairs of adjacent sensors 501 in the stator-Y oriented sensor column are still separated by a stator-Y direction pitch $P_y$. Similarly, each sensor 501 in a stator-X oriented sensor row, while offset (by an offset $2S_y$) from adjacent sensors 501 in the stator-X oriented sensor row, is still generally aligned with the other sensors 501 in the stator-X oriented sensor row and pairs of adjacent sensors 501 in the stator-X oriented sensor row are still separated by a stator-X direction pitch $P_x$.

The shifted pattern of array 500' may cause some filtering out of the higher order harmonic fields of magnet arrays 112 during the summing/averaging operation along each stator-X oriented sensor row and/or each stator-Y oriented sensor column. The offsets $S_x$, $S_y$ may be generally smaller than the grid pitch (i.e. $S_x < P_x$ and $S_y < P_y$). To filter off the $5^{th}$ order harmonic fields, $S_x$, $S_y$ can be set at $S_X = \lambda_X/20$, and $S_Y = \lambda_Y/20$, where $\lambda_X$ is the stage-X direction magnetic spatial period of Y-magnet arrays (for example, Y-magnet arrays 112B, 112D in FIG. 3F); $\lambda_Y$ is the stage-Y direction magnetic spatial period of X-magnet magnet arrays (for example X-magnet arrays 112A, 112C in FIG. 3F). Other options include, for example, $S_X = \lambda_X/36$ and $S_Y = \lambda_Y/36$, to filter off the $9^{th}$ order harmonic field effect on the sums/averages of the stator-X oriented sensor rows and stator-Y oriented sensor columns ($A_{X,i}$ and $A_{Y,j}$). By setting $S_x$ to conform generally with $S_X = \lambda_X/(4*K)$, the stator-Y oriented sensor column sum/average will filter out $K^{th}$ order harmonic fields of the Y-magnet arrays; and by setting $S_y$ to conform generally with $S_Y = \lambda_Y/(4*K)$, the stator-X oriented sensor row sum/average will filter out $K^{th}$ order harmonic fields of X-magnet array. Typically, the minimum order of harmonic distortion of concern for a magnet array 112 is K=3 when $N_t=2$; consequently, in some embodiments, $S_x$ and/or $S_y$ are set with K being a positive integer and K≥3.

In some cases, the determined stator-X and stator-Z positions for a Y-magnet array 112B, 112D may contain some periodic error due to some practical imperfectness such as magnet array manufacturing error or material non-uniformity. One non-limiting embodiment of removing such systematic error is a correction process:

$$X_c = X - a_1\cos\left(\frac{2\pi x}{\lambda}\right) - b_1\sin\left(\frac{2\pi x}{\lambda}\right) - a_2\cos\left(\frac{4\pi x}{\lambda}\right) - b_2\sin\left(\frac{4\pi x}{\lambda}\right)$$

$$Z_c = Z - c_1\cos\left(\frac{2\pi x}{\lambda}\right) - d_1\sin\left(\frac{2\pi x}{\lambda}\right) - c_2\cos\left(\frac{4\pi x}{\lambda}\right) - d_2\sin\left(\frac{4\pi x}{\lambda}\right)$$

where X and Z are the stator-X and stator-Z positions determined using the methods described above, $X_c$ and $Z_c$ are the stator-X and stator-Z positions determined after error correction, and $a_1$, $a_2$, $b_1$, $b_2$, $c_1$, $c_2$, $d_1$, $d_2$ are constant coefficients that can be experimentally calibrated. Similar correction methods can be applied for stator-X and stator-Z positions of X-magnet arrays 112A, 112C.

Figure 18:
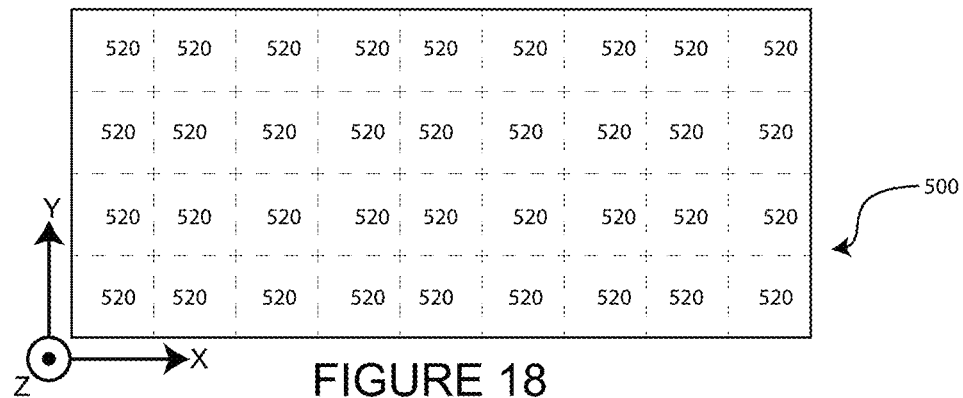
FIG. 18 illustrates an array of sensors having polygon-shaped independent sensing regions which each contain a sub-array of sensors according to a particular embodiment.

In some embodiments, the overall stator X/Y plane may be split into multiple independent sensing regions. The overall sensor array 500 may then be split into many polygon-shaped independent sensing regions 520. As shown in FIG. 18, each polygon-shaped independent sensing region 520 is a square, which contains a sub-array of sensors 501, for example 12 by 12 sensors. The column and row summing/averaging operations described above may be confined to each region 520 independently (e.g. using suitable hardware wiring or suitable software algorithms). That is row/column sums/averages are only determined using sensors inside one region 520. Independent sensing regions 520 can be in other shapes such as, for example, rectangles or hexagons.

In some embodiments, the overall stator X/Y plane is split into multiple independent column sensing regions; and the overall stator X/Y plane is split into multiple independent row sensing regions. Such a split or partition may allow motion measurement of multiple movable stages simultaneously and independently. Each independent column sensing region may have a polygon shape, such as but not limited to a rectangle, a square, or a hexagon. Each independent row sensing region may have a polygon shape, such as but not limited to a rectangle, a square, or a hexagon. Column summing/averaging operations described above may be confined to each column sensing region. Row summing/averaging operations described above may be confined to each row sensing region. It should be noted, the overall partition of independent row sensing region and the overall partition of independent column sensing region are not necessarily identical, and they may be identical in some regions and may be totally different in some other regions.

As described above, in some embodiments sensors are mounted on printed circuit boards. The overall sensor array 500 of the whole working region 124 may comprise a plurality of printed circuits boards. Each printed circuit board may include one or a plurality of independent sensing zones.

Figure 19:
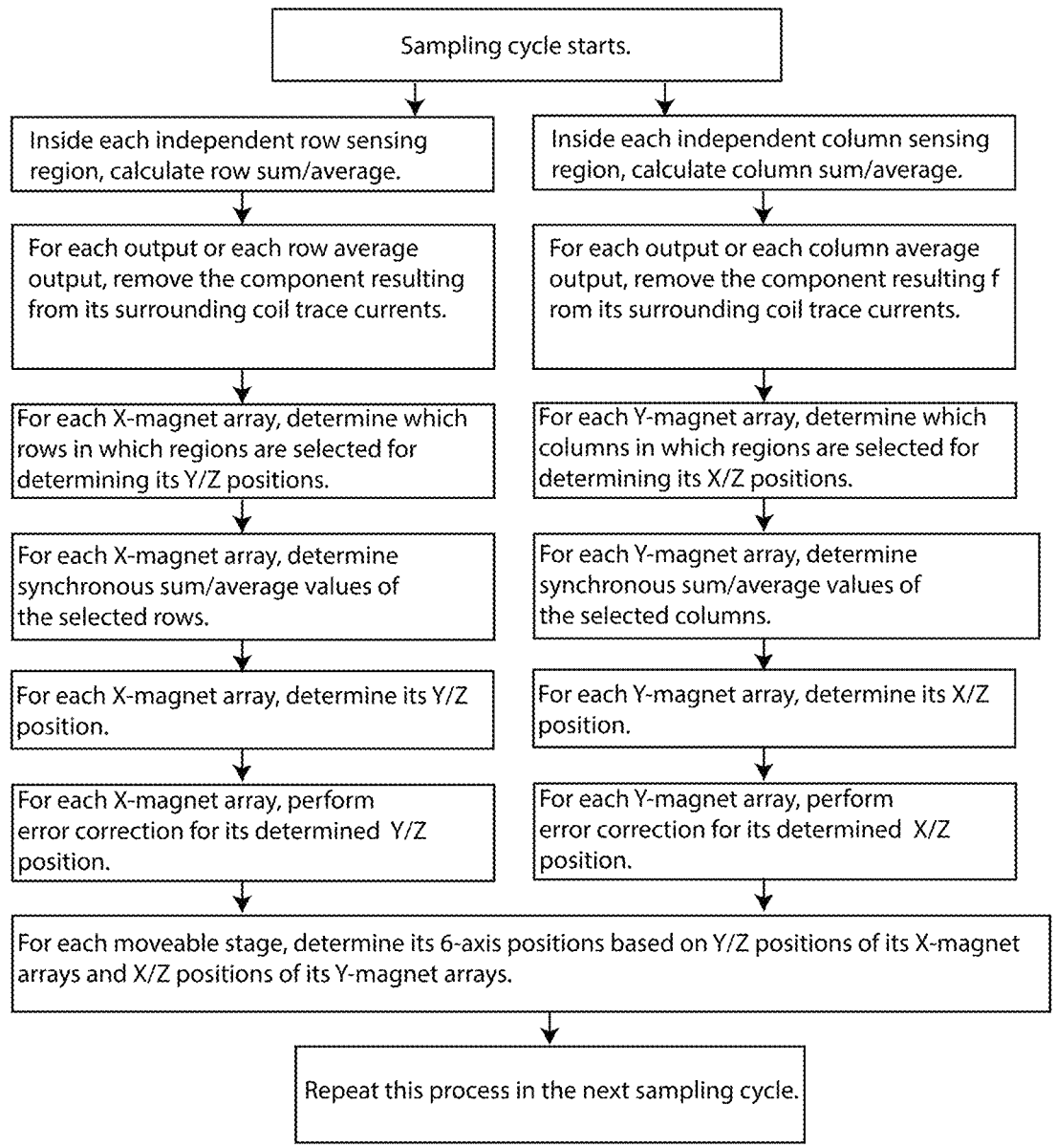
FIG. 19 is a schematic illustration of a method for estimating the position of a movable stage position according to a particular embodiment.

FIG. 19 shows one non-limiting embodiment of a flow chart for movable stage position determination. At each sampling event, the whole process in the flow chart will be executed to produce 6-axis position information in real time. Some steps in the flow chart in FIG. 19 may be omitted to save computation time. For example, system error correction and/or coil trace current effect removal may not be necessary for low precision application. FIG. 19 depicts a series of steps for each column and a similar series of steps for each row. The steps for the rows and columns can be executed in parallel or in series.

Each sensor 501 may have a non-zero output bias: when there is no external magnetic field, the output voltage/signal may not quite be zero. Such output bias may change with time or with environmental factors, such as temperature and/or the like. One way to minimize the impact of such output bias is to subtract a calibrated bias value from the sensor output signal. One way to calibrate the bias value is to record the sensor output when there is no external magnetic field. Such calibration values can be determined in a range of environmental conditions and stored in a look up table, for example. In some embodiments, such sensor bias value(s) may be repeatedly refined by recording the sensor output when no movable stage is close to the sensors. As a result, even the magnetic field sensor bias value may change over time or with environmental conditions. Such a continually refined output bias calibration procedure may help to compensate for such drifting output bias. In one particular implementation, if there is no movable stage close to the sensors 501 in a stator-Y oriented sensor column or a stator-X oriented sensor row, then the column/row sum/average output value can be recorded as a newly calibrated output for bias removal used later.

Multiple Movable Stages

Figure 20:
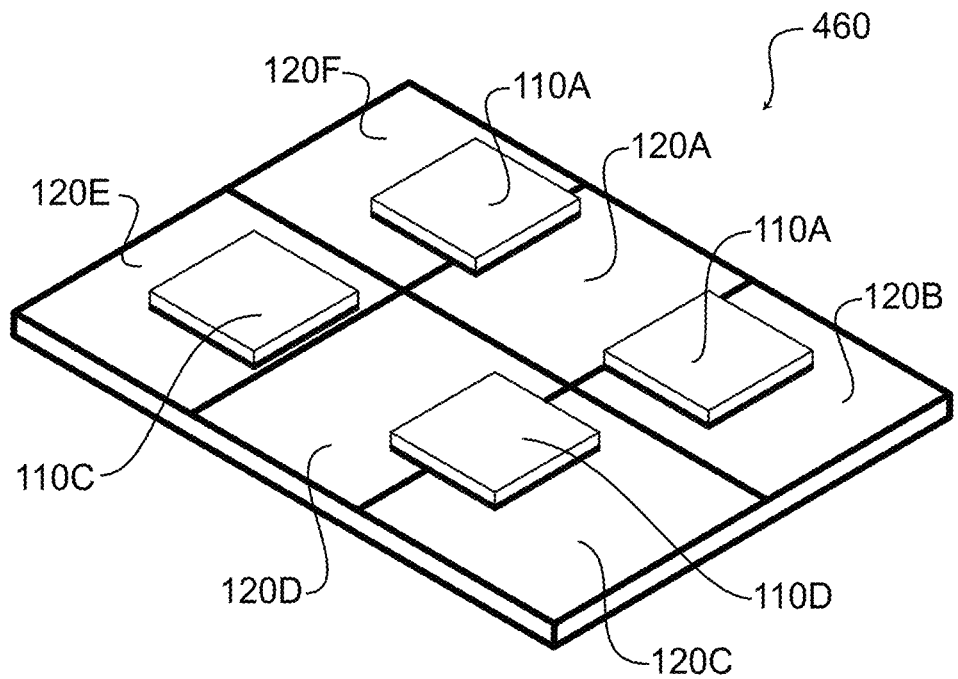
FIG. 20 schematically illustrates an apparatus for moving a plurality of movable stages through a plurality of different stators.

In certain applications, such as photo-lithography, automated assembly systems and/or the like, there can be a desire to simultaneously and independently control more than one movable stage. This may be achieved, for example, by providing a corresponding plurality of independently controllable stators and controlling the movement of one movable stage on each stator. In some circumstances, it is desirable to interchange the movable stages (e.g. to move a movable stage from one stator to another stator). In some applications, it may be desirable to move movable stages 110 through a number of different stages. FIG. 20 schematically illustrates an apparatus 460 suitable for this purpose. In the illustrated embodiment, movable stages 110A-110D move between several stators 120A-120F and, in some applications, may stop at each stator 120 for some operation. In general, there may be any suitable number of movable stages 110 and any suitable number (greater than the number of movable stages 110) of stators 120. On each stator 120A-120F, a position estimating system of the type described herein may be used as part of a control system to control positions of the corresponding movable stage 110A-110D. In some embodiments, precision position control may only be required inside stators 120A-120F. Consequently, stator-to-stator motion (e.g. motion of movable stage 110A-110D between stators 120A-120F) may be guided by relatively inexpensive positions measurement systems, such as indoor GPS, stereo camera and/or the like.

Other Layouts and Configurations

Figure 21A:
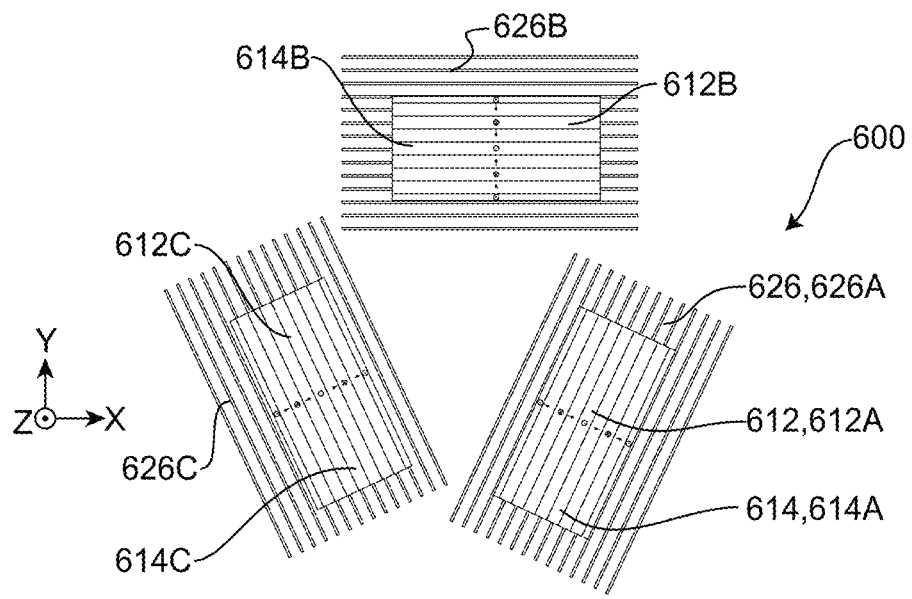
FIGS. 21A-21C schematically depict displacement devices according to other embodiments having different relative orientations of coil traces and magnet arrays.

FIG. 21A schematically depicts a displacement device 600 according to another embodiment. Displacement device 600 comprises a movable stage (not explicitly shown) which comprises a plurality of magnet arrays 612. In the illustrated embodiment, displacement device 600 comprise three magnet arrays 612 (labeled 612A, 612B, 612C). Each magnet array 612A, 612B, 612C comprises a corresponding plurality of magnetization segments 614A, 614B, 614C which are generally linearly elongated at a particular orientation in the stage X-Y plane for example, magnetization segments 614A of magnet array 612A have one orientation of linear elongation, magnetization segments 614B of magnet array 612B have a second orientation of linear elongation and magnetization segments 614C of magnet array 612C have a third orientation of linear elongation. As is the case with the other displacement devices described herein, the magnetization directions of magnetization segments 614A, 614B, 614C may be generally orthogonal to the direction that they are physically elongated. Other than for their relative orientations, the characteristics of magnet arrays 612 and magnetization segments 614 may be similar to those discussed above for magnet arrays 112 and magnetization segments 114.

Displacement device 600 also comprises a stator (not explicitly shown) that comprises a plurality of generally linearly elongated coil traces 626. In the illustrated embodiment, displacement device 600 comprise three sets of coil traces 626 (labeled 626A, 626B, 626C) which may be located on corresponding layers (not explicitly shown) of the stator. Each layer of coil traces 626A, 626B, 626C may comprise coil traces 626A, 626B, 626C that are generally linearly elongated at a particular orientation in a corresponding stator X-Y plane. Such layers and their corresponding coil traces 626A, 626B, 626C may overlap one another (in the stator-Z direction) in the working region of displacement device 600. Other than for their relative orientations, the characteristics of coil traces 626 may be similar to those of coil traces 126 discussed above.

Figure 21B:
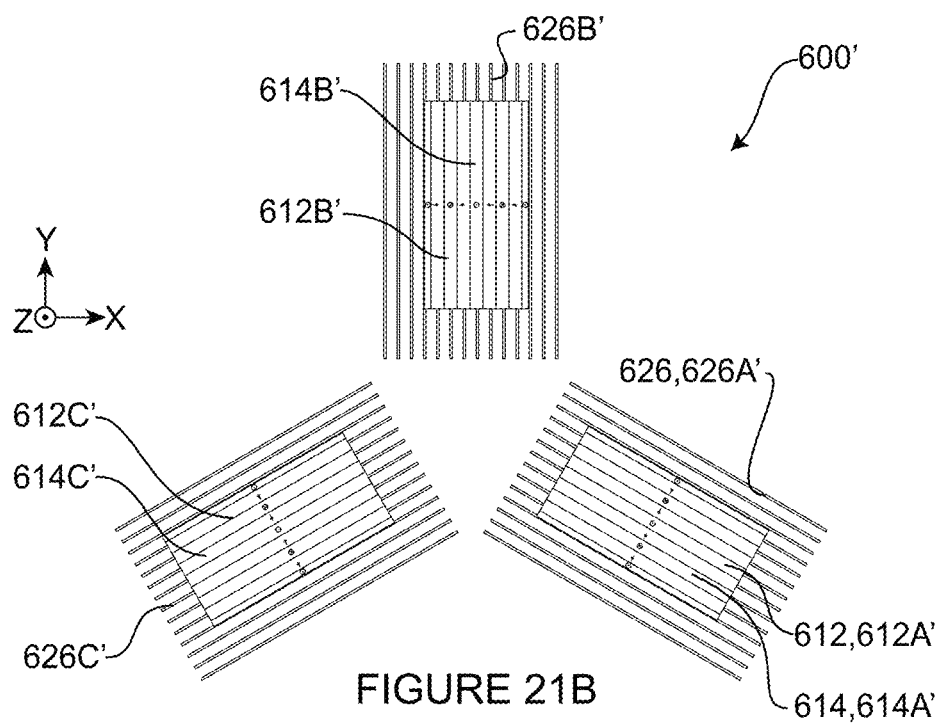

Displacement device 600' shown in FIG. 21B is similar to displacement device 600, except that the orientations of the linearly elongated coil traces 626A', 626B', 626C' are different than the orientations of the linearly elongated traces 626A, 626B, 626C and the orientations at which magnetization segments 614A', 614B' and 614C' extend are different than the orientations at which magnetization segments 614A, 614B, 614C extend.

Figure 21C:
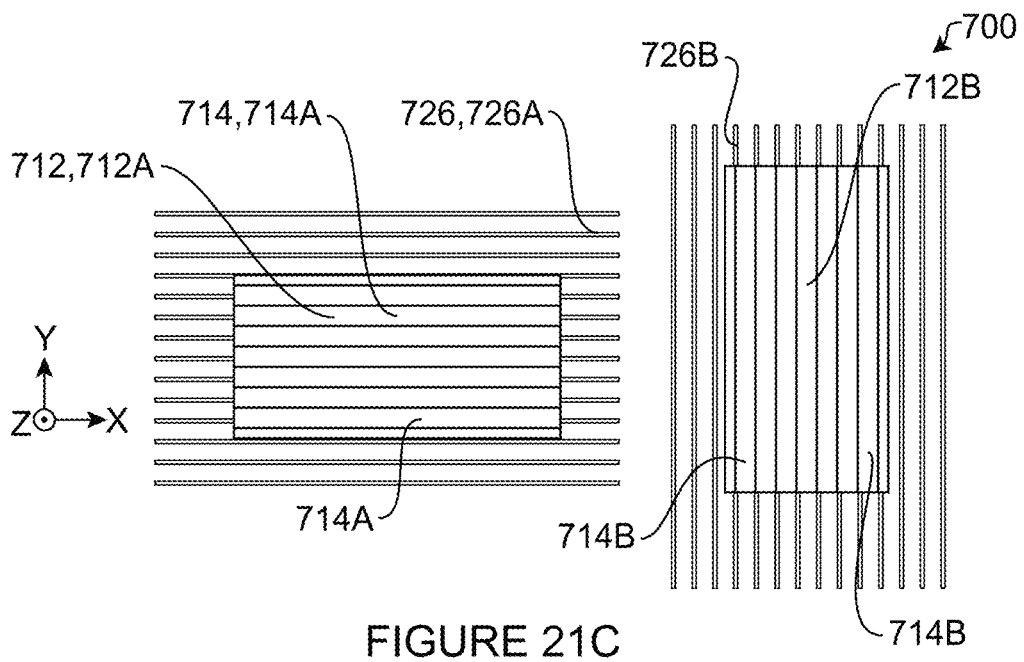

FIG. 21C schematically depicts a displacement device 700 according to another embodiment. Displacement device 700 comprises a movable stage (not explicitly shown) which comprises a plurality of magnet arrays 712. In the illustrated embodiment, displacement device 700 comprises two magnet arrays 712 (labeled 712A, 712B). Each magnet array 712A, 712B comprises a corresponding plurality of magnetization segments 714A, 714B which are generally linearly elongated at a particular orientation in the stage-X-Y plane for example, magnetization segments 714A of magnet array 712A have one orientation of linear elongation and magnetization segments 714B of magnet array 712B have a second orientation of linear elongation. As is the case with the other displacement devices described herein, the magnetization directions of magnetization segments 714A, 714B may be generally orthogonal to the direction that they are physically elongated. Other than for their relative orientations, the characteristics of magnet arrays 712 and magnetization segments 714 may be similar to those discussed above for magnet arrays 112 and magnetization segments 114.

Displacement device 700 also comprises a stator (not explicitly shown) that comprises a plurality of generally linearly elongated coil traces 726. In the illustrated embodiment, displacement device 700 comprise two sets of coil traces 726 (labeled 726A, 726B) which may be located on corresponding layers (not explicitly shown) of the stator. Each layer of coil traces 726A, 726B may comprise coil traces 726A, 726B that are generally linearly elongated at a particular orientation in a corresponding stagor-X-Y plane. Such layers and their corresponding coil traces 726A, 726B may overlap one another (in the stator-Z direction) in the working region of displacement device 700. Other than for their relative orientations, the characteristics of coil traces 726 may be similar to those of coil traces 126 discussed above.

It will be appreciated that displacement device 700 of the FIG. 21C embodiment will not be able to provide all six degrees of freedom. With suitable control techniques, the embodiment of FIG. 21C may be capable of providing motion with 4 degrees of freedom.

FIGS. 21A-21C are useful to demonstrate a feature of one aspect and particular embodiments of the invention. Some of the herein-described embodiments include relatively large numbers of magnet arrays. While this can achieve overactuation which may enhance the ability to control the movement of the movable stage relative to the stator, this is not necessary. Particular embodiments may comprise movable stages having any suitable number (as few as one) magnet array, wherein each such magnet array comprises a plurality of magnetization sections that are generally linearly elongated along a corresponding direction. While in some embodiments, the preferred direction(s) of linear elongation may comprise at least two orthogonal directions (which may make control calculations relatively more simple), this is not necessary. In the case where the magnet arrays are aligned in a single movable stage XY plane, any two or more non-parallel directions of linear elongation will span the stage XY plane. Further, some embodiments involve the use of only one magnet array. In some embodiments where six degrees of freedom are desired, three of more magnet arrays are provided with at least two of the magnet arrays being linearly elongated in non-parallel directions and with the force-centers of the three magnet arrays being non-co-linear. In addition, the directions of magnetization of the magnetization segments in each magnet array are generally orthogonal to the direction in which the magnetization segments are linearly elongated. Within a magnet array, the magnetization of the magnetization segments may have characteristics similar to any of those described herein see FIGS. 5 and 6 for example.

Similarly, particular embodiments may comprise stators having coil traces elongated in any suitable number of (one or more) directions. While in some embodiments, the directions of linear elongation may comprise at least two orthogonal directions (which may make control calculations relatively more simple), this is not necessary. Any two or more non-parallel directions of linear elongation will span the notional stator XY plane of the stator. Further, some embodiments involve the use of only one coil elongation direction. The stator XY plane of the stator may be referred to as a notional XY plane, since coil traces having different directions of linear elongation may be provided on different layers as discussed above. Such layers may have different locations in the stator-Z direction. Accordingly, the notional XY plane of the stator may be thought of as though the coil traces in each such layer were notionally brought to a single XY plane having a corresponding single location along the stator-Z axis.

Figure 22B:
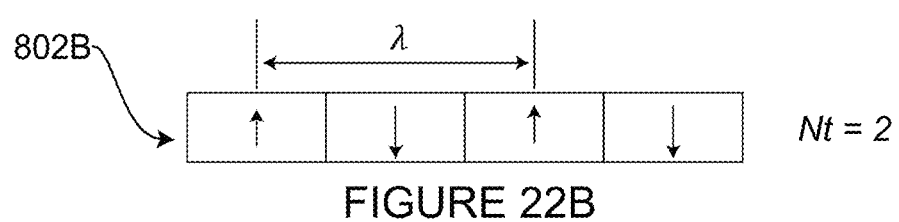
FIGS. 22A-22C schematically depict cross-sectional views of magnet arrays having different numbers of magnetization directions within a particular magnetic spatial period which may be used in any of the displacement devices described herein according to particular embodiments.
Figure 22A:
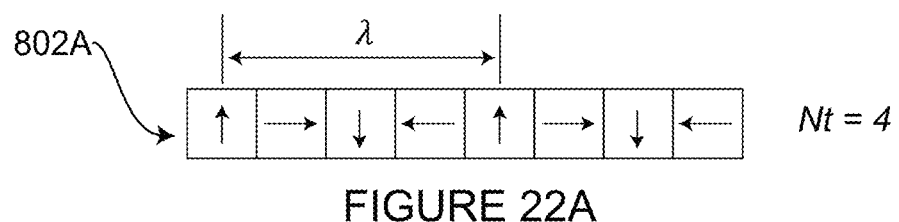
Figure 22C:
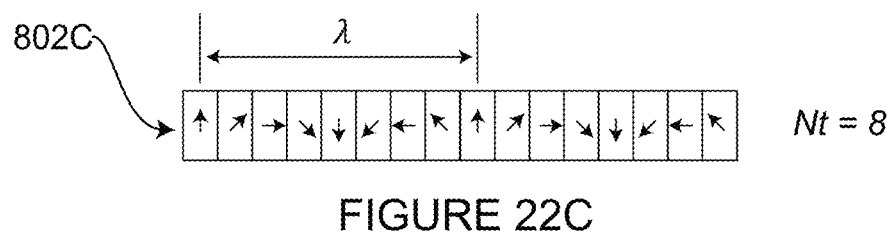

The description set out herein describes that there may be different numbers $N_t$ of magnetization directions within a magnetic spatial period $\lambda$. However, $N_t=4$ for the illustrated embodiments described above. FIGS. 22A-22C schematically depict magnet arrays 802A, 802B, 802C having different values of $N_t$—i.e. different numbers of magnetization directions within a particular magnetic period $\lambda$. Magnet array 802A of FIG. 22A has $N_t=4$, magnet array 802B of FIG. 22B has $N_t=2$ and magnet array 802C of FIG. 22C has magnet array $N_t=8$. The number $N_t$ may be selected to be any suitable number, with the advantage of having relatively large $N_t$ is that relatively large $N_t$ provides the corresponding magnet array with a relatively large fundamental harmonic and relatively small higher order harmonics at the expense of possibly greater cost and complexity in fabricating the magnet array. When $N_t=4$, there exists a $5^{th}$ order harmonic field in a magnet array 112; when $N_t=2$, there exist a $3^{rd}$ order harmonic field in a magnet array 112.

Figure 23A:
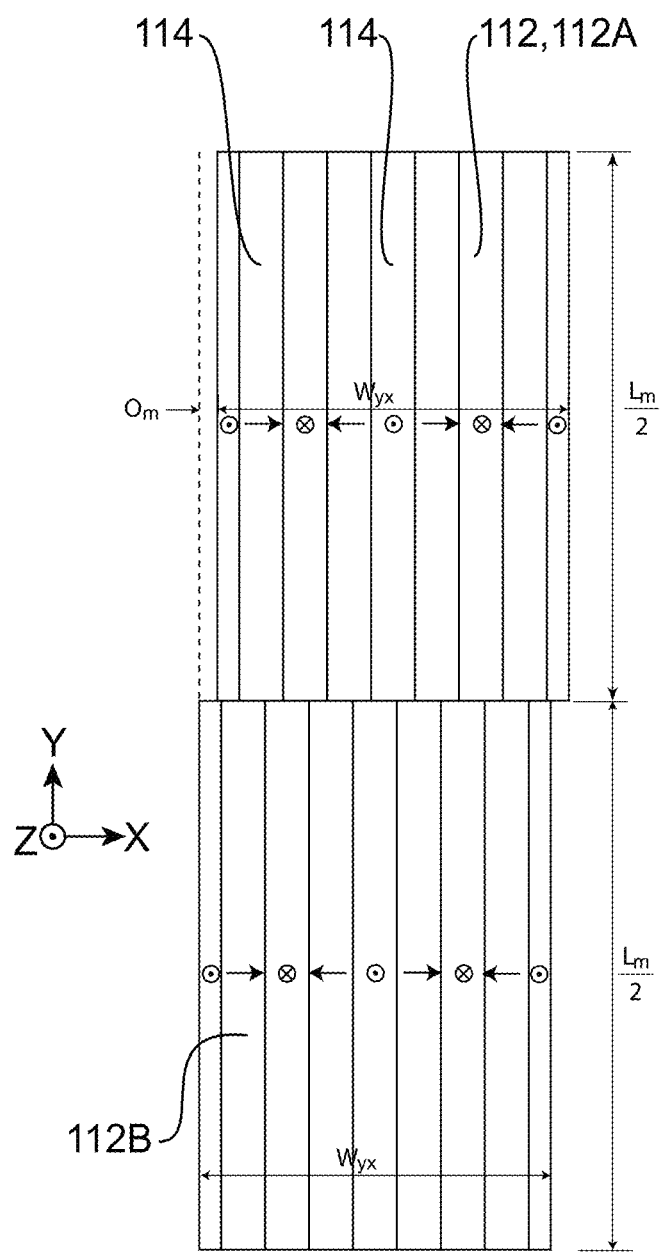

In some embodiments, magnet arrays 112 may be provided with different numbers of sub-arrays. FIG. 23A shows a particular embodiment where the stage-Y dimension $L_m$ of Y-magnet array 112 comprises a pair of sub-arrays 112A, 112B, each having a stage-Y dimension of $L_m/2$ and offset from one another by a distance $O_m$ in the stage-X direction. The offset distance $O_m$ of the FIG. 23A sub-arrays 112A, 112B can the offset $O_m$ may be set at least approximately equal to $$O_m = \left(\frac{N_m}{5} - \frac{1}{10}\right)\lambda,$$

where $N_m$ is any positive integer number. Setting $O_m$ to have this characteristic will tend to attenuate or cancel the effects of the interaction of the $5^{th}$ order harmonic of the magnet field of magnet array 112 with coil traces 126 that carry current in the stator-Y direction, thereby reducing or minimizing associated force ripples. Setting $O_m$ to have this characteristic may tend to attenuate or cancel the effects of the interaction of the $5^{th}$ order harmonic of the magnet field of magnet array 112 with stator-Y oriented sensor column sum/average values of 2D array 500 of sensors 501, thereby reducing or minimizing associated position estimation errors. In some embodiments, the offset $O_m$ may be set at least approximately equal to $O_m$ is set at $$\left(\frac{N_m}{9} - \frac{1}{18}\right)\lambda,$$

to attenuate the effects of the interaction of the $9^{th}$ order harmonic of the magnetic field of magnet array 112 with coil traces 126 that carry current in the stator-Y direction and to attenuate or cancel the effects of the interaction of the $9^{th}$ order harmonic of the magnet field of magnet array 112 with stator-Y oriented sensor column sum/average values of 2D array 500 of sensors 501. In some embodiments, the offset $O_m$ may be set at least approximately equal to $$O_m = \frac{N_m}{5}\lambda - W_c,$$

where $N_m$ is any integer number and $W_c$ is the stator-X direction width of coil traces 126 generally elongated in stator-Y direction. Setting $O_m$ to have this characteristic will tend to attenuate or cancel the effects of the interaction of the $5^{th}$ order harmonic of the magnet field of magnet array 112 with coil traces 126 that carry current in the stator-Y direction, thereby reducing or minimizing associated force ripples. In some embodiments, the offset $O_m$ may be set at least approximately equal to $O_m$ is set at $$\frac{N_m}{9}\lambda - W_c,$$

to attenuate the effects of the interaction of the $9^{th}$ order harmonic of the magnetic field of magnet array 112 with coil traces 126 that carry current in the stator-Y direction. While magnet array 112 shown in the illustrated embodiment of FIG. 23A comprises two sub-arrays, magnet arrays 112 may generally be provided with any suitable number of sub-arrays having characteristics similar to those shown in FIG. 23A.

FIGS. 23B and 23C show a number of embodiments of magnet arrays 112 which may be used to attenuate the effects of multiple spatial harmonics of their corresponding magnetic fields. FIGS. 23B and 23C show one embodiment of a Y-magnet array 112, which comprises six sub-arrays having stage-Y direction lengths $$\frac{L_m}{8}$$

(labeled a, b, c, f, g, h in FIG. 23C) and one sub-array having stage-Y direction length $$\frac{L_m}{4}$$

(labeled d-e in FIG. 23C), where $L_m$ is the total stage-Y direction length of magnet array 112. FIG. 23D shows how some of sub-arrays (a, b, c, d-e, f, g, h) are shifted or offset (in the stage-X direction) relative to one another. In the embodiment of FIGS. 23B and 23C, sub-arrays b and g are aligned in the stage-X direction, sub-arrays a and h are shifted (rightwardly in the illustrated view) relatively to sub-arrays b and g by an amount $O_{m2}$, sub-arrays d and e (together sub-array d-e) are shifted (rightwardly in the illustrated view) relatively to sub-arrays b and g by an amount $O_{m1}$ and sub-arrays c and f are shifted (rightwardly in the illustrated view) relatively to sub-arrays b and g by an amount $2O_{m2}+O_{m1}$. Each sub-array a, b, c, d-e, f, g, h of the illustrated embodiment has a stage-X dimension width $W_m$. Mirror symmetry on line A-A (at the center of the stage-Y dimension $L_m$ of magnet array 112) reduces or minimizes moment and/or force disturbance on the FIGS. 23C, 23D magnet array 112. The harmonics attenuated by the FIGS. 23B, 23C arrangement have spatial wavelengths equal to $2O_{m1}$ and $2O_{m2}$. For example, by setting $O_{m1}=\lambda/10$ and $O_{m2}=\lambda/26$, the $5^{th}$ and $13^{th}$ harmonics of the magnetic field are attenuated in connection with both force generation using coil traces and also in column/row sum/average values determined from sensor array 500. In general, setting $O_{m1}=0.5)/p$, $O_{m2}=0.5)/q$ will significantly minimize disturbance moment/force resulting from harmonic magnetic fields of wavelength (spatial period) both $\lambda/p$ and $\lambda/q$, where M and N are arbitrary integer numbers.

The techniques illustrated in FIGS. 23B-23C can be extrapolated so that field-induced disturbance moment and/or force effects associated with any suitable number of harmonics may be simultaneously attenuated using a suitable variation of these techniques and field-induced position estimation errors associated with any suitable number of harmonics may be simultaneously attenuated using a suitable variation of these techniques. It is also possible to attenuate the field-induced effects of one harmonic order, but retain some level of net moment disturbance (such as shown in FIG. 23A).

Magnet arrays 112 of particular embodiments can be skewed or provided with spatial periodicity along the direction that their respective magnetization segments 114 are generally linearly elongated. Such skewing and/or spatial periodicity of magnet arrays 112 may be used to reduce or minimize the effects of higher order harmonics of the magnetic fields of these magnet arrays 112. FIG. 24A shows a Y-magnet array 112 which is generally linearly elongated in the stage-Y direction, but which is skewed by an amount $O_p$ in the stage-X direction over its stage-Y dimension length $L_m$. Assuming that the FIG. 24A magnet array 112 is configured to interact with coil traces 126 having a rectangular geometry with a coil width $W_c$ as defined above, then the skew amount may be set to be at least approximately equal to a non-negative value $O_p=k\Lambda_f-W_c$, where $\Lambda_f$ is the wavelength of the spatial harmonic of the magnetic field that is to be attenuated and k is a positive integer number. For example, if it desired to attenuate the effects of the 5$^{th}$ order harmonic filed of the FIG. 24A magnet array 112, then $O_p$ can be set to be $k\lambda/5-W_c$ where k is a positive integer number.

Figure 24C:
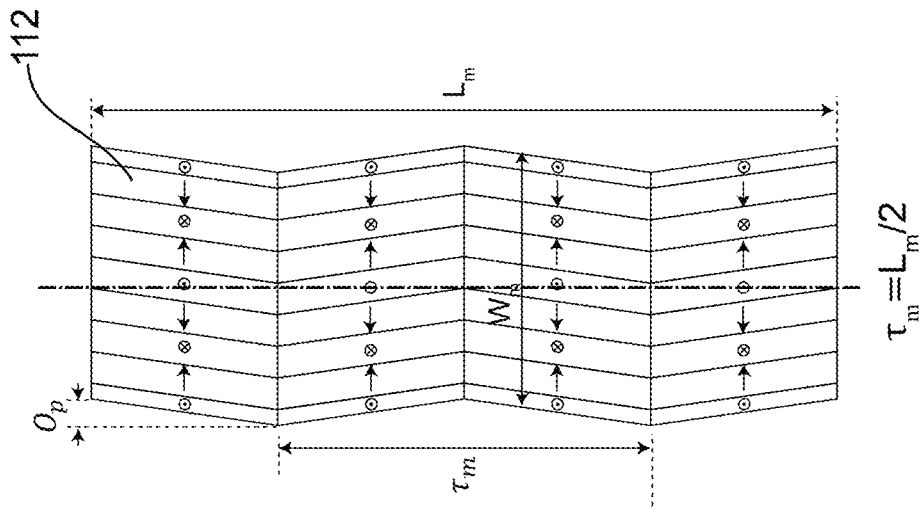
FIGS. 24A, 24B and 24C show a number of Y-magnet arrays which exhibit periodic spatial variation which extends in the X direction over their respective Y dimensions and which may be used in any of the displacement devices described herein according to particular embodiments.
Figure 24B:
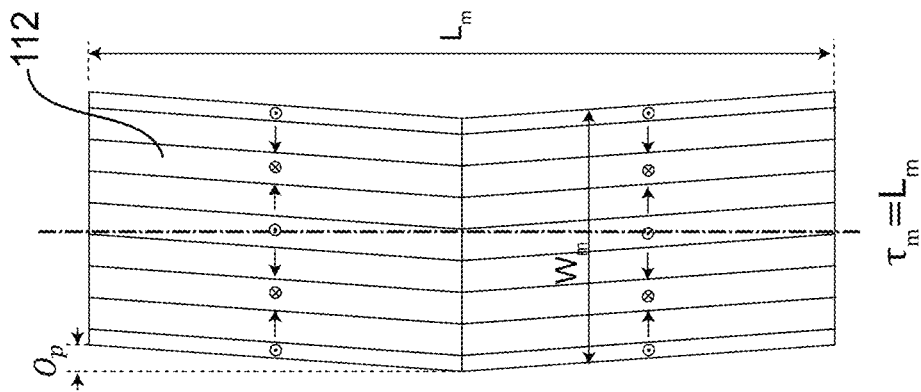
Figure 24A:
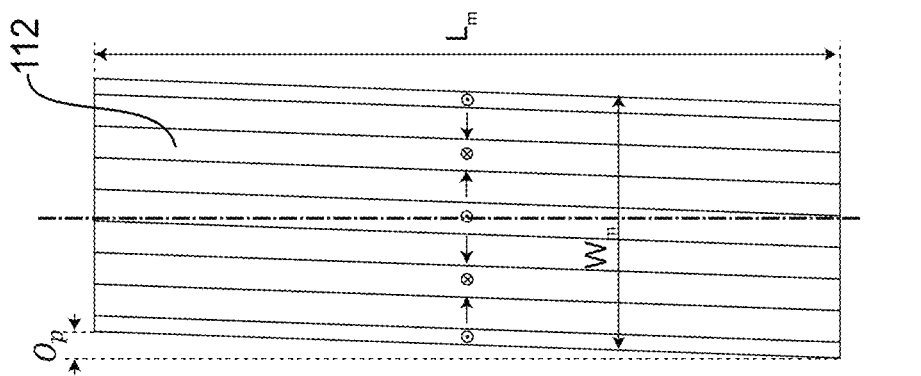

FIGS. 24B and 24C show spatially periodic Y-magnet arrays 112, wherein an edge of each array 112 varies in the stage-X direction by an amount $O_p$ over it stage-Y dimension length $L_m$. The magnet arrays 112 of FIGS. 24B and 24C are periodic with a spatial period $T_m$ where $\tau_m=L_m$ in the FIG. 24B array and $\tau_m=L_m/2$ in the FIG. 24C array. Like the case of the spatially periodic coil traces discussed above, the spatial period $\tau_m$ may generally be set to be an integer factor of the stage-Y dimension length $L_m$. Also, similar to the case of the spatially periodic coil traces discussed above, spatially periodic magnet arrays may be provided with spatially periodic waveforms other than triangular waveforms, such as square waves, sinusoidal waveforms or superposed waveforms. The peak-to-peak amplitude parameter $O_p$ can have the characteristics of the term $O_p$ discussed above in connection with FIG. 24A.

In some embodiments, a combination of skewed coil traces and slanted magnet arrays may also be usefully implemented to eliminate internal stresses in the magnetic arrays while reducing or minimizing the effects of the interaction of current carrying coil traces with higher order harmonics of the magnetic fields of the magnet arrays.

Certain implementations of the invention comprise controllers, computers and/or computer processors which execute software instructions which cause the controllers, computers and/or processors to perform a method of the invention. For example, one or more processors in a controller or computer may implement data processing steps in the methods described herein by executing software instructions retrieved from a program memory accessible to the processors. The invention may also be provided in the form of a program product. The program product may comprise any medium which carries a set of computer-readable signals comprising instructions which, when executed by a data processor, cause the data processor to execute a method of the invention. Program products according to the invention may be in any of a wide variety of forms. The program product may comprise, for example, physical (non-transitory) media such as magnetic data storage media including floppy diskettes, hard disk drives, optical data storage media including CD ROMs, DVDs, electronic data storage media including ROMs, flash RAM, or the like. The instructions may be present on the program product in encrypted and/or compressed formats.

Where a component (e.g. a software module, controller, processor, assembly, device, component, circuit, etc.) is referred to above, unless otherwise indicated, reference to that component (including a reference to a "means") should be interpreted as including as equivalents of that component any component which performs the function of the described component (i.e., that is functionally equivalent), including components which are not structurally equivalent to the disclosed structure which performs the function in the illustrated exemplary embodiments of the invention.

While a number of exemplary aspects and embodiments are discussed herein, those of skill in the art will recognize certain modifications, permutations, additions and sub-combinations thereof. For example:

The magnet arrays shown in the embodiments of FIGS. 23 and 24 are Y-magnet arrays, but it will be appreciated that X-magnet arrays could be provided with similar characteristics. Also, the magnet arrays shown in the embodiments of FIGS. 23 and 23 have a particular pattern of magnetization. In general, these magnet arrays may be provided with any suitable magnetization pattern, such as any of those shown in FIGS. 5 and 6, for example.

Figure 25A:
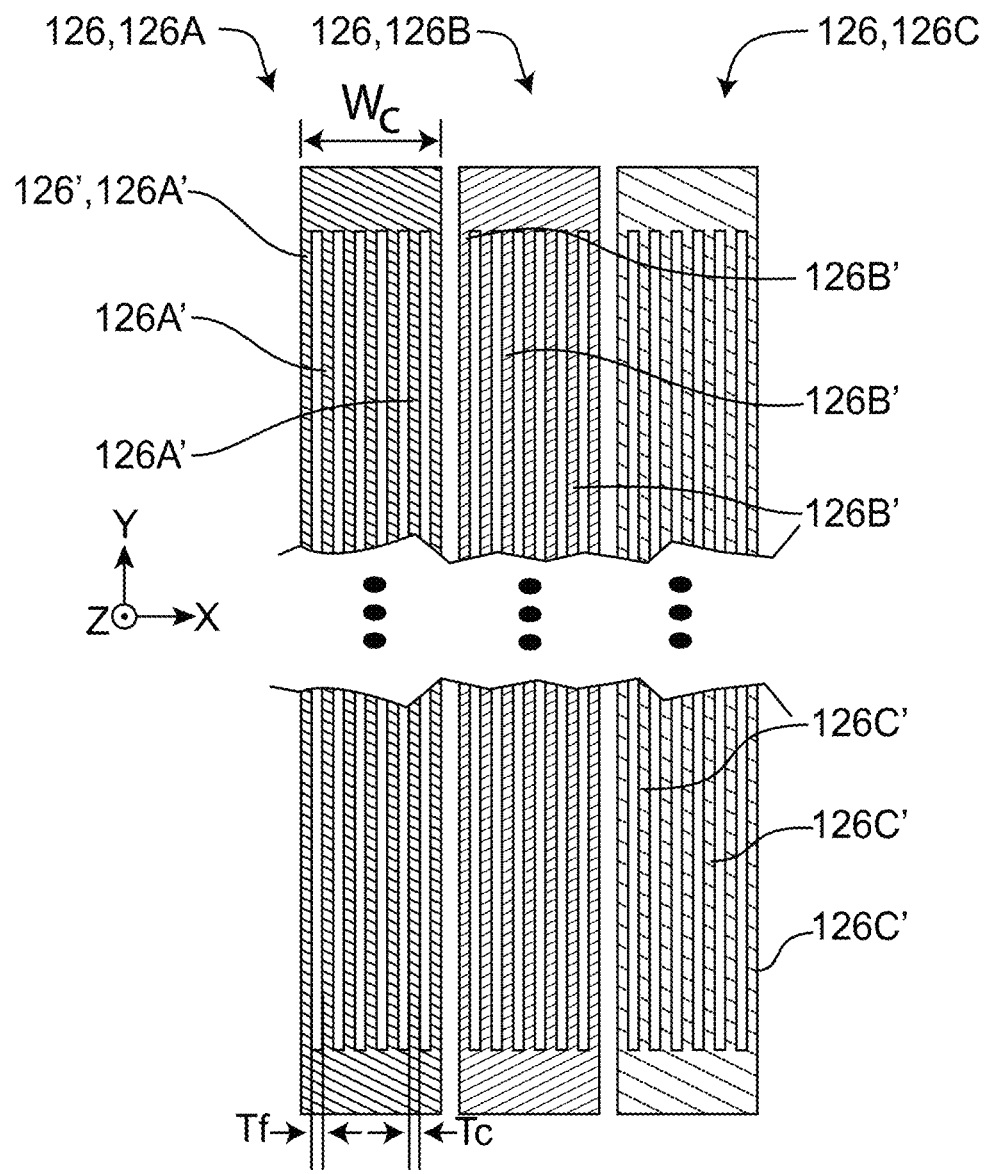
FIGS. 25A and 25B respectively depict a top view of a number of coil traces and a cross-sectional view of a coil trace which comprise multiple sub-traces which may be used in any of the displacement devices described herein according to particular embodiments.
Figure 25B:
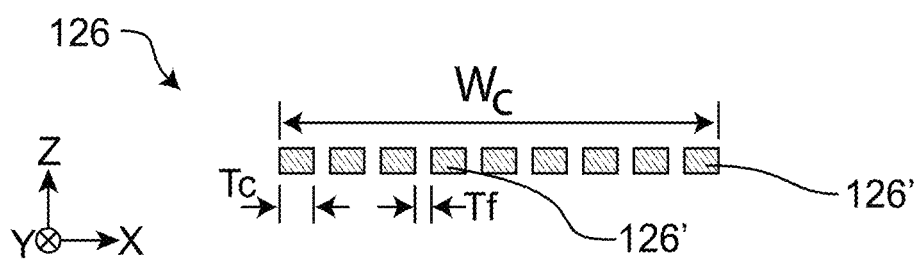

For the purpose of minimizing or reducing eddy currents induced by the motion of magnet arrays 112 on movable stage 110, coil traces 126 may be made relatively narrow. In some embodiments, each coil trace 126 may comprise a plurality of sub-traces 126'. Such an embodiment is shown schematically in FIGS. 25A (in top view) and in 25B (in cross-section). In coil traces 126A, 126B, 126C of FIG. 25A, each coil trace 126A, 126B, 126C comprises a plurality of corresponding sub-traces 126A', 126B', 126C' (collectively, sub-traces 126') where each sub-trace 126' has a width $T_c$ that is a fraction of the width $W_c$ of its corresponding coil 126. Each sub-trace 126' only carries a portion of the current flowing through its corresponding trace 126. Each sub-trace 126' in the FIG. 25A embodiment is insulated from its adjacent sub-trace 126' by an insulator of width $T_f$, although it is not generally necessary for the insulator width $T_f$ to be uniform within a coil trace 126 and there is a desire to minimize Tf, to achieve high surface fill factor. In general, any suitable number of sub-traces 126' may be provided in each trace 126 depending on the trace width $W_c$, the sub-trace width $T_c$ and the insulation with $T_f$. The sub-traces 126' of each corresponding coil trace 126 may be electrically connected in parallel at their ends (e.g. at their stator-Y dimension ends in the case of the illustrated embodiment). The regions where sub-traces 126' are connected to one another may be outside of the working region of device 100—i.e. outside of the range of motion of movable stage 110, although this is not necessary. In other embodiments, sub-traces 126' may be serially connected with one another. Coil sub-traces 126' may be fabricated using known PCB fabrication technology. FIG. 25B shows a cross-sectional view of one particular trace 126 and its corresponding sub-traces 126'.

Coil traces 126 may be fabricated using techniques other than PCB technology. Any conductor that is or may be shaped to be generally linearly elongated may be used to provide coil traces 126. FIGS. 26A and 26B show one example with coils 122 in a working region 124 of stator 120 comprising coil traces 126 having round cross-sections. FIG. 26B shows detail of how traces 126 are generally linearly elongated in the X and Y directions to provide alternating layers 128 of traces X-oriented traces 126X and Y-oriented traces 126Y. Each trace 126 shown in FIGS. 26A and 26B may be made up of further sub-traces of various cross-sections. FIG. 26C shows one example, wherein a trace 126 having circular cross-section comprises a plurality of sub-traces 126' having circular cross-section. One common method for implementing this trace would be to use standard multi-filament wire with an external insulator. FIG. 26D shows one example of a coil trace 126 having rectangular cross-section with sub-traces 126' of circular cross-section.

In the illustrated embodiments, coil traces 126 on different layers 128 are shown as being the same as one another. In some embodiments, coil traces 126 on different layers 128 and/or coil traces 126 with different orientations (e.g. X-orientations and Y-orientations) may have properties that are different from one another. By way of non-limiting example, X-oriented coil traces 126 may have a first coil width $W_a$ and/or coil pitch $P_{c1}$ and Y-oriented coil traces 126 may have a second coil width $W_a$ and/or coil pitch $P_{c2}$ which may be the same or different from those of the X-oriented coil traces 126. Other properties of coil traces 126 could additionally or alternatively be different from one another. Similarly, magnet arrays 112 (e.g. magnet arrays 112 of different orientations (e.g. X-magnet arrays and Y-magnet arrays 112) or even magnet arrays 112 with the same orientations) are shown as being the same as one another. In some embodiments, different magnet arrays 112 may have properties that are different from one another. By way of non-limiting example, X-magnet arrays could have first widths $W_{m1}$ and/or spatial periods $\lambda_1$ and Y-magnet arrays may have second widths $W_{m2}$ and/or spatial periods $\lambda_2$. Other properties of magnet arrays 112 could additionally or alternatively be different from one another.

In this description and the accompanying claims, elements (such as layers 128, coil traces 126, movable stages 110, magnet arrays 112 and/or sensors 501 of 2D sensor array 500) are said to overlap one another in or along a direction. For example, coil traces 126 from different layers 128 may overlap one another in or along the stator-Z direction. When it is described that two or more objects overlap in or along a direction (e.g. the stator-Z direction), this usage should be understood to mean that a line extending in that direction (e.g. a stator-Z direction-oriented line) could be drawn to intersect the two or more objects. In this description and the accompanying claims, elements (such as sensors 501) are said to be aligned with one another in or along a direction. For example, sensors 501 in a stator-Y oriented sensor column may be described as being aligned with one another in a stator-Y direction. When it is described that two or more objects are aligned in or along a direction (e.g. the stator-Y direction), this usage should be understood to mean that a line in that direction (e.g. a stator-Y direction-oriented line) could be drawn to intersect the two or more objects In the description and drawings provided herein, movable stages are shown as being static with their X, Y and Z axes being the same as the X, Y and Z axes of the corresponding stator. This custom is adopted in this disclosure for the sake of brevity. It will of course be appreciated from this disclosure that a movable stage can (and is designed to) move with respect to its stator, in which case the stage-X, stage-Y and stage-Z directions/axes of the movable stage may no longer be the same as (or aligned with) the stator-X, stator-Y and stator-Z directions/axes of its stator. Accordingly, in this description and the claims that follow, the X, Y and Z axes of the stator may be referred to as the stator-X axis, the stator-Y axis and the stator-Z axis and the X, Y and Z axes of the movable stage may be referred to as the stage-X axis, the stage-Y axis and the stage-Z axis. Corresponding directions may be referred to as the stator-X direction (parallel to the stator-X axis), the stator-Y direction (parallel to the stator-Y axis), the stator-Z direction (parallel to the stator-Z axis), the stage-X direction (parallel to the stage-X axis), the stage-Y direction (parallel to the stage-Y axis) and the stage-Z direction (parallel to the stage-Z axis). Directions, locations and planes defined in relation to the stator axes may generally be referred to as stator directions, stator locations and stator planes and directions, locations and planes defined in relation to the stage axes may be referred to as stage directions, stage locations and stage planes.

In the description above, stators comprise current carrying coil traces and 2D sensor arrays and movable stages comprise magnet arrays. It is of course possible that this could be reversed—i.e. stators could comprise magnet arrays and movable stages could comprise current carrying coil traces and 2D sensor arrays. Also, whether a component (e.g. a stator or a movable stage) is actually moving or whether the component is actually stationary will depend on the reference frame from which the component is observed. For example, a stator can move relative to a reference frame of a movable stage, or both the stator and the movable stage can move relative to an external reference frame. Accordingly, in the claims that follow, the terms stator and movable stage and references thereto (including references to stator and/or stage X, Y, Z directions, stator and/or stage X, Y, Z-axes and/or the like) should not be interpreted literally unless the context specifically requires literal interpretation Moreover, unless the context specifically requires, it should be understood that the movable stage (and its directions, axes and/or the like) can move relative to the stator (and its directions, axes and/or the like) or that the stator (and its directions, axes and/or the like) can move relative to a movable stage (and its directions, axes and/or the like).

In the description above, a number of steps include calculating average values. For example, some steps require calculating an average value of the outputs in a row or a column while other steps require calculating a synchronous average value of a plurality of rows or columns. It should be understood that instead of calculating average values, it is sufficient to calculate sum values instead in each of these steps. That is to say, it is unnecessary to divide by the number of values being summed, if all other averages in the step are also only summed instead of averaged.

It will be appreciated by those skilled in the art that because of the spatially periodic nature of the magnet arrays and the sensor rows and columns described herein, there may be various mathematically equivalent manners in which concepts can be described, where such mathematical equivalence is attributable to the spatial periodicity of the magnet arrays, sensor rows and/or sensor columns. Unless the context dictates otherwise, mathematical descriptions of particular features used herein should be considered to incorporate mathematically equivalent features which are expressed differently, because of the spatial periodicity of the magnet arrays, sensor rows and/or sensor columns.

While a number of exemplary aspects and embodiments have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An apparatus for estimating a position of a movable stage, the apparatus comprising:
a stator comprising an array of sensors arranged relative to one another to provide a plurality of stator-Y oriented sensor columns and a plurality of stator-X oriented sensor rows;
each stator-Y oriented sensor column comprising a plurality of sensors generally aligned with one another in a stator-Y direction and at least one pair of sensors in each stator-Y oriented sensor column spaced apart from one another in the stator-Y direction by a pitch $P_y$; and
each stator-X oriented sensor row comprising a plurality of sensors generally aligned with one another in a stator-X direction, the stator-X direction non parallel with the stator-Y direction, and at least one pair of sensors in each stator-X oriented sensor row spaced apart from one another in the stator-X direction by a pitch $P_x$;
a movable stage comprising a first Y-magnet array comprising a plurality of first magnetization segments, each first magnetization segment having a stage-Y direction length, $L_{yy}$, and a magnetization direction, the magnetization directions of the plurality of first magnetization segments exhibiting a first magnetic spatial period $\lambda_x$ over a stage-X direction width, $W_{yx}$, of the first Y-magnet array;
a controller connected to receive information based on an output from each of the sensors and configured to use the information to determine a stator-X direction position of the movable stage;
wherein the pitch $P_x$ conforms generally with $$P_x = \frac{n\lambda_x}{N},$$

where n and N are integers and $$\frac{n}{N}$$

is not an integer.

2. The apparatus according to claim 1, wherein the stage-Y direction length, $L_{yy}$, of each first magnetization segment conforms generally with $L_{yy}=N_{yy}P_y$ where $N_{yy}$ is a positive integer.

3. The apparatus according to claim 1, wherein the stator-X direction is orthogonal to the stator-Y direction.

4. The apparatus according to claim 1, wherein the plurality of stator-Y oriented sensor columns comprises first and second stator-Y oriented sensor columns, the first stator-Y oriented sensor column spaced apart from the second stator-Y oriented sensor column by a distance $P_X$ where $P_X=n\lambda_X/N$ and n, N are positive integers selected such that $$\frac{n}{N}$$

is not an integer.

5. The apparatus according to claim 4 wherein the controller is configured to determine the stator-X direction position of the movable stage based on a first sum or average of the outputs of the first stator-Y oriented sensor column and based on a second sum or average of the outputs of the second stator-Y oriented sensor column.

6. The apparatus according to claim 1, wherein the controller is configured to determine the stator-X direction position of the movable stage based on a plurality of sum or average values, each sum or average value comprising a sum or average of the outputs from a corresponding stator-Y oriented sensor column.

7. The apparatus according to claim 1, the controller configured to determine the stator-X direction position of the movable stage based on a plurality of synchronous sum or average values, each synchronous sum or average value comprising a sum or average of synchronous column values, each synchronous column value based on a sum or average of the outputs from a corresponding synchronous stator-Y oriented sensor column wherein each corresponding synchronous stator-Y oriented sensor column is separated from other corresponding synchronous stator-Y oriented sensor columns by a stator-X oriented spacing $N_x\lambda_x$, wherein $N_x$ is a positive integer.

8. The apparatus according to claim 7 wherein the plurality of synchronous sum or average values comprise a first synchronous sum or average value A and a second synchronous sum or average value B, each corresponding synchronous stator-Y oriented sensor column used to generate the first synchronous sum or average value A separated from each corresponding synchronous stator-Y oriented sensor column used to generate the second synchronous sum or average value B by a stator-X oriented spacing $$\frac{\lambda_x}{4} + s\lambda_x$$

where s is an integer and the controller is configured to determine the stator-X direction position of the movable stage x based on the first synchronous sum or average value A and the second synchronous sum or average value B.

9. The apparatus according to claim 7 wherein the plurality of synchronous sum or average values comprise a first synchronous sum or average value A, second synchronous sum or average value B, third synchronous sum or average value A' and fourth synchronous sum or average value B', each corresponding synchronous stator-Y oriented sensor column used to generate the first synchronous sum or average value A separated from each corresponding synchronous stator-Y oriented sensor column used to generate the second synchronous sum or average value B by a stator-X oriented spacing $$\frac{\lambda_x}{4} + s\lambda_x$$

where s is an integer, separated from each corresponding synchronous stator-Y oriented sensor column used to generate the third synchronous sum or average value A' by a stator-X oriented spacing $$\frac{\lambda_x}{2} + p\lambda_x$$

where p is an integer, and separated from each corresponding synchronous stator-Y oriented sensor column used to generate the fourth synchronous sum or average value B' by a stator-X oriented spacing $$\frac{3\lambda_x}{4} + r\lambda_x$$

where r is an integer, and the controller is configured to determine the stator-X direction position of the movable stage x based on the first, second, third and fourth synchronous sum or average values A, B, A', B'.

10. The apparatus according to claim 7 wherein the plurality of synchronous sum or average values comprises a first synchronous sum or average value A, a second synchronous sum or average value B and a third synchronous sum or average value C, each corresponding synchronous stator-Y oriented sensor column used to generate the first synchronous sum or average value A is separated from each corresponding synchronous stator-Y oriented sensor column used to generate the second synchronous sum or average value B by a stator-X oriented spacing $$\frac{\lambda_x}{3} + s\lambda_x$$

where s is an integer and is separated from each corresponding synchronous stator-Y oriented sensor column used to generate the third synchronous sum or average value C by a stator-X oriented spacing $$\frac{2\lambda_x}{3} + r\lambda_x$$

where r is an integer and wherein the controller is configured to determine the stator-X direction position of the movable stage based on the first, second and third synchronous sum or average values A, B, C.

11. The apparatus according to claim 1 wherein the controller is configured to use the information to determine a stator-Z position of the movable stage, wherein a stator-Z direction is generally orthogonal to both the stator-Y direction and stator-X direction and wherein the controller is configured to determine the stator-Z direction position z based on:

$$\frac{\lambda}{2\pi} \ln\left(\frac{C_0}{\sqrt{(B)^2 + (A)^2}}\right)$$

where $C_0$ is a configurable constant.

12. The apparatus according to claim 1 wherein the array of sensors is arranged in a grid pattern, wherein each stator-Y oriented sensor column is aligned along a corresponding stator-Y line oriented in the stator-Y direction, each stator-X oriented sensor row is aligned along a corresponding stator-X line oriented in the stator-X direction, the stator-X and stator-Y directions generally orthogonal to one another, and one sensor is located at the intersection of each stator-Y line and each stator-X line.

13. The apparatus according to claim 1 wherein the controller is configured to adjust the information based on the outputs of the sensors prior to using the information for determining the stator-X direction position to compensate for magnetic field generated by current traveling through one or more coils of the stator.

14. The apparatus according to claim 1, the movable stage comprising a first X-magnet array comprising a plurality of second magnetization segments, each second magnetization segment having a stage-X direction length, $L_{xx}$, and a magnetization direction, the magnetization directions of the plurality of second magnetization segments exhibiting a second magnetic spatial period $\lambda_y$ over a stage-Y direction width of the first X-magnet array, $W_{xy}$, and wherein the controller is configured to use the information to determine a stator-Y position of the movable stage.

15. The apparatus according to claim 14 wherein the pitch $P_y$ conforms generally with $$P_y = \frac{m\lambda_y}{M},$$

where m and M are integers and $$\frac{m}{M}$$

is not an integer.

16. The apparatus according to claim 14 wherein stage-X direction length $L_{xx}$ of each second magnetization segment conforms generally with $L_{xx}=N_{xx}P_x$, where $N_{xx}$ is an integer.

17. The apparatus according to claim 1 wherein the stage-X direction width, $W_{yx}$, of the first magnet array conforms generally with $W_{yx}=N_{my}\lambda_x$ where $N_{my}$ is a positive integer.

18. The apparatus according to claim 1 comprising a second movable stage comprising a second Y-magnet array comprising a plurality of second magnetization segments, the magnetization directions of the plurality of second magnetization segments exhibiting a second magnetic spatial period $\lambda_x$ over a second stage-X direction width, $W_{yx2}$, of the second Y-magnet array and wherein the controller is configured to use the information to determine the stator-X direction position of the movable stage and a stator-X direction position of the second movable stage.

19. An apparatus for estimating a position of a movable stage, the apparatus comprising:
a stator comprising an array of sensors arranged relative to one another to provide a plurality of stator-Y oriented sensor columns and a plurality of stator-X oriented sensor rows;
each stator-Y oriented sensor column comprising a plurality of sensors generally aligned with one another in a stator-Y direction and at least one pair of sensors in each stator-Y oriented sensor column spaced apart from one another in the stator-Y direction by a pitch $P_y$; and
a movable stage comprising a first Y-magnet array comprising a plurality of first magnetization segments, each first magnetization segment having a stage-Y direction length, $L_{yy}$, and a magnetization direction;
a controller connected to receive information based on an output from each of the sensors and configured to use the information to determine a stator-X direction position of the movable stage;

wherein the stage-Y direction length $L_{yy}$ of each first magnetization segment conforms generally with $L_{yy}=N_{yy}P_y$, where $N_{yy}$ is a positive integer.

20. A method for estimating a position of a movable stage, the method comprising:

providing a stator comprising an array of sensors arranged relative to one another to provide a plurality of stator-Y oriented sensor columns and a plurality of stator-X oriented sensor rows;

each stator-Y oriented sensor column comprising a plurality of sensors generally aligned with one another in a stator-Y direction and at least one pair of sensors in each stator-Y oriented sensor column spaced apart from one another in the stator-Y direction by a pitch Py; and each stator-X oriented sensor row comprising a plurality of sensors generally aligned with one another in a stator-X direction, the stator-X direction non parallel with the stator-Y direction, and at least one pair of sensors in each stator-X oriented sensor row spaced apart from one another in the stator-X direction by a pitch Px;

providing a first movable stage comprising a first Y-magnet array comprising a plurality of first magnetization segments, the magnetization directions of the plurality of first magnetization segments exhibiting a first magnetic spatial period $\lambda_x$ over a first stage-X direction width, $W_{yx1}$, of the first Y-magnet array;

providing a second movable stage comprising a second Y-magnet array comprising a plurality of second magnetization segments, the magnetization directions of the plurality of second magnetization segments exhibiting a second magnetic spatial period $\lambda_x$ over a second stage-X direction width, $W_{yx2}$, of the second Y-magnet array;

obtaining information based on an output from each of the sensors and determining a stator-X direction position of the first movable stage and a stator-X direction position of the second movable stage based on the information.

21. The method according to claim 20 wherein determining a stator-X direction position of the first movable stage and a stator-X direction position of the second movable stage based on the information comprises determining the stator-X direction position of the first movable stage relative to the stator-X direction position of the second movable stage based on the information.

* * * * *